United States Patent
Makita

(10) Patent No.: US 7,800,178 B2
(45) Date of Patent: Sep. 21, 2010

(54) SEMICONDUCTOR DEVICE AND METHOD FOR MANUFACTURING THE SAME

(75) Inventor: Naoki Makita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 89 days.

(21) Appl. No.: 11/564,682

(22) Filed: Nov. 29, 2006

(65) Prior Publication Data

US 2007/0096207 A1  May 3, 2007

Related U.S. Application Data

(62) Division of application No. 10/743,151, filed on Dec. 23, 2003, now Pat. No. 7,148,093.

(30) Foreign Application Priority Data

Jan. 7, 2003  (JP) .............................. 2003-001434

(51) Int. Cl.
*H01L 21/331* (2006.01)
(52) U.S. Cl. .............................. 257/347; 257/E29.275; 257/E29.278
(58) Field of Classification Search ................ 257/347, 257/E21.133, E21.413; 438/149
See application file for complete search history.

(56) References Cited

U.S. PATENT DOCUMENTS

| | | | |
|---|---|---|---|
| 5,481,121 A | 1/1996 | Zhang et al. | |
| 5,879,974 A | 3/1999 | Yamazaki | |
| 5,915,174 A | 6/1999 | Yamazaki et al. | |
| 6,251,712 B1 | 6/2001 | Tanaka et al. | |
| 6,274,887 B1* | 8/2001 | Yamazaki et al. | 257/72 |
| 6,727,124 B2 | 4/2004 | Nakajima et al. | |
| 7,148,093 B2* | 12/2006 | Makita | 438/166 |
| 7,332,385 B2* | 2/2008 | Nakazawa et al. | 438/154 |
| 2003/0025158 A1* | 2/2003 | Makita et al. | 257/347 |
| 2003/0173566 A1 | 9/2003 | Nakazawa et al. | |
| 2005/0170573 A1 | 8/2005 | Makita et al. | |

FOREIGN PATENT DOCUMENTS

JP         10-270363 A         10/1998

OTHER PUBLICATIONS

Official Communication issued in corresponding Korean Patent Application No. 10-2003-0099652, mailed Sep. 24, 2005.

* cited by examiner

*Primary Examiner*—Charles D Garber
*Assistant Examiner*—Stanetta D Isaac
(74) *Attorney, Agent, or Firm*—Keating & Bennett, LLP

(57) ABSTRACT

A semiconductor device includes at least one thin film transistor including a semiconductor layer that has a crystalline region including a channel region, a source region and a drain region, a gate insulating film disposed at least on the channel region, the source region and the drain region of the semiconductor layer, and a gate electrode arranged so as to oppose the channel region via the gate insulating film. At least a portion of the semiconductor layer includes a catalyst element capable of promoting crystallization, and the semiconductor layer further includes a gettering region that includes the catalyst element at a higher concentration than in the channel region or the source region and the drain region. The thickness of the gate insulating film on the gettering region is smaller than that on the source region and the drain region, or the gate insulating film is not disposed on the gettering region.

24 Claims, 20 Drawing Sheets

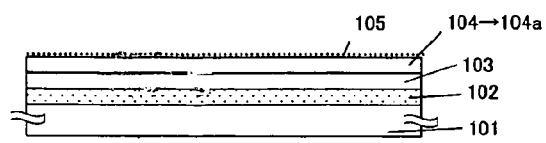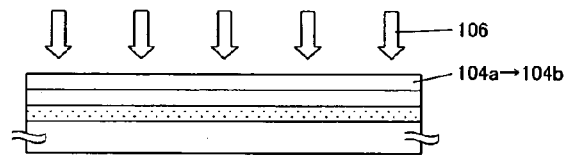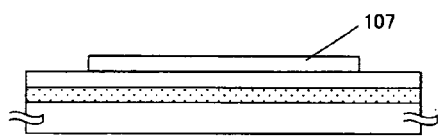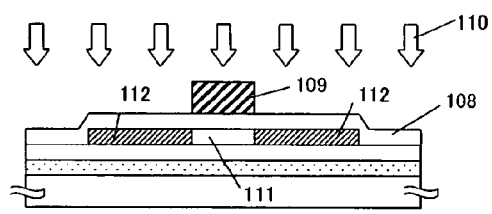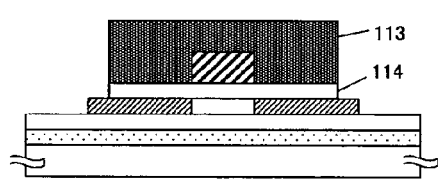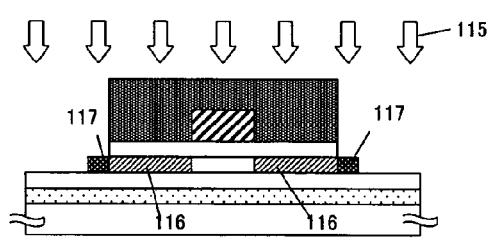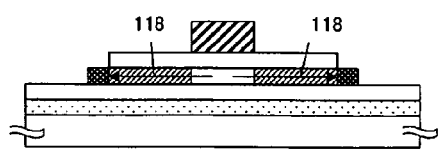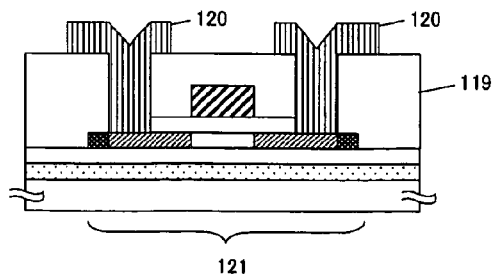

SEMICONDUCTOR DEVICE AND METHOD FOR MANUFACTURING THE SAME

This application is a Divisional Application of U.S. patent application Ser. No. 10/743,151 filed Dec. 23, 2003, currently pending.

BACKGROUND OF THE INVENTION

1. Field of the Invention

The present invention relates to a semiconductor device including thin film transistors (TFTs), and a method for manufacturing the same. More particularly, the present invention relates to a semiconductor device including thin film transistors in which the semiconductor layer (active region) is formed from a crystalline semiconductor film obtained by crystallizing an amorphous semiconductor film, and a method for manufacturing the same. The present invention can suitably be used in active matrix liquid crystal display devices, organic EL display devices, contact image sensors, and three-dimensional ICs, and other suitable devices.

2. Description of the Related Art

In recent years, attempts have been made in the art to form high-performance semiconductor elements on an insulative substrate such as a glass substrate or an insulating film, aiming at realization of liquid crystal display devices and organic EL display devices having larger sizes and higher resolutions, contact image sensors operating at higher speeds with higher resolutions, three-dimensional ICs, etc. Particularly, a type of liquid crystal display device having the pixel section and the driving circuit on the same substrate is finding its use in various household appliances, in addition to a monitor of a personal computer (PC). For example, liquid crystal displays are used as television sets, replacing CRTs (Cathode-Ray Tubes), and front projectors are used for home entertainment applications such as for watching movies and for playing video games. Thus, the market for liquid crystal display devices has been growing at a remarkable rate. Moreover, system-on-panel devices have been developed actively, in which logic circuits such as a memory circuit and a clock generation circuit are formed on a glass substrate.

Displaying high-resolution images means an increase in the amount of data to be written to pixels, and the data needs to be written within a short time. Otherwise, it is not possible to display a moving picture that has a very large amount of data for high-definition display. Therefore, TFTs used in a driving circuit are required to operate at a high speed. In order to achieve high-speed operations, there is a demand for forming the TFTs using a crystalline semiconductor layer having a desirable crystallinity, with which it is possible to obtain a high field-effect mobility.

The present inventors have developed a method for obtaining a desirable crystalline semiconductor layer on a glass substrate. In this method, a metal element capable of promoting crystallization is added to an amorphous semiconductor layer, which is then subjected to a heat treatment. With this method, a desirable semiconductor film having a uniform crystal orientation can be obtained through a heat treatment performed at a lower temperature and for a shorter time than other conventional methods.

However, when a silicon film crystallized with a catalyst element is used as is for the semiconductor layer of a TFT, the TFT will have an abrupt increase in the off-state current. The catalyst element irregularly segregates in the semiconductor film, and the segregation is significant at crystal grain boundaries. It is believed that the segregation of the catalyst element creates leak paths for a current, resulting in the abrupt increase in the off-state current. Therefore, after the formation of the crystalline silicon film, it is necessary to reduce the catalyst element concentration in the semiconductor film by moving the catalyst element out of the semiconductor film. The step of removing the catalyst element will be hereinafter referred to as a "gettering process". Moreover, the action of moving (attracting) the catalyst element will be hereinafter referred to as "gettering action", and the element capable of attracting the catalyst element will be hereinafter referred to as "gettering element".

Various types of gettering processes and methods have been proposed in the art.

For example, Japanese Laid-Open Patent Publication No. 8-213317 discloses a technique of forming an amorphized region in a silicon material that has been crystallized by using a catalyst element, and subjecting the silicon material to a heat treatment so that the catalyst element is moved (gettered) into lattice defects in the amorphized region. Japanese Laid-Open Patent Publication No. 8-213317 attempts to simplify the manufacturing process by using the source/drain region of the TFT as the gettering region. However, the method requires an additional step of activating the source/drain region with laser light, or the like, since an amorphous region as is cannot function as a source/drain region.

Japanese Laid-Open Patent Publication No. 8-330602 discloses a method that utilizes the gettering action of phosphorus. In the method, an active region (semiconductor layer) is formed by using a silicon material crystallized by using a catalyst element, and the source/drain region of the n-channel TFT is doped with phosphorus while the source/drain region of the p-channel TFT is doped with phosphorus and with boron at a higher concentration than that of phosphorus. Then, the structure is subjected to a heat treatment so as to getter the catalyst element to the source/drain regions.

Japanese Laid-Open Patent Publication No. 10-270363 discloses a technique of selectively introducing a group VB element such as phosphorus into a portion of a silicon material that has been crystallized by using a catalyst element, and subjecting the silicon material to a heat treatment at a temperature that does not exceed the deformation point of the substrate so that the catalyst element is moved (gettered) into the region where the group VB element has been introduced (gettering region). According to Japanese Laid-Open Patent Publication No. 10-270363, the gettering region is formed outside the island-shaped semiconductor layer (TFT active region), and the gettering region is removed after the gettering heat treatment. Then, the region where the catalyst element concentration has been lowered (hereinafter referred to also as "lightly-doped region") is used to form the active region of the semiconductor element (TFT).

The conventional gettering processes, including those disclosed in the three publications mentioned above, have various problems such as the need for additional steps for the gettering process, which complicates the manufacturing process and increases the manufacturing cost. One solution to this problem is to remove the catalyst element from the channel region by moving the catalyst element into regions of the semiconductor layer that are to be the source/drain regions, instead of removing the catalyst element from the entire semiconductor layer of the TFT. However, various studies by the present inventors revealed that the techniques disclosed in the publications mentioned above have other problems as follows.

When a group VB element capable of moving a catalyst element is introduced into a region of a silicon film, as in Japanese Laid-Open Patent Publication No. 8-330602 and Japanese Laid-Open Patent Publication No. 10-270363, the solid solubility of the region for the catalyst element is increased, thereby gettering the catalyst element (the first type of gettering action). In contrast, in Japanese Laid-Open Patent Publication No. 8-213317, a catalyst element is gettered by utilizing crystal defects of an amorphous region as localized segregation sites for trapping the catalyst element (the second type of gettering action). Since the free energy of the catalyst element is lower in an amorphous region than in a crystalline region, the catalyst element is likely to diffuse into the amorphous region.

In order to increase the gettering capability of a gettering region, it is necessary to sufficiently affect the first type of gettering action and the second type of gettering action. However, it is difficult to achieve in a source region or a drain region of a thin film transistor. An effective way of increasing the gettering efficiency is to introduce a large amount of a gettering element into a source region and a drain region, which function as gettering regions, while amorphizing the regions. However, it will then significantly increase the resistance of the source region and the drain region so that they will no longer function as a source region and a drain region.

When a large amount of a gettering element is ion-implanted into a region of a crystalline semiconductor layer, the crystalline structure of the region is destroyed and the region is amorphized. The amorphization proceeds starting from the upper surface of the semiconductor layer, and when it reaches the lower surface of the semiconductor layer, the crystallinity of the semiconductor layer can no longer be recovered even by a heat treatment. With conventional methods in which the source region and the drain region are used as gettering regions, the crystallinity of the doped regions needs to be recovered at least to some degree by a subsequent heat treatment so as to reduce the resistance of the regions. Thus, with these methods, the dose cannot be increased beyond a maximum level at which the crystallinity can later be recovered, and it is difficult to increase the gettering efficiency by implanting a large amount of a gettering element. On the other hand, a sufficient gettering capability cannot be obtained with a small dose of a gettering element. Thus, with these methods, the most difficult problem is how to appropriately control the dose of a gettering element. When such a technique was actually applied to a liquid crystal display device integrated with a driver (driving circuit), the source region and the drain region in some regions of the substrate were amorphized and the resistance thereof was increased, thereby resulting in defective TFT on-state characteristics and thus a driver defect. In some other regions, the dose of the gettering element was insufficient, resulting in insufficient gettering, thereby increasing the off-state leak current, resulting in line defects and point defects. Thus, these methods have a very small process margin, and are difficult to use for mass production.

The method disclosed in Japanese Laid-Open Patent Publication No. 8-213317 requires an additional step of activating the source/drain region with laser light, or the like, since an amorphous region as is cannot function as a source/drain region. However, a laser irradiation apparatus is expensive and complicated in structure, and has a poor maintainability, thereby increasing the manufacturing cost and reducing the production yield. Moreover, with only the laser irradiation process, crystal defects occurring at the junction between the channel region and the source/drain region cannot be recovered, thereby resulting in a poor reliability and an increase in the off-state leak current.

Moreover, when the present inventors actually produced TFT elements in an experiment using these conventional methods, defective TFTs with abnormal levels of TFT off-state leak current at a defect rate on the order of 0.1% were produced. An analysis has confirmed that the defective TFTs had masses of a silicide of the catalyst element at the junction between the channel region and the drain region. Thus, with the conventional techniques of the publications mentioned above, the catalyst element is not gettered sufficiently. Even though these conventional techniques are capable of producing some high-performance TFTs, with such high defect rates and poor reliabilities, they cannot be used for mass production. The problem with insufficient gettering of the catalyst element and its resultant problems were not recognized previously in the art.

The increase in the TFT off-state leak current due to the presence of a catalyst element is caused primarily by segregation of the catalyst element at the junction between the channel region and the drain region. With a method in which the source region and the drain region are used as gettering regions, the junction between the channel region and the source/drain region is also the junction between the gettering region and the non-gettering region. Therefore, with such a gettering method, it is difficult to completely prevent the increase in the TFT off-state leak current due to the presence of a catalyst element.

In addition, according to Japanese Laid-Open Patent Publication No. 8-213317, the amorphous gettering regions (the source region and the drain region) are eventually crystallized. Then, the gettering effect will be small thereafter, whereby the catalyst element that has been moved away in a heat treatment may later come back in a reverse flow (diffusion into the channel region) in a subsequent step. Moreover, even if such a reverse flow of the catalyst element is prevented from occurring during the manufacturing process, heat is generated in no small measure from driving the TFT, and the catalyst element that has been once moved into the gettering region may come back to the channel region in a reverse flow when driving the TFT, thus resulting in a reliability problem. Therefore, in a case where the gettering region is provided in the active region (semiconductor layer) of the TFT, it is preferred that the gettering capacity of the region is kept even after the completion of the TFT so as to keep the same level of gettering capability as that during the gettering process.

Furthermore, with such a method as that of Japanese Laid-Open Patent Publication No. 10-270363, in which a gettering region is formed outside of an island-shaped semiconductor layer (TFT active region) and is removed after gettering the catalyst element thereto, no gettering region is present in the final TFT, whereby the catalyst element may come back to the channel region in a reverse flow when driving the TFT, thus resulting in a reliability problem.

Moreover, in the method of Japanese Laid-Open Patent Publication No. 10-270363, a gettering region is formed outside of an island-shaped semiconductor layer, thereby requiring additional steps of forming a mask, implanting a gettering element, performing a gettering heat treatment, etc. Moreover, since the distance required for gettering is relatively long, the gettering heat treatment may take a long time or may fail to provide sufficient gettering efficiency.

SUMMARY OF THE INVENTION

In order to overcome the problems described above, preferred embodiments of the present invention provide a semiconductor device including TFTs (semiconductor elements) having a high-quality crystalline semiconductor film and highly desirable characteristics. Other preferred embodiments of the present invention provide a method of manufacturing that is capable of manufacturing such a novel semiconductor device at low cost without increasing the manufacturing steps.

An inventive semiconductor device includes at least one thin film transistor including a semiconductor layer that has a crystalline region including a channel region, a source region and a drain region, a gate insulating film disposed at least on the channel region, the source region and the drain region of the semiconductor layer, and a gate electrode arranged so as to oppose the channel region via the gate insulating film, wherein at least a portion of the semiconductor layer includes a catalyst element capable of promoting crystallization, and the semiconductor layer further includes a gettering region that includes the catalyst element at a higher concentration than in the channel region or the source region and the drain region, and a thickness of the gate insulating film on the gettering region is smaller than that on the source region and the drain region, or the gate insulating film is not disposed on the gettering region.

In a preferred embodiment, the semiconductor layer further includes an amorphous region, and at least a portion of the gettering region is disposed in the amorphous region.

In a preferred embodiment, at least a portion of the gettering region is disposed in the crystalline region.

In a preferred embodiment, the at least a portion of the gettering region disposed in the crystalline region has a larger amorphous component content and a smaller crystalline component content than those of the channel region or the source region and the drain region.

In a preferred embodiment, the semiconductor device includes a p-channel thin film transistor and an n-channel thin film transistor, wherein the at least one thin film transistor is the p-channel thin film transistor.

In a preferred embodiment, the semiconductor device includes a p-channel transistor and an n-channel transistor, wherein the at least one thin film transistor is the n-channel thin film transistor.

In a preferred embodiment, the at least one thin film transistor includes a p-channel thin film transistor and an n-channel thin film transistor.

In a preferred embodiment, the gettering region is located outside a region through which electrons or holes move during an operation of the at least one thin film transistor.

In a preferred embodiment, the gettering region is arranged so as not to be adjacent to the channel region.

In a preferred embodiment, the semiconductor device further includes a line connected to the at least one thin film transistor, wherein the gettering region is disposed in a peripheral portion of the semiconductor layer, an electrical connection of the line is made in at least a portion of the source region or the drain region, and the line is not connected to the gettering region.

In a preferred embodiment, the semiconductor device further includes a line connected to the at least one thin film transistor, wherein the gettering region is formed in a peripheral portion of the semiconductor layer, and an electrical connection of the line is made in at least a portion of the source region or the drain region and in a portion of the gettering region.

In a preferred embodiment, the at least one thin film transistor includes an n-channel thin film transistor, and the gettering region of the n-channel thin film transistor includes a group VB impurity element providing n-type conductivity at a higher concentration than in the source region or the drain region.

In a preferred embodiment, the gettering region includes a gettering element capable of attracting the catalyst element.

In a preferred embodiment, the gettering region includes a group VB impurity element providing n-type conductivity and a group IIIB impurity element providing p-type conductivity each as the gettering element.

In a preferred embodiment, the gettering region includes the impurity element providing n-type conductivity at a concentration of, for example, about $1 \times 10^{19}/cm^3$ to about $1 \times 10^{21}/cm^3$ and the impurity element providing p-type conductivity at a concentration of, for example, about $1.5 \times 10^{19}/cm^3$ to about $3 \times 10^{21}/cm^3$.

In a preferred embodiment, the gettering element includes at least one rare gas element selected from the group consisting of Ar, Kr and Xe.

In a preferred embodiment, a concentration of the at least one rare gas element in the gettering region is, for example, about $1 \times 10^{19}$ atoms/$cm^3$ to about $3 \times 10^{21}$ atoms/$cm^3$.

In a preferred embodiment, the catalyst element includes at least one element selected from the group consisting of Ni, Co, Sn, Pb, Pd, Fe and Cu.

In a preferred embodiment, a concentration of the catalyst element in the gettering region is, for example, about $5 \times 10^{18}$ atoms/$cm^3$ or more.

In a preferred embodiment, the gate electrode includes at least one metal element selected from the group consisting of W, Ta, Ti and Mo.

In a preferred embodiment, the crystalline region further includes an LDD region at a junction between the channel region and the source region and/or a junction between the channel region and the drain region.

An inventive method for manufacturing a semiconductor device includes the steps of forming an amorphous semiconductor film including a catalyst element in at least a portion thereof, the catalyst element being capable of promoting crystallization of the amorphous semiconductor film, performing a first heat treatment on the amorphous semiconductor film so as to crystallize at least a portion of the amorphous semiconductor film, thereby obtaining a semiconductor film including a crystalline region, patterning the semiconductor film to form an island-shaped semiconductor layer including the crystalline region, forming a gate insulating film on the island-shaped semiconductor layer, selectively thinning or selectively removing a portion of the gate insulating film that is located outside a region of the island-shaped semiconductor layer where a channel region, a source region and a drain region are formed, forming a gettering region capable of attracting the catalyst element in a region where the gate insulating film on the island-shaped semiconductor layer has been thinned or removed, doping the crystalline region of the island-shaped semiconductor layer with an impurity for forming the source region and the drain region, and performing a second heat treatment so as to move at least a portion of the catalyst element in the island-shaped semiconductor layer to the gettering region.

In a preferred embodiment, the island-shaped semiconductor layer further includes an amorphous region, and at least a portion of the gettering region is formed in the amorphous region.

In a preferred embodiment, at least a portion of the gettering region is formed in the crystalline region.

In a preferred embodiment, the impurity doping step includes a step of doping an n-type impurity and/or a p-type impurity before performing the second heat treatment.

In a preferred embodiment, the step of forming the gettering region includes a step of doping the island-shaped semiconductor layer with a gettering element capable of attracting the catalyst element.

In a preferred embodiment, at least a portion of the impurity doping step is performed before the gettering element doping step.

In a preferred embodiment, at least a portion of the impurity doping step is performed after the gettering element doping step.

In a preferred embodiment, at least a portion of the impurity doping step is performed simultaneously with the gettering element doping step.

In a preferred embodiment, the gettering element doping step is performed by selectively doping a region of the island-shaped semiconductor layer where the gate insulating film has been thinned or removed, with a gettering element.

In a preferred embodiment, the gettering element doping step includes a step of doping a region of the island-shaped semiconductor layer where the gate insulating film has been thinned or removed, with a gettering element at a higher concentration than that in the source region and the drain region.

In a preferred embodiment, the gettering element includes a group VB impurity element providing n-type conductivity.

In a preferred embodiment, the gettering element includes a group VB impurity element providing n-type conductivity and a group IIIB impurity element providing p-type conductivity.

In a preferred embodiment, the gettering element includes at least one element selected from the group consisting of Ar, Kr and Xe.

In a preferred embodiment, a concentration of the gettering element in the gettering region is, for example, about $1 \times 10^{19}$ atoms/cm$^3$ to about $3 \times 10^{21}$ atoms/cm$^3$.

In a preferred embodiment, the gettering region formation step includes a step of amorphizing a region of the island-shaped semiconductor layer where the gate insulating film has been thinned or removed to a higher degree than the source region and the drain region.

In a preferred embodiment, the gettering region is formed in the island-shaped semiconductor layer outside a region thereof through which electrons or holes move.

In a preferred embodiment, the gettering region is formed so as to be adjacent to the source region and/or the drain region and so as not to be adjacent to the channel region.

In a preferred embodiment, the method further includes, after the second heat treatment step, a step of forming a line that is in contact with a region including at least a portion of the source region or the drain region.

Another inventive method for manufacturing a semiconductor device includes the steps of providing an amorphous semiconductor film including a catalyst element in at least a portion thereof, the catalyst element being capable of promoting crystallization of the amorphous semiconductor film, performing a first heat treatment on the amorphous semiconductor film so as to crystallize at least a portion of the amorphous semiconductor film, thereby obtaining a semiconductor film including a crystalline region, patterning the semiconductor film to form a plurality of island-shaped semiconductor layers each including the crystalline region, forming a gate insulating film on each of the plurality of island-shaped semiconductor layers, forming a gate electrode on the gate insulating film on each of the plurality of island-shaped semiconductor layers, selectively thinning or selectively removing a portion of the gate insulating film that is located outside a region of at least one of the plurality of island-shaped semiconductor layers where a source region and a drain region are formed and that is located in a region where the gate electrode is not formed, performing a doping process for forming the source region and the drain region in each of the plurality of island-shaped semiconductor layers and for forming a gettering region capable of attracting the catalyst element in a region of the at least one island-shaped semiconductor layer where the gate insulating film has been thinned or removed, and performing a second heat treatment so as to move at least a portion of the catalyst element in the at least one island-shaped semiconductor layer to the gettering region.

In a preferred embodiment, the island-shaped semiconductor layer further includes an amorphous region, and at least a portion of the gettering region is formed in the amorphous region.

In a preferred embodiment, at least a portion of the gettering region is formed in the crystalline region.

In a preferred embodiment, the at least one island-shaped semiconductor layer includes an island-shaped semiconductor layer of an n-channel thin film transistor and an island-shaped semiconductor layer of a p-channel thin film transistor, the doping step including an n-type doping step of doping a region of the island-shaped semiconductor layer of the n-channel thin film transistor where the source region and the drain region are formed and a region of the island-shaped semiconductor layer of the p-channel thin film transistor where the gettering region is formed, with an impurity element providing n-type conductivity, and a p-type doping step of, after the n-type doping step, doping a region of the island-shaped semiconductor layer of the p-channel thin film transistor where the source region, the drain region and the gettering region are formed, with an impurity element providing p-type conductivity.

In a preferred embodiment, the at least one island-shaped semiconductor layer includes an island-shaped semiconductor layer of a p-channel thin film transistor, and the plurality of island-shaped semiconductor layers further include an island-shaped semiconductor layer of an n-channel thin film transistor, the doping step including a p-type doping step of doping a region of the island-shaped semiconductor layer of the p-channel thin film transistor where the source region, the drain region and the gettering region are formed, with an impurity element providing p-type conductivity, and an n-type doping step of, after the p-type doping step, doping a region of the n-channel thin film transistor where the source region and the drain region are formed and a region of the island-shaped semiconductor layer of the p-channel thin film transistor where the gettering region is formed, with an impurity element providing n-type conductivity.

In a preferred embodiment, the at least one island-shaped semiconductor layer includes an island-shaped semiconductor layer of an n-channel thin film transistor and an island-shaped semiconductor layer of a p-channel thin film transistor, the doping step including an n-type doping step of doping a region of the island-shaped semiconductor layer of the n-channel thin film transistor where the source region, the drain region and the gettering region are formed and a region of the island-shaped semiconductor layer of the p-channel thin film transistor where the gettering region is formed, with an impurity element providing n-type conductivity, and a p-type doping step of, after the n-type doping step, doping a region of the island-shaped semiconductor layer of the p-channel thin film transistor where the source region, the drain region and the gettering region are formed and a region of the island-shaped semiconductor layer of the n-channel thin film transistor where the gettering region is formed, with an impurity element providing p-type conductivity.

In a preferred embodiment, the at least one island-shaped semiconductor layer includes an island-shaped semiconductor layer of an n-channel thin film transistor and an island-shaped semiconductor layer of a p-channel thin film transistor, the doping step including a p-type doping step of doping a region of the island-shaped semiconductor layer of the p-channel thin film transistor where the source region, the drain region and the gettering region are formed and a region of the island-shaped semiconductor layer of the n-channel thin film transistor where the gettering region is formed, with an impurity element providing p-type conductivity, and an n-type doping step of, after the p-type doping step, doping a region of the island-shaped semiconductor layer of the n-channel thin film transistor where the source region, the drain region and the gettering region are formed and a region of the island-shaped semiconductor layer of the p-channel thin film transistor where the gettering region is formed, with an impurity element providing n-type conductivity.

In a preferred embodiment, the step of selectively thinning or selectively removing a portion of the gate insulating film of the at least one island-shaped semiconductor layer includes a step of forming a mask on the source region and the drain region of the at least one island-shaped semiconductor layer, and a step of etching the gate insulating film using the mask, and the mask is used in the doping step.

In a preferred embodiment, the step of selectively thinning or selectively removing a portion of the gate insulating film of the at least one island-shaped semiconductor layer is performed between the n-type doping step and the p-type doping step.

In a preferred embodiment, the step of selectively thinning or selectively removing a portion of the gate insulating film of the at least one island-shaped semiconductor layer is performed between the n-type doping step and the p-type doping step.

In a preferred embodiment, the p-type doping step includes a step of forming a mask covering a region of each of the plurality of island-shaped semiconductor layers that does not need to be doped with an impurity element providing p-type conductivity, and the mask is used in the step of selectively thinning or selectively removing a portion of the gate insulating film of the at least one island-shaped semiconductor layer.

In a preferred embodiment, the n-type doping step includes a step of forming a mask covering a region of each of the plurality of island-shaped semiconductor layers that does not need to be doped with an impurity element providing n-type conductivity, and the mask is used in the step of selectively thinning or selectively removing a portion of the gate insulating film of the at least one island-shaped semiconductor layer.

In a preferred embodiment, the step of selectively thinning or selectively removing a portion of the gate insulating film of the at least one island-shaped semiconductor layer includes a step of removing the mask.

Still another inventive method for manufacturing a semiconductor device includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers including an island-shaped semiconductor layer of a p-channel thin film transistor and an island-shaped semiconductor layer of an n-channel thin film transistor, each of the plurality of island-shaped semiconductor layers including the crystalline region, a fourth step of forming a gate insulating film on the plurality of island-shaped semiconductor layers, a fifth step of forming a conductive film on the gate insulating film and shaping the conductive film to form a first gate electrode on the gate insulating film on the island-shaped semiconductor layer of the p-channel thin film transistor, a sixth step of doping the island-shaped semiconductor layer of the p-channel thin film transistor with an impurity element providing p-type conductivity using the first gate electrode as a mask so as to form a source region, a drain region and a gettering region capable of attracting the catalyst element, a seventh step of forming, on the conductive film, a mask that exposes a portion of the island-shaped semiconductor layer of the p-channel thin film transistor, covers the first gate electrode, and defines a second gate electrode formed on the island-shaped semiconductor layer of the n-channel thin film transistor, an eighth step of shaping the conductive film using the mask to form the second gate electrode, a ninth step of doping regions of the plurality of island-shaped semiconductor layers that are not covered with the mask, the first gate electrode or the second gate electrode, with an impurity element providing n-type conductivity, thereby further doping the gettering region of the island-shaped semiconductor layer of the p-channel thin film transistor with an n-type impurity while forming a source region and a drain region of the island-shaped semiconductor layer of the n-channel thin film transistor, and a tenth step of performing a second heat treatment so as to move at least a portion of the catalyst element in the island-shaped semiconductor layer of the p-channel thin film transistor to the gettering region thereof and at least a portion of the catalyst element in the island-shaped semiconductor layer of the n-channel thin film transistor to the source region and the drain region thereof, wherein a step of selectively thinning or selectively removing a portion of the gate insulating film on the gettering region of the island-shaped semiconductor layer of the p-channel thin film transistor is performed at least once at any point in time between after the seventh step and after the eighth step.

In a preferred embodiment, the step of selectively thinning or selectively removing a portion of the gate insulating film on the gettering region of the island-shaped semiconductor layer of the p-channel thin film transistor is performed simultaneously with the eighth step using the mask that exposes a portion of the island-shaped semiconductor layer of the p-channel thin film transistor.

Still another inventive method for manufacturing a semiconductor device includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers including an island-shaped semiconductor layer of an n-channel thin film transistor and an island-shaped semiconductor layer of a p-channel thin film transistor, each of the plurality of island-shaped semiconductor layers including the crystalline region, a fourth step of forming a gate insulating film on the plurality of island-shaped semiconductor layers, a fifth step of forming a first gate electrode on the gate insulating film on the island-shaped semiconductor layer of the n-channel thin film transistor, and forming a second gate electrode conductive layer on the gate insulating film on the island-shaped semiconductor layer of the p-channel thin film transistor, a sixth step of doping the island-shaped semiconductor layers with an impurity element providing n-type conductivity using the first gate electrode and the second gate electrode conductive layer as a mask so as to form a source region and a drain region in the island-shaped semiconductor layer of the n-channel thin film transistor while forming a gettering region capable of attracting the catalyst element in the island-shaped semiconductor layer of the p-channel thin film transistor, a seventh step of forming a mask that covers the island-shaped semiconductor layer of the n-channel thin film transistor and a portion of the second gate electrode conductive layer, an eighth step of shaping the second gate electrode conductive layer using the mask to form the second gate electrode, a ninth step of doping regions of the plurality of island-shaped semiconductor layers that are not covered with the mask or the second gate electrode, with an impurity element providing p-type conductivity, thereby further doping the gettering region of the island-shaped semiconductor layer of the p-channel thin film transistor with a p-type impurity while forming a source region and a drain region, and a tenth step of performing a second heat treatment so as to move at least a portion of the catalyst element in the island-shaped semiconductor layer of the p-channel thin film transistor to the gettering region thereof and at least a portion of the catalyst element in the island-shaped semiconductor layer of the n-channel thin film transistor to the source region and the drain region thereof, wherein a step of selectively thinning or selectively removing a portion of the gate insulating film on the gettering region of the island-shaped semiconductor layer of the p-channel thin film transistor is performed at least once at any point in time between after the fifth step and after the eighth step.

In a preferred embodiment, the step of selectively thinning or selectively removing a portion of the gate insulating film on the gettering region of the island-shaped semiconductor layer of the p-channel thin film transistor is performed simultaneously with the eighth step using the first gate electrode as a mask.

Still another inventive method for manufacturing a semiconductor device includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers including an island-shaped semiconductor layer of an n-channel thin film transistor and an island-shaped semiconductor layer of a p-channel thin film transistor, each of the plurality of island-shaped semiconductor layers including the crystalline region, a fourth step of forming a gate insulating film on the plurality of island-shaped semiconductor layers, a fifth step of forming a first gate electrode on the gate insulating film on the island-shaped semiconductor layer of the p-channel thin film transistor, and forming a second gate electrode conductive layer on the gate insulating film on the island-shaped semiconductor layer of the n-channel thin film transistor, a sixth step of doping the island-shaped semiconductor layers with an impurity element providing p-type conductivity using the first gate electrode and the second gate electrode conductive layer as a mask so as to form a source region, a drain region and a gettering region capable of attracting the catalyst element in the island-shaped semiconductor layer of the p-channel thin film transistor while forming a gettering region capable of attracting the catalyst element in the island-shaped semiconductor layer of the n-channel thin film transistor, a seventh step of forming a mask that exposes a portion of the island-shaped semiconductor layer of the p-channel thin film transistor and covers the first gate electrode and a portion of the second gate electrode conductive layer, an eighth step of shaping the second gate electrode conductive layer using the mask to form the second gate electrode, a ninth step of doping regions of the plurality of island-shaped semiconductor layers that are not covered with the mask or the second gate electrode, with an impurity element providing n-type conductivity, thereby amorphizing the gettering region of the island-shaped semiconductor layer of the p-channel thin film transistor, while forming a source region and a drain region in the island-shaped semiconductor layer of the n-channel thin film transistor and further doping the gettering region with an impurity element providing n-type conductivity, and a tenth step of performing a second heat treatment so as to move at least a portion of the catalyst element in the island-shaped semiconductor layer of the p-channel thin film transistor to the gettering region thereof and at least a portion of the catalyst element in the island-shaped semiconductor layer of the n-channel thin film transistor to the gettering region thereof, wherein a step of selectively thinning or selectively removing a portion of the gate insulating film on the gettering region of the island-shaped semiconductor layer of the n-channel thin film transistor and/or the island-shaped semiconductor layer of the p-channel thin film transistor is performed at least once at any point in time between after the fifth step and after the eighth step.

In a preferred embodiment, the step of selectively thinning or selectively removing a portion of the gate insulating film on the gettering region of the island-shaped semiconductor layer of the n-channel thin film transistor and/or the island-shaped semiconductor layer of the p-channel thin film transistor is performed simultaneously with the eighth step, and includes a step of selectively thinning or selectively removing a portion of the gate insulating film on the island-shaped semiconductor layer of the p-channel thin film transistor that is not covered with the second gate electrode conductive layer and a portion of the gate insulating film on the island-shaped semiconductor layer of the p-channel thin film transistor that is not covered with the mask.

Still another inventive method for manufacturing a semiconductor device includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers including an island-shaped semiconductor layer of an n-channel thin film transistor and an island-shaped semiconductor layer of a p-channel thin film transistor, each of the plurality of island-shaped semiconductor layers including the crystalline region, a fourth step of forming a gate insulating film on the plurality of island-shaped semiconductor layers, a fifth step of forming a first gate electrode on the gate insulating film on the island-shaped semiconductor layer of the n-channel thin film transistor, and forming a second gate electrode conductive layer on the gate insulating film on the island-shaped semiconductor layer of the p-channel thin film transistor, a sixth step of doping the island-shaped semiconductor layers with an impurity element providing n-type conductivity using the first gate electrode and the second gate electrode conductive layer as a mask so as to form a source region, a drain region and a gettering region capable of attracting the catalyst element in the island-shaped semiconductor layer of the n-channel thin film transistor while forming a gettering region capable of attracting the catalyst element in the island-shaped semiconductor layer of the p-channel thin film transistor, a seventh step of forming a mask that exposes a portion of the island-shaped semiconductor layer of the n-channel thin film transistor and covers the first gate electrode and a portion of the second gate electrode conductive layer, an eighth step of shaping the second gate electrode conductive layer using the mask to form the second gate electrode, a ninth step of doping regions of the plurality of island-shaped semiconductor layers that are not covered with the mask or the second gate electrode, with an impurity element providing p-type conductivity, thereby amorphizing the gettering region of the island-shaped semiconductor layer of the n-channel thin film transistor, while forming a source region and a drain region in the island-shaped semiconductor layer of the n-channel thin film transistor and further doping the gettering region with an impurity element providing p-type conductivity, and a tenth step of performing a second heat treatment so as to move at least a portion of the catalyst element in the island-shaped semiconductor layer of the p-channel thin film transistor to the gettering region thereof and at least a portion of the catalyst element in the island-shaped semiconductor layer of the n-channel thin film transistor to the gettering region thereof, wherein a step of selectively thinning or selectively removing a portion of the gate insulating film on the gettering region of the island-shaped semiconductor layer of the n-channel thin film transistor and/or the island-shaped semiconductor layer of the p-channel thin film transistor is performed at least once at any point in time between after the fifth step and after the eighth step.

In a preferred embodiment, the step of selectively thinning or selectively removing a portion of the gate insulating film on the gettering region of the island-shaped semiconductor layer of the n-channel thin film transistor and/or the island-shaped semiconductor layer of the p-channel thin film transistor is performed simultaneously with the eighth step, and includes a step of selectively thinning or selectively removing a portion of the gate insulating film on the island-shaped semiconductor layer of the n-channel thin film transistor that is not covered with the mask and a portion of the gate insulating film on the island-shaped semiconductor layer of the p-channel thin film transistor that is not covered with the second gate electrode conductive layer.

In a preferred embodiment, a width of the second gate electrode conductive layer in a channel width direction is larger than that of the second gate electrode.

In a preferred embodiment, a concentration of the impurity element providing n-type conductivity for doping the gettering region is, for example, about $1\times10^{19}$ atoms/cm$^3$ to about $1\times10^{21}$ atoms/cm$^3$, and a concentration of the impurity element providing p-type conductivity for doping the gettering region is, for example, about $1.5\times10^{19}$ atoms/cm$^3$ to about $3\times10^{21}$ atoms/cm$^3$.

In a preferred embodiment, the second heat treatment is performed so as to activate at least an impurity providing n-type conductivity and/or an impurity providing p-type conductivity that are implanted into the source region and the drain region of the plurality of island-shaped semiconductor layers.

In a preferred embodiment, the step of providing an amorphous semiconductor film includes the steps of forming a mask having an opening therein on the amorphous semiconductor film, and doping a selected region of the amorphous semiconductor film with the catalyst element through the opening.

In a preferred embodiment, the catalyst element is at least one element selected from the group consisting of Ni, Co, Sn, Pb, Pd, Fe and Cu.

In a preferred embodiment, the method further includes, after the first heat treatment, a step of irradiating the semiconductor film with laser light.

An inventive semiconductor device is manufactured by any of the manufacturing methods set forth above.

An inventive electronic device includes any of the semiconductor devices set forth above.

In a preferred embodiment, the electronic device further includes a display section including the semiconductor device set forth above.

Other features, elements, characteristics, steps and advantages of the present invention will become more apparent from the following detailed description of preferred embodiments with reference to the attached drawings.

BRIEF DESCRIPTION OF THE DRAWINGS

FIG. 1A to FIG. 1H are schematic cross-sectional views illustrating steps for manufacturing a semiconductor device according to a preferred embodiment of the present invention.

DETAILED DESCRIPTION OF PREFERRED EMBODIMENTS

Figure 2A:
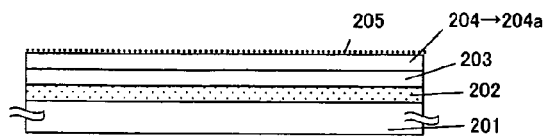
FIG. 2A to FIG. 2H are schematic cross-sectional views illustrating steps for manufacturing a semiconductor device according to a preferred embodiment of the present invention.

Semiconductor devices and methods for manufacturing the same according to various preferred embodiments of the present invention will now be described.

In one preferred embodiment of the present invention, a semiconductor device includes at least one thin film transistor including a semiconductor layer that has a crystalline region including a channel region, a source region and a drain region, a gate insulating film disposed at least on the channel region, the source region and the drain region of the semiconductor layer, and a gate electrode arranged so as to oppose the channel region via the gate insulating film. At least a portion of the semiconductor layer includes a catalyst element capable of promoting crystallization, and the semiconductor layer further includes a gettering region that includes the catalyst element at a higher concentration than in the channel region or the source region and the drain region. The thickness of the gate insulating film on the gettering region is smaller than that on the source region and the drain region, or the gate insulating film is not disposed on the gettering region. The semiconductor layer may further include an amorphous region, and at least a portion of the gettering region may be located in the amorphous region. Alternatively, at least a portion of the gettering region may be located in the crystalline region.

A method for manufacturing a semiconductor device according to a preferred embodiment of the present invention includes the steps of providing an amorphous semiconductor film including a catalyst element in at least a portion thereof, the catalyst element being capable of promoting crystallization of the amorphous semiconductor film, performing a first heat treatment on the amorphous semiconductor film so as to crystallize at least a portion of the amorphous semiconductor film, thereby obtaining a semiconductor film including a crystalline region, patterning the semiconductor film to form an island-shaped semiconductor layer including the crystalline region, forming a gate insulating film on the island-shaped semiconductor layer, selectively thinning or selectively removing a portion of the gate insulating film that is located outside a region of the island-shaped semiconductor layer where a channel region, a source region and a drain region are formed, forming a gettering region capable of attracting the catalyst element in a region where the gate insulating film on the island-shaped semiconductor layer has been thinned or removed, doping the crystalline region of the island-shaped semiconductor layer with an impurity for forming the source region and the drain region, and performing a second heat treatment so as to move at least a portion of the catalyst element in the island-shaped semiconductor layer to the gettering region.

Thus, according to a preferred embodiment of the present invention, the TFT includes the gettering region in the semiconductor layer that is separate from the source region and the drain region. The thickness of the gate insulating film on the gettering region is preferably smaller than that on the source and drain regions (or no gate insulating film may be provided on the gettering region). In other words, the gate insulating film is selectively thinned in a region where the gettering region is formed. In a top gate TFT, an impurity element is implanted into the semiconductor layer typically through the overlying gate insulating film. In other words, the semiconductor layer is doped through the gate insulating film. Then, the concentration of the impurity element implanted into the semiconductor layer and the crystallinity (the degree of amorphization) of the doped region are determined by the ion implantation conditions (primarily the acceleration voltage and the dose) and the thickness of the gate insulating film.

Thus, in the manufacturing method of this preferred embodiment of the present invention, a dedicated gettering region is formed in the semiconductor layer separately from the source/drain region, and the overlying gate insulating film is formed with different thicknesses on the source/drain region, which is required to have a low resistance, and on the gettering region, which is required to have a desirable gettering capability, so that the gate insulating film is thinner on the gettering region. Then, the semiconductor layer is doped through such a gate insulating film. In this way, the gettering region and the source/drain region can be doped differently, and an optimal amount of an n-type impurity or a p-type impurity can be added to the source/drain region in a substantially separate step without being influenced by gettering considerations. On the other hand, the gettering region can also be optimized, separately from the source/drain region, with respect to the dose, the degree of amorphization, etc., focusing on the gettering considerations.

Therefore, as compared with the conventional method in which the source/drain region is used as the gettering region, it is possible to increase the process margin and to significantly improve the gettering capability while still obtaining the advantageous effect of shortening and simplifying the process. Moreover, it is also possible to improve the throughput of the doping apparatus.

Furthermore, unlike the conventional method in which the source/drain region is used as the gettering region, the source/drain region is a non-gettering region, or a region to be gettered. Therefore, the junction between the channel region and the source/drain region can be gettered completely. Thus, it is possible to substantially completely prevent the increase in the off-state leak current, which deteriorates the characteristics of a TFT, while ensuring a higher reliability.

Moreover, with the manufacturing method of the present preferred embodiment of the present invention, unlike the conventional method in which the gettering region is formed outside the island-shaped semiconductor layer, the formation of the gettering region and the gettering heat treatment can be performed together with the formation of the source/drain region and the activation of the source/drain region, thereby simplifying the manufacturing process. Moreover, since the distance required for gettering is relatively short with the method of the present preferred embodiment of the present invention, it is possible to obtain sufficient gettering efficiency even with a gettering heat treatment of a relatively short period of time. Moreover, since the gettering region is left unremoved in the final TFT, it is possible to suppress or prevent the reliability from being deteriorated by the reverse flow of the catalyst element into the channel region when driving the TFT. Furthermore, the gettering region is formed independently of the source/drain region and can have a sufficiently high gettering capability even after the completion of the TFT, whereby it is possible to obtain a TFT with high reliability.

Thus, with the preferred embodiments of the present invention, it is possible to suppress the occurrence of the leak current due to the segregation of the catalyst element, and to realize particularly desirable characteristics with a TFT required to have a low off-state leak current such as a switching device in the pixel section, a sampling device in a driving circuit, or a memory device. Moreover, since a semiconductor film obtained by crystallization with a catalyst element exhibits a desirable crystallinity, a TFT of various preferred embodiments of the present invention can have desirable characteristics for use as an element in a driving circuit, which is required to have a high field-effect mobility.

In a semiconductor device according to a preferred embodiment of the present invention, the gettering region is located in the semiconductor layer outside a region thereof through which electrons or holes move when driving the thin film transistor. With such an arrangement, the role of the gettering region can be completely separated from that of the source/drain region, and the conditions of the dedicated gettering region (e.g., the degree of amorphousness and the concentration of the gettering element) can be optimized irrespective of other conditions such as the resistance. Moreover, it is preferred that the gettering region is formed so as not to be adjacent to the channel region. With such an arrangement of the gettering region, it is possible to completely getter the junction between the channel region and the source/drain region as described above.

In one specific preferred embodiment, a lightly-doped impurity region (LDD region) may be provided at a junction between the channel region and the source or drain region of the semiconductor layer. The LDD region is capable of relaxing the electric field localization at the junction, reducing the off-state leak current, and improving the hot carrier resistance. Also with such an arrangement, it is possible to sufficiently getter the catalyst element at the junction between the channel region and the LDD region and at the junction between the LDD region and the source/drain region.

In one preferred embodiment, the gettering region is disposed in a peripheral portion of the semiconductor layer (the active region of the thin film transistor), and the connection of a line for electrically connecting the thin film transistor is made in at least a portion of the source region or the drain region. Alternatively, the connection of the line for electrically connecting the thin film transistor is made in a region including a portion of the gettering region or in the source region or the drain region. If the electrical connection with the line is made in such a region, carriers (electrons or holes) can move in the thin film transistor without passing through the gettering region. Therefore, the gettering region can be dedicated to the gettering function and can be optimized as such. A manufacturing method for obtaining such an arrangement further includes, after the second heat treatment, a step of forming a line that is in contact with a region including at least a portion of the source region or the drain region.

In one preferred embodiment of the present invention, the main feature is to selectively thin the gate insulating film on the gettering region. In order to obtain an even greater effect, the gate insulating film may be further thinned on the gettering region even to a point where the gate insulating film is no longer present on the gettering region. Therefore, in the manufacturing method, the step of selectively thinning the gate insulating film on a region of the island-shaped semiconductor layer other than regions where the channel region, the source region and the drain region are to be formed may be a step of etching away the gate insulating film on the region. With such an arrangement, it is possible to obtain an even greater effect by completely separating the doping conditions for the gettering region from those for the source/drain region.

In various preferred embodiments of the present invention, the following three methods can be used for implanting a gettering element. Note that any of these methods may be used either alone or in combination.

The first method of implanting a gettering element for forming a gettering region is to dope the island-shaped semiconductor layer with an element having a gettering effect (gettering element) selectively in the region where the overlying gate insulating film has been thinned. Therefore, the gettering region of a semiconductor device produced by this method includes a gettering element therein. A large amount of a gettering element can be introduced selectively into the gettering region since the overlying gate insulating film has been thinned, whereby it is possible to significantly improve the capability of the gettering region.

The second method of implanting a gettering element for forming a gettering region is to dope the island-shaped semiconductor layer with a gettering element at a higher concentration in the region where the overlying gate insulating film has been thinned than in the source region and the drain region. Therefore, the gettering region of the semiconductor device includes the gettering element at a higher concentration than in the source region and the drain region. Unlike the first method described above, the gettering element is also included in regions other than the gettering region. However, a larger amount of the gettering element is introduced into the gettering region by utilizing the difference between the thickness of the gate insulating film in the gettering region and in the other regions so that the gettering region can provide a gettering action that is strong enough to getter the source/drain regions.

The gettering element may be a group VB impurity element providing n-type conductivity as described above. When such an element is introduced into a semiconductor film, the solid solubility of the region for the catalyst element is increased, thereby effecting the first gettering action as described above. Therefore, the second method is particularly effective for an n-channel thin film transistor. In the semiconductor device of one preferred embodiment of the present invention, a group VB impurity element providing n-type conductivity is included in the gettering region of the n-channel thin film transistor at a higher concentration than in the source region or the drain region.

It is possible to obtain a great effect by using a group IIIB impurity element providing p-type conductivity in addition to a group VB impurity element providing n-type conductivity. In such a case, the gettering region includes a group VB impurity element providing n-type conductivity and a group IIIB impurity element providing p-type conductivity each as the gettering element. When the gettering region is doped not only with a group VB element but also with a group IIIB element, the gettering mechanism changes, and the second gettering action becomes dominant, in addition to the first gettering action, which can be effected only with phosphorus. Thus, the gettering capability is increased, thereby obtaining a greater gettering effect. It is most effective to use P (phosphorus) as the group VB element and B (boron) as the group IIIB element.

In such a case, the gettering region may include the impurity element providing n-type conductivity at a concentration of, for example, about $1\times10^{19}/cm^3$ to about $1\times10^{21}/cm^3$ and the impurity element providing p-type conductivity at a concentration of, for example, about $1.5\times10^{19}/cm^3$ to about $3\times10^{21}/cm^3$. A sufficient gettering efficiency is obtained within these ranges. Using concentrations above these ranges is not advantageous as the gettering efficiency is saturated at such concentrations and doing so will only elongate the process time.

Other gettering elements that can be used in preferred embodiments of the present invention include one or more rare gas element selected from Ar, Kr and Xe. Thus, in one preferred embodiment of the present invention, the gettering region includes one or more rare gas element selected from Ar, Kr and Xe as a gettering element. When such a rare gas element is present in the gettering region, a substantial lattice strain is created, whereby the second gettering action, which utilizes defects/segregation sites, is effected strongly. In such a case, the concentration of the rare gas element in the gettering region is, for example, preferably about $1\times10^{19}$ atoms/$cm^3$ to about $3\times10^{21}$ atoms/$cm^3$. A sufficient gettering efficiency is obtained within these ranges. Using concentrations above these ranges is not advantageous as the gettering efficiency is saturated at such concentrations and doing so will only elongate the process time.

The third method of implanting a gettering element for forming a gettering region is to dope the island-shaped semiconductor layer so that the region where the overlying gate insulating film has been thinned is more amorphized than the source region and the drain region. Therefore, the gettering region of a semiconductor device produced with this method includes a more amorphous component and a less crystalline component than in the channel region, the source region or the drain region. Since the free energy of the catalyst element is lower in an amorphous region than in a crystalline region, the catalyst element is likely to diffuse into the amorphous region. Moreover, this method effects the second gettering action, whereby dangling bonds, lattice defects, and the like, form segregation sites for attracting and trapping the catalyst element. With the gettering region being provided in the semiconductor layer of the TFT separately from the source region and the drain region, the gettering region can be arranged so as not to interfere with the movement of the carriers (electrons or holes) in the TFT. Therefore, even if the gettering region is amorphized, increasing the resistance thereof, there is no adverse influence on the TFT. Therefore, it is possible to form, in the semiconductor layer, an amorphous gettering region having a high gettering capability, which is difficult to use with conventional techniques.

The crystalline conditions of the gettering region, the channel region and the source/drain region can be effectively evaluated in terms of the ratio Pa/Pc between the TO-phonon peak Pa of an amorphous semiconductor and the TO-phonon peak Pc of a crystalline semiconductor in a Raman spectrum. With a silicon film, for example, the TO-phonon peak Pc of crystalline Si appears near 52 $cm^{-1}$, and the TO-phonon peak Pa of amorphous Si appears in a broader shape near 48 $cm^{-1}$, reflecting the state density. Thus, it is possible to ensure a gettering efficiency desired in preferred embodiments of the present invention to obtain the effects described above if the ratio Pa/Pc between the TO-phonon peak Pa of an amorphous semiconductor and the TO-phonon peak Pc of a crystalline semiconductor in the Raman spectrum is larger in the gettering region than in the channel region or the source/drain region. In the manufacturing method of preferred embodiments of the present invention, it is preferred that the ratio Pa/Pc between the TO-phonon peak Pa of an amorphous semiconductor and the TO-phonon peak Pc of a crystalline semiconductor in the Raman spectrum is larger in the gettering region than in the source/drain region, and that such a state is maintained even after the second heat treatment. If a TFT is produced with a semiconductor layer in such a state, it is possible, when driving the TFT, to keep the same level of gettering capability as that during the gettering process at any time and to prevent the reverse diffusion of the catalyst element from the gettering region, thereby improving the reliability of the semiconductor device.

In one preferred embodiment of the present invention, the manufacturing method further includes, before the second heat treatment, a step of doping the island-shaped semiconductor layer with an n-type impurity or a p-type impurity in a selected region thereof. The step of doping the semiconductor layer with an n-type impurity or a p-type impurity may be performed before or after doping it with a gettering element. The effects of preferred embodiments of the present invention can be obtained whether the doping step for forming the source region and the drain region of the semiconductor layer is performed before or after the gettering element doping step. Alternatively, the step of doping the semiconductor layer with an n-type impurity or a p-type impurity may be performed simultaneously with the gettering element doping process. Since an n-type impurity itself functions as a gettering element, the step may be performed together with the n-type impurity doping step for forming the source/drain region, particularly when producing an n-channel thin film transistor. In this way, it is not necessary to perform a separate gettering step, thereby simplifying the manufacturing process.

A manufacturing method according to another preferred embodiment of the present invention includes the steps of providing an amorphous semiconductor film including a catalyst element in at least a portion thereof, the catalyst element being capable of promoting crystallization of the amorphous semiconductor film, performing a first heat treatment on the amorphous semiconductor film so as to crystallize at least a portion of the amorphous semiconductor film, thereby obtaining a semiconductor film including a crystalline region, patterning the semiconductor film to form a plurality of island-shaped semiconductor layers each including the crystalline region, forming a gate insulating film on each of the plurality of island-shaped semiconductor layers, forming a gate electrode on the gate insulating film, selectively thinning a portion of the gate insulating film that is located outside a region of at least one of the plurality of island-shaped semiconductor layers where a source region and a drain region are formed, performing a doping process for forming the source region and the drain region in each of the plurality of island-shaped semiconductor layers and for forming a gettering region in a region of the at least one island-shaped semiconductor layer where the gate insulating film has been thinned, and performing a second heat treatment so as to move at least a portion of the catalyst element in the at least one island-shaped semiconductor layer to the gettering region.

The doping step preferably includes an n-type doping step of doping a region of the island-shaped semiconductor layer of the n-channel thin film transistor where the source region and the drain region are formed and a region of the island-shaped semiconductor layer of the p-channel thin film transistor where the gettering region is formed, with an impurity element providing n-type conductivity, and a p-type doping step of, after the n-type doping step, doping a region of the island-shaped semiconductor layer of the p-channel thin film transistor where the source region, the drain region and the gettering region are formed, with an impurity element providing p-type conductivity.

Alternatively, the doping step preferably includes a p-type doping step of doping a region of the island-shaped semiconductor layer of the p-channel thin film transistor where the source region, the drain region and the gettering region are formed, with an impurity element providing p-type conductivity, and an n-type doping step of, after the p-type doping step, doping a region of the n-channel thin film transistor where the source region and the drain region are formed and a region of the island-shaped semiconductor layer of the p-channel thin film transistor where the gettering region is formed, with an impurity element providing n-type conductivity.

A semiconductor device formed by these manufacturing methods includes an n-channel thin film transistor including a semiconductor layer that has a crystalline region including a channel region, a source region and a drain region, a gate insulating film provided on the semiconductor layer, and a gate electrode, and a p-channel thin film transistor including a semiconductor layer that has a crystalline region and a gettering region, the crystalline region including a channel region, a source region and a drain region, a gate insulating film provided on the semiconductor layer, and a gate electrode, wherein the thickness of the gate insulating film on the gettering region of the p-channel thin film transistor is smaller than that on the source region and the drain region of the p-channel thin film transistor.

With these manufacturing methods, an n-channel TFT and a p-channel TFT can be formed together as in a CMOS circuit, wherein the n-type doping step and the p-type doping step for forming the respective source/drain regions are performed so that the gettering region is formed in these steps, thereby simplifying the manufacturing process. In the p-channel TFT, the p-type impurity itself does not function as a gettering element. Therefore, the n-type impurity to be the gettering element is implanted into the gettering region during the n-type doping step for forming the source/drain region of the n-channel TFT. The n-type impurity or the p-type impurity is implanted through the gate insulating film, which has been thinned in a region over the gettering region, whereby the concentration of the n-type impurity or the p-type impurity is increased in the gettering region, and the crystalline structure of that region is less likely to be destroyed. On the other hand, the source/drain regions over which the gate insulating film has a larger thickness are less damaged in the doping steps, whereby it is possible to reduce the resistance of these regions while maintaining the crystalline conditions thereof. Moreover, with the manufacturing methods described above, the source/drain region doped with the n-type impurity is used as a gettering region in the n-channel TFT and no gettering region is provided in the n-channel TFT, while the gettering region is provided only in the p-channel TFT.

Moreover, in the manufacturing methods as described above, the doping step may include an n-type doping step of doping a region of the island-shaped semiconductor layer of the n-channel thin film transistor where the source region, the drain region and the gettering region are formed and a region of the island-shaped semiconductor layer of the p-channel thin film transistor where the gettering region is formed, with an impurity element providing n-type conductivity, and a p-type doping step of, after the n-type doping step, doping a region of the island-shaped semiconductor layer of the p-channel thin film transistor where the source region, the drain region and the gettering region are formed and a region of the island-shaped semiconductor layer of the n-channel thin film transistor where the gettering region is formed, with an impurity element providing p-type conductivity.

Alternatively, the doping step may include a p-type doping step of doping a region of the island-shaped semiconductor layer of the p-channel thin film transistor where the source region, the drain region and the gettering region are formed and a region of the island-shaped semiconductor layer of the n-channel thin film transistor where the gettering region is formed, with an impurity element providing p-type conductivity, and an n-type doping step of, after the p-type doping step, doping a region of the island-shaped semiconductor layer of the n-channel thin film transistor where the source region, the drain region and the gettering region are formed and a region of the island-shaped semiconductor layer of the p-channel thin film transistor where the gettering region is formed, with an impurity element providing n-type conductivity.

A semiconductor device formed by these manufacturing methods includes an n-channel thin film transistor including a semiconductor layer that has a crystalline region and a gettering region, the crystalline region including a channel region, a source region and a drain region, a gate insulating film provided on the semiconductor layer, and a gate electrode, and a p-channel thin film transistor including a semiconductor layer that has a crystalline region and a gettering region, the crystalline region including a channel region, a source region and a drain region, a gate insulating film provided on the semiconductor layer, and a gate electrode, wherein the thickness of the gate insulating film on the gettering region is smaller than that on the source region and the drain region at least in the n-channel thin film transistor.

Alternatively, a semiconductor device formed by these manufacturing methods includes an n-channel thin film transistor including a semiconductor layer that has a crystalline region and a gettering region, the crystalline region including a channel region, a source region and a drain region, a gate insulating film provided on the semiconductor layer, and a gate electrode, and a p-channel thin film transistor including a semiconductor layer that has a crystalline region and a gettering region, the crystalline region including a channel region, a source region and a drain region, a gate insulating film provided on the semiconductor layer, and a gate electrode, wherein the thickness of the gate insulating film on the gettering region is smaller than that on the source region and the drain region at least in the p-channel thin film transistor.

With these manufacturing methods, an n-channel TFT and a p-channel TFT can be formed together, wherein the n-type doping step and the p-type doping step for forming the respective source/drain regions are performed so that the gettering region is formed in these steps not only in the p-channel TFT but also in the n-channel TFT, thereby simplifying the manufacturing process. Although the p-type impurity itself does not function as a gettering element, its presence together with the n-type impurity provides a strong gettering action. Therefore, by forming the gettering region doped with the n-type impurity and the p-type impurity also in the semiconductor layer of the n-channel TFT, the gettering capability of the n-channel TFT is further improved. Moreover, in the gettering region of the n-channel TFT, the overlying gate insulating film has been selectively thinned, whereby the region can be doped with a larger amount of the n-type impurity than the source/drain region, thus further increasing the gettering capability.

Where the gate insulating film is not selectively thinned as in the prior art, even if the gettering region is formed in the semiconductor layer of the TFT separately from the source/ drain region, a large amount of an n-type impurity will be implanted into the source/drain region as well as the gettering region in the step of doping the semiconductor layer with a large amount of an n-type impurity, which is a gettering element, for further increasing the gettering capability. A dose of an n-type impurity for forming a gettering region is excessive for a source/drain region, whereby such a dose of an n-type impurity does not reduce the resistance, but rather damages and amorphizes the source/drain region, significantly increasing the resistance thereof. This is similarly true with a p-type impurity. However, such an effect is more prominent with an n-type impurity, and a more serious problem may occur in an n-channel TFT. In preferred embodiments of the present invention, with the overlying gate insulating film having different thicknesses on the gettering region and on the source/drain region, these regions can be doped together in a single step while being given different properties suitable for the respective regions. Specifically, the gettering region on which the overlying gate insulating film is thinner is doped with a larger amount of the n-type impurity or the p-type impurity than the source/drain region, whereby the gettering region is more damaged and amorphized into an optimal condition as a gettering region, whereas the source/drain region on which the overlying gate insulating film is thicker is less damaged, whereby it is possible to reduce the resistance thereof while maintaining the crystalline conditions thereof.

Figure 19:
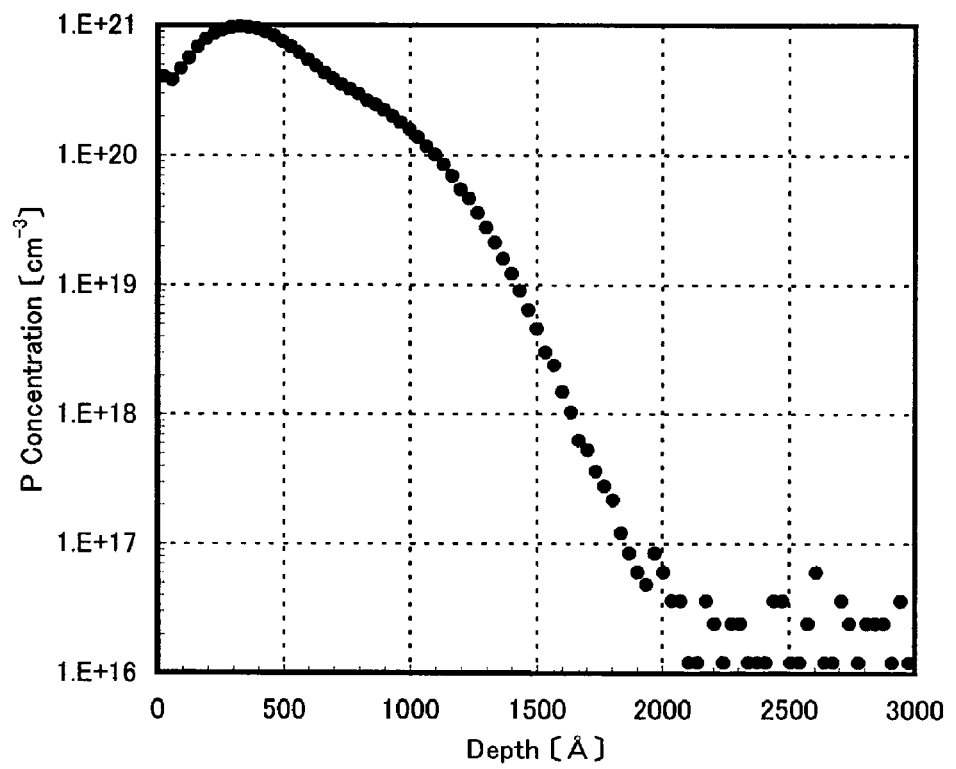
FIG. 19 is a graph illustrating a phosphorus doping profile.

FIG. 19 shows a concentration profile for an n-type impurity obtained with a doping apparatus used in an experiment by the present inventors. More specifically, FIG. 19 shows concentration profile data based on SIMS (Secondary Ion Mass Spectrometry) for an n-type impurity, phosphorus, implanted into a silicon oxide film, with respect to the thickness direction. The horizontal axis represents the depth from the upper surface of the silicon oxide film, "depth 0" being the uppermost point. The phosphorus concentration at a depth of, for example, about 500 Å (about 50 nm) is about 5 times as high as that at a depth of, for example, about 1000 Å (about 100 nm). Therefore, when phosphorus as an n-type impurity is implanted through a gate insulating film having a thickness of, for example, about 100 nm on the source/drain region and about 50 nm on the gettering region, for example, the phosphorus concentration of the gettering region is about 5 times as high as that of the source/drain region. In addition, in the gettering region, where the thickness of the overlying gate insulating film is reduced, phosphorus ions are implanted into the semiconductor layer with a higher acceleration voltage than in the source/drain region, where the gate insulating film is thick, and the ions collide with one another with higher collision energies, thereby further amorphizing the semiconductor layer by destroying the crystalline structure thereof in the gettering region. In contrast, in the source/drain region, where the gate insulating film has a larger thickness, the semiconductor layer is not excessively doped with phosphorus, and the ions collide with one another with lower collision energies so that the semiconductor layer is not amorphized and the crystalline structure thereof is maintained. Thus, the gettering region and the source/drain region can easily be formed together while being given different properties that are suitable for the respective regions.

In a manufacturing method according to one preferred embodiment of the present invention, the step of selectively thinning a portion of the gate insulating film that is located outside a region of at least one of the plurality of island-shaped semiconductor layers where a source region and a drain region are formed is performed by forming a mask on the source region and the drain region and etching the gate insulating film using the mask, which is used in a subsequent doping step. Thus, a mask used for selectively etching the gate insulating film is used as is in the doping step, whereby the step of thinning the gate insulating film on the gettering region, a characteristic step of preferred embodiments of the present invention, can be done without performing a separate photolithography step, thus simplifying the manufacturing process.

In one preferred embodiment of the present invention, the step of selectively thinning a portion of the gate insulating film that is located outside a region of at least one of the plurality of island-shaped semiconductor layers where a source region and a drain region are formed (i.e., a portion of the gate insulating film in a region to be the gettering region) is preferably performed between the n-type doping step and the p-type doping step. In such a case, the p-type doping step may be performed by forming a mask covering a region of each semiconductor layer that does not need to be doped with an impurity element providing p-type conductivity, and the following step of selectively thinning a portion of the gate insulating film may be performed by using the mask used in the p-type doping step.

Alternatively, the step of selectively thinning a portion of the gate insulating film that is located outside a region of at least one of the plurality of island-shaped semiconductor layers where a source region and a drain region are formed (i.e., a portion of the gate insulating film in a region to be the gettering region) is performed between the p-type doping step and the n-type doping step. In such a case, the n-type doping step may be performed by forming a mask covering a region of each semiconductor layer that does not need to be doped with an impurity element providing n-type conductivity, and the following step of selectively thinning a portion of the gate insulating film may be performed by using the mask used in the n-type doping step.

Thus, the step of selectively thinning the gate insulating film may be performed by using a doping mask that is used in the preceding n-type or p-type doping step, and the following p-type or n-type doping step may be performed through the selectively-thinned gate insulating film, thereby simplifying the manufacturing process. Moreover, the mask used in the p-type doping step or the n-type doping step may be removed in the step of selectively thinning a portion of the gate insulating film. Thus, the gate insulating film may be thinned while removing the doping mask, thereby further simplifying the manufacturing process. Therefore, the advantageous effects of preferred embodiments of the present invention can be obtained without adding any steps to the conventional processes. Specifically, a photoresist doping mask may be used in the doping step, and when removing (ashing) the resist using an oxygen plasma, an etching gas may be mixed with the atmosphere so as to thin the gate insulating film at the same time.

Another manufacturing method according to yet another preferred embodiment of the present invention includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers each including the crystalline region, a fourth step of forming a gate insulating film on the plurality of island-shaped semiconductor layers, a fifth step of forming a conductive film on the gate insulating film and shaping the conductive film to form a first gate electrode on the gate insulating film on the island-shaped semiconductor layer of the p-channel thin film transistor, a sixth step of doping the island-shaped semiconductor layer with an impurity element providing p-type conductivity using the first gate electrode as a mask so as to form a source region, a drain region and a gettering region for the p-channel thin film transistor, a seventh step of forming, on the conductive film, a mask that exposes a portion of the island-shaped semiconductor layer of the p-channel thin film transistor, covers the first gate electrode, and defines a second gate electrode for the n-channel thin film transistor, an eighth step of shaping the conductive film using the mask to form the second gate electrode for the n-channel thin film transistor, a ninth step of doping regions of the plurality of island-shaped semiconductor layers that are not covered with the mask or the gate electrodes, with an impurity element providing n-type conductivity, thereby forming the gettering region for the p-channel thin film transistor while forming a source region and a drain region of the n-channel thin film transistor, and a tenth step of performing a second heat treatment so as to move at least a portion of the catalyst element in the island-shaped semiconductor layer of the p-channel thin film transistor to the gettering region thereof and at least a portion of the catalyst element in the island-shaped semiconductor layer of the n-channel thin film transistor to the source region and the drain region thereof, wherein a step of thinning a portion of the gate insulating film on the gettering region of the island-shaped semiconductor layer of the p-channel thin film transistor is performed at least once at any point in time between after the seventh step and after the eighth step.

The step of thinning a portion of the gate insulating film on the gettering region of the island-shaped semiconductor layer of the p-channel thin film transistor is preferably performed simultaneously with the eighth step using the mask that exposes a portion of the island-shaped semiconductor layer of the p-channel thin film transistor so as to selectively thin a portion of the gate insulating film in the region where it is exposed on the island-shaped semiconductor layer of the p-channel thin film transistor.

With such a manufacturing method, it is possible to produce a semiconductor device according to preferred embodiments of the present invention, thereby solving the problems in the prior art and achieving the advantages of the present invention as set forth above. Moreover, with this manufacturing method, the mask used in the doping step and the step of thinning the gate insulating film is preferably formed by using the step of forming the gate electrode, thereby further eliminating the need for a photolithography step. As a result, it is possible to simplify the manufacturing process, reduce the manufacturing cost of the semiconductor device, and improve the production yield.

Some of the steps of the manufacturing method may be switched around as follows to obtain similar effects. Specifically, a manufacturing method according to another preferred embodiment of the present invention includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers each including the crystalline region, a fourth step of forming a gate insulating film on the plurality of island-shaped semiconductor layers, a fifth step of forming a first gate electrode on the gate insulating film on the island-shaped semiconductor layer of the n-channel thin film transistor, and forming a second gate electrode conductive layer on the gate insulating film on the island-shaped semiconductor layer of the p-channel thin film transistor, a sixth step of doping the island-shaped semiconductor layers with an impurity element providing n-type conductivity using the first gate electrode and the second gate electrode conductive layer as a mask so as to form a source region and a drain region for the n-channel thin film transistor while forming a gettering region for the p-channel thin film transistor, a seventh step of forming a mask that covers the island-shaped semiconductor layer of the n-channel thin film transistor and forming, on the second gate electrode conductive layer, a mask that defines a second gate electrode for the p-channel thin film transistor, an eighth step of shaping the second gate electrode conductive layer using the mask to form the second gate electrode, a ninth step of doping regions of the plurality of island-shaped semiconductor layers that are not covered with the mask or the second gate electrode, with an impurity element providing p-type conductivity, thereby forming a source region, a drain region and a gettering region of the p-channel thin film transistor, and a tenth step of performing a second heat treatment so as to move at least a portion of the catalyst element in the island-shaped semiconductor layer of the p-channel thin film transistor to the gettering region thereof and at least a portion of the catalyst element in the island-shaped semiconductor layer of the n-channel thin film transistor to the source region and the drain region thereof, wherein a step of thinning a portion of the gate insulating film on the gettering region of the island-shaped semiconductor layer of the p-channel thin film transistor is performed at least once at any point in time between after the fifth step and after the eighth step.

It is preferred that the step of thinning a portion of the gate insulating film on the gettering region of the island-shaped semiconductor layer of the p-channel thin film transistor is performed simultaneously with the eighth step by thinning a portion of the gate insulating film on the island-shaped semiconductor layer of the p-channel thin film transistor that is not masked with the first gate electrode. In this way, it is possible to simplify the manufacturing process while achieving the advantages of the present invention as set forth above.

In this manufacturing method, a gettering region may be provided also in the n-channel thin film transistor as follows to obtain similar effects. Specifically, a manufacturing method according to a further preferred embodiment of the present invention includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers each including the crystalline region, a fourth step of forming a gate insulating film on the plurality of island-shaped semiconductor layers, a fifth step of forming a first gate electrode on the gate insulating film on the island-shaped semiconductor layer of the p-channel thin film transistor, and forming a second gate electrode conductive layer on the gate insulating film on the island-shaped semiconductor layer of the n-channel thin film transistor, a sixth step of doping the island-shaped semiconductor layers with an impurity element providing p-type conductivity using the first gate electrode and the second gate electrode conductive layer as a mask so as to form a source region, a drain region and a gettering region for the p-channel thin film transistor while forming a gettering region for the n-channel thin film transistor, a seventh step of forming a mask that exposes a portion of the island-shaped semiconductor layer of the p-channel thin film transistor so as to cover the first gate electrode and forming, on the second gate electrode conductive layer, a mask that defines a second gate electrode for the n-channel thin film transistor, an eighth step of shaping the second gate electrode conductive layer using the mask to form the second gate electrode, a ninth step of doping regions of the plurality of island-shaped semiconductor layers that are not covered with the mask or the second gate electrode, with an impurity element providing n-type conductivity, thereby forming an amorphized gettering region for the p-channel thin film transistor, while forming a source region, a drain region and the gettering region of the n-channel thin film transistor, and a tenth step of performing a second heat treatment so as to move at least a portion of the catalyst element in the island-shaped semiconductor layers to the gettering regions, wherein a step of thinning a portion of the gate insulating film on the gettering region of the island-shaped semiconductor layer of the n-channel thin film transistor and/or the p-channel thin film transistor is performed at least once at any point in time between after the fifth step and after the eighth step. In this way, a dedicated gettering region is provided for the n-channel thin film transistor, thereby providing a high gettering capability.

The step of thinning a portion of the gate insulating film on the gettering region of the island-shaped semiconductor layer of the n-channel thin film transistor and the p-channel thin film transistor may be performed simultaneously with the eighth step by thinning a portion of the gate insulating film on the island-shaped semiconductor layer of the n-channel thin film transistor that is not covered with the second gate electrode and thinning a portion of the gate insulating film on the island-shaped semiconductor layer of the p-channel thin film transistor that is not covered with the mask formed on the island-shaped semiconductor layer. In this way, it is possible to simplify the manufacturing process while achieving the advantages of the present invention as set forth above.

Some of the steps of the manufacturing method may be switched around as follows to obtain similar effects. Specifically, a manufacturing method according to an additional preferred embodiment of the present invention includes a first step of providing an amorphous semiconductor film including a catalyst element in at least a portion thereof, the catalyst element being capable of promoting crystallization of the amorphous semiconductor film, a second step of performing a first heat treatment on the amorphous semiconductor film so as to crystallize at least a portion of the amorphous semiconductor film, thereby obtaining a semiconductor film including a crystalline region, a third step of patterning the semiconductor film to form a plurality of island-shaped semiconductor layers each including the crystalline region, a fourth step of forming a gate insulating film on the plurality of island-shaped semiconductor layers, a fifth step of forming a first gate electrode on the gate insulating film on the island-shaped semiconductor layer of the n-channel thin film transistor, and forming a second gate electrode conductive layer on the gate insulating film on the island-shaped semiconductor layer of the p-channel thin film transistor, a sixth step of doping the island-shaped semiconductor layers with an impurity element providing n-type conductivity using the first gate electrode and the second gate electrode conductive layer as a mask so as to form a source region, a drain region and a gettering region for the n-channel thin film transistor while forming a gettering region for the p-channel thin film transistor, a seventh step of forming a mask that exposes a portion of the island-shaped semiconductor layer of the n-channel thin film transistor so as to cover the first gate electrode and forming, on the second gate electrode conductive layer, a mask that defines a second gate electrode for the p-channel thin film transistor, an eighth step of shaping the second gate electrode conductive layer using the mask to form the second gate electrode, a ninth step of doping regions of the plurality of island-shaped semiconductor layers that are not covered with the mask or the second gate electrode, with an impurity element providing p-type conductivity, thereby forming an amorphized gettering region for the n-channel thin film transistor, while forming a source region, a drain region and the gettering region of the p-channel thin film transistor, and a tenth step of performing a second heat treatment so as to move at least a portion of the catalyst element in the island-shaped semiconductor layers to the gettering regions, wherein a step of thinning a portion of the gate insulating film on the gettering region of the island-shaped semiconductor layer of the n-channel thin film transistor and/or the p-channel thin film transistor is performed at least once at any point in time between after the fifth step and after the eighth step.

The step of thinning a portion of the gate insulating film on the gettering region of the island-shaped semiconductor layer of the n-channel thin film transistor and the p-channel thin film transistor may be performed simultaneously with the eighth step by thinning a portion of the gate insulating film on the island-shaped semiconductor layer of the n-channel thin film transistor that is not covered with the mask formed on the island-shaped semiconductor layer and thinning a portion of the gate insulating film on the island-shaped semiconductor layer of the p-channel thin film transistor that is not covered with the second gate electrode conductive layer. In this way, it is possible to simplify the manufacturing process while achieving the advantages of the present invention as set forth above.

In these methods where a gate electrode or a gate electrode conductive layer is used as a mask, the second gate electrode conductive layer is preferably formed to have a width larger than that of the second gate electrode. In this way, the mask used in the doping step or the step of thinning the gate insulating film can be formed in the gate electrode formation step.

Moreover, in the manufacturing method of various preferred embodiments of the present invention, the second heat treatment is preferably performed so as to activate the n-type impurity and/or the p-type impurity implanted into at least the source region and the drain region of the island-shaped semiconductor layer. Thus, a gettering process and an impurity activation process are performed together in the second heat treatment step, thereby shortening the manufacturing process and eliminating the need for an additional gettering step, which has been a problem in the prior art. As a result, it is possible to simplify the manufacturing process and reduce the manufacturing cost.

Moreover, in the semiconductor device of the present invention, the material of the gate electrode is one or more element or alloy thereof selected from W, Ta, Ti and Mo. This is for the following reason. In the present invention, the second heat treatment for gettering needs to be performed after the formation of the gate electrode. This heat treatment needs to be performed at a temperature of, for example, about 500° C. or more. Therefore, it is preferred in view of the heat resistance that the material of the gate electrode is a high-melting metal. Thus, the gate electrode of the semiconductor device of various preferred embodiments of the present invention is preferably one or more element or alloy thereof selected from W, Ta, Ti and Mo.

In a manufacturing method according to yet another preferred embodiment of the present invention, the (first) step of providing an amorphous semiconductor film preferably includes the steps of forming a mask having an opening therein on the amorphous semiconductor film, and doping a selected region of the amorphous semiconductor film with the catalyst element through the opening. In this way, a portion of the amorphous semiconductor film is selectively doped with a catalyst element so that the crystal growth proceeds in the first heat treatment laterally starting from the portion where the catalyst element is added, thereby forming a crystalline semiconductor film. In this way, it is possible to obtain a desirable crystalline semiconductor film with a substantially uniform crystal growth direction, whereby it is possible to further increase the current driving power of a TFT. Moreover, in the laterally-grown crystal region, the catalyst element concentration after the crystal growth can be reduced by one to two orders of magnitude from that in the region where the catalyst element is added, thereby reducing the load for the subsequent gettering process.

How such a crystalline film with a substantially uniform crystal growth direction is obtained by the method as described above will now be described with reference to FIG. 20A to FIG. 20C.

In the crystalline semiconductor film of various preferred embodiments of the present invention (which is used at least for the formation of the channel region), the orientated crystal planes are primarily planes of <111> crystal zone. More specifically, among all the <111> crystal zone planes, the (110) plane orientation and the (211) plane orientation account for about 50% or more in the crystalline semiconductor film. Typically, when crystallized without a catalyst element, a crystalline semiconductor film is likely to be oriented along the (111) plane, due to the influence of the insulator base film underlying the semiconductor film (particularly in the case of amorphous silicon dioxide). In contrast, when an amorphous semiconductor film is crystallized with the addition of a catalyst element, the orientated crystal planes of the obtained crystalline semiconductor film are primarily planes of <111> crystal zone, which is schematically shown in FIG. 20A. In FIG. 20A, reference numeral 281 is a base insulator, 282 is an amorphous semiconductor film in an uncrystallized region, 283 is a crystalline semiconductor film, and 284 is a semiconductor compound of a catalyst element, which is the driving force of the crystal growth.

Figure 20A:
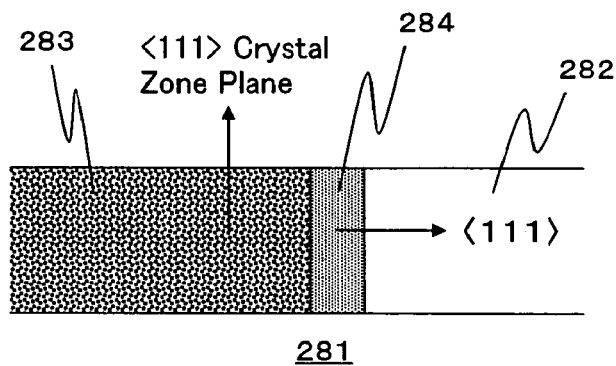
FIG. 20A to FIG. 20C are diagrams illustrating the crystal orientation of the crystalline semiconductor film obtained by various preferred embodiments of the present invention.

As illustrated in FIG. 20A, a catalyst element compound 284 is present at the front line of crystal growth and gradually crystallizes the amorphous region 282 from left to right in the figure. In this process, the catalyst element compound 284 tends to grow strongly in the <111> direction. As a result, the obtained crystalline semiconductor film is oriented in the <111> crystal zone planes, as illustrated in FIG. 20A.

Figure 20B:
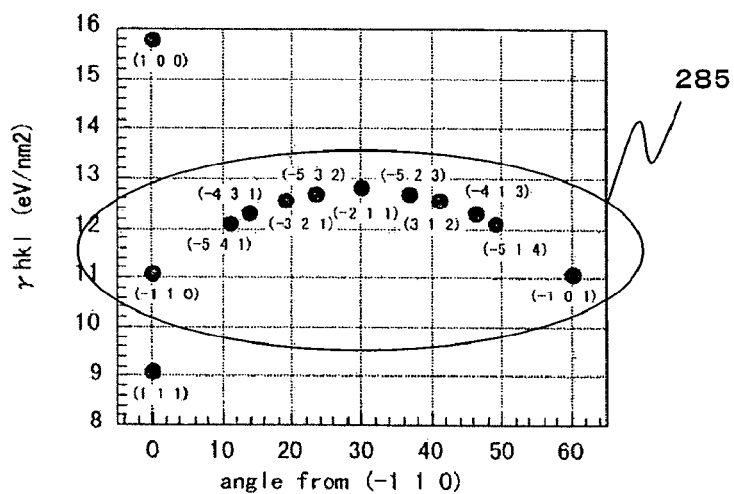

FIG. 20B illustrates the <111> crystal zone planes. In FIG. 20B, the horizontal axis represents the inclination angle with respect to the (–110) plane, and the vertical axis represents the surface energy. Reference numeral 285 denotes a group of crystal planes that are <111> crystal zone planes. The (100) plane and the (111) plane are shown for the purpose of comparison, although they are not <111> crystal zone planes.

Figure 20C:
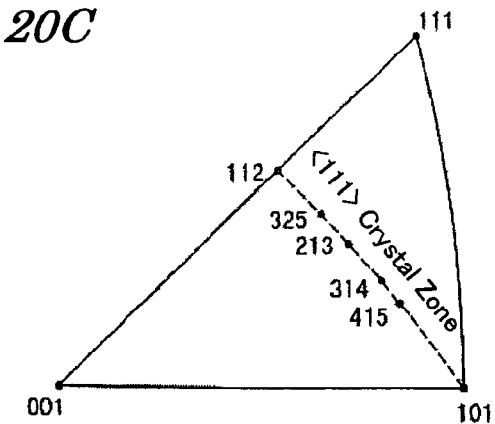

Moreover, FIG. 20C illustrates a standard triangle of crystal orientation. The distribution of the <111> crystal zone planes is as indicated by a broken line. The indices of typical poles are shown numerically. Among all the <111> crystal zone planes, the (110) plane or the (211) plane is dominant in the crystalline semiconductor film obtained in various preferred embodiments of the present invention, and advantageous effects are obtained when these planes account for approximately 50% or more. These two crystal planes, having much higher hole mobilities than other planes, are capable of improving the performance of particularly a p-channel TFT, which is inferior in performance to an n-channel TFT, thereby also providing an advantage that it is easy to produce a well-balanced semiconductor circuit.

Note that it was confirmed by, for example, EBSP (Electron BackScattered diffraction Pattern) that the crystal grains (domains) of the crystalline semiconductor film of various preferred embodiments of the present invention had such characteristics as described above.

Moreover, in the manufacturing method of preferred embodiments of the present invention, one or more element selected from Ni, Co, Sn, Pb, Pd, Fe and Cu is preferably used as the catalyst element. One or more element selected from among these elements can provide a crystallization promoting effect even in very small amounts. Particularly, Ni can provide the most significant effect. The reason for this may be as follows. The catalyst element alone does not provide the function, but it promotes crystal growth when bound to silicon in the silicon film to form a silicide. When crystallizing the amorphous silicon film, the crystalline structure of the silicide functions as a type of a mold, thereby promoting the crystallization of the amorphous silicon film. An Ni atom binds to two Si atoms to form a silicide, $NiSi_2$. $NiSi_2$ exhibits a fluorite-like crystalline structure, which is very similar to that of diamond made of monocrystalline silicon. Moreover, the lattice constant of $NiSi_2$ is about 5.406 Å (about 0.5406 nm), which is very close to that of a crystalline silicon diamond structure, i.e., about 5.430 Å (about 0.5430 nm). Thus, $NiSi_2$ is an optimal mold for crystallizing the amorphous silicon film, and Ni is most preferably used as the catalyst element in preferred embodiments of the present invention.

In a semiconductor device of a preferred embodiment of the present invention produced by using such a catalyst element, one or more elements selected from Ni, Co, Sn, Pb, Pd, Fe and Cu is present in the gettering region as the catalyst element for promoting crystallization of the amorphous semiconductor film. In such a case, the catalyst element for promoting crystallization of the amorphous semiconductor film is present in the gettering region with a concentration of, for example, about $1\times10^{19}$ atoms/cm$^3$ or more. The catalyst element concentration in the channel region is reduced to, for example, about $1\times10^{15}$ atoms/cm$^3$ to about $1\times10^{17}$ atoms/cm$^3$, whereas the catalyst element concentration in the gettering region is increased by approximately two to four orders of magnitude.

Moreover, the manufacturing method of a preferred embodiment of the present invention further includes, after the first heat treatment, a step of irradiating the crystalline semiconductor film with laser light. When the crystalline semiconductor film obtained in this preferred embodiment of the present invention is irradiated with laser light, crystal grain boundary portions and minute residual amorphous regions (uncrystallized regions) are treated in a concentrated manner due to the difference in melting point between a crystalline region and an amorphous region. A crystalline silicon film that has been crystallized while introducing a catalyst element thereto is in the form of columnar crystals, with the inside thereof being monocrystalline. Therefore, if the crystal grain boundary portions are treated with laser light irradiation, the crystallinity is improved significantly, obtaining a desirable crystalline semiconductor film that is substantially monocrystalline across the entire surface of the substrate. As a result, the TFT on-state characteristics are improved significantly, thereby realizing a semiconductor device having an improved current driving power.

First Preferred Embodiment

The first preferred embodiment of the present invention will now be described with reference to FIG. 1A to FIG. 1H. The first preferred embodiment is directed to a method for producing an n-channel TFT on a glass substrate. FIG. 1A to FIG. 1H are cross-sectional views sequentially illustrating steps for producing the n-channel TFT.

Referring to FIG. 1A, a low-alkali glass substrate or a quartz substrate may be preferably used as a substrate 101. A low-alkali glass substrate was used in the present preferred embodiment. In such a case, the substrate may be subjected to a pre-heat treatment at a temperature that is lower than the glass deformation point by about 10° C. to about 20° C. A base film such as a silicon oxide film, a silicon nitride film or a silicon oxide nitride film is formed on the TFT side of the substrate 101 for preventing the diffusion of an impurity from the substrate 101. In the present preferred embodiment, a silicon oxide nitride film was deposited, as a lower first base film 102, by a plasma CVD method using material gases of $SiH_4$, $NH_3$ and $N_2O$, and a second base film 103 was deposited on the first base film 102 similarly by a plasma CVD method using material gases of $SiH_4$ and $N_2O$. The thickness of the silicon oxide nitride film of the first base film 102 was, for example, about 25 nm to about 200 nm (e.g., about 100 nm), and the thickness of the silicon oxide film of the second base film 103 was, for example, about 25 nm to about 300 nm (e.g., about 100 nm). While a two-layer base film is used in the present preferred embodiment, a single-layer silicon oxide film, for example, may alternatively be used.

Then, an amorphous silicon film (a-Si film) 104 having a thickness of, for example, about 20 nm to about 150 nm (preferably about 30 nm to about 80 nm) is formed by a known method such as a plasma CVD method or a sputtering method. In the present preferred embodiment, an amorphous silicon film was formed to a thickness of, for example, about 50 nm by a plasma CVD method. Since the base films 102 and 103 and the amorphous silicon film 104 can be formed by the same deposition method, they may alternatively be formed successively. By not exposing the base films to the atmosphere after they are formed, it is possible to prevent the contamination of the surface of the base films, thereby reducing the characteristics variations among TFTs produced and the fluctuations in the threshold voltage.

Then, a catalyst element is added to the a-Si film 104, and a heat treatment is performed. An aqueous solution (aqueous nickel acetate solution) including, for example, approximately 10 ppm by weight of catalyst element (nickel in the present preferred embodiment) is applied on the a-Si film by a spin coating method, thereby forming a catalyst-element-containing layer 105. Other than nickel (Ni), the catalyst element used in the present preferred embodiment may be one or more element selected from iron (Fe), cobalt (Co), tin (Sn), lead (Pb), palladium (Pd) and copper (Cu). Moreover, ruthenium (Ru), rhodium (Rh), osmium (Os), iridium (Ir), platinum (Pt), gold (Au), or other suitable material, also function as a catalyst element, although these elements have less catalytic effects. The dose of the catalyst element is very small, and the catalyst element concentration on the surface of the a-Si film 104 is controlled by a total reflection X-ray fluorescence (TRXRF) method. In the present preferred embodiment, the concentration is preferably about $7\times10^{12}$ atoms/cm$^2$.

Note that while nickel is added by a spin coating method in the present preferred embodiment, a thin film of a catalyst element (nickel film in the present preferred embodiment) may alternatively be formed on the a-Si film 104 by a vapor deposition method, a sputtering method, or other suitable process.

Then, a heat treatment is performed in an inert atmosphere (e.g., a nitrogen atmosphere). The heat treatment is preferably performed at about 550° C. to about 600° C. for approximately 30 minutes to 4 hours. In the present preferred embodiment, the heat treatment was performed at about 580° C. for approximately 1 hour. In this heat treatment, nickel 105 added to the surface of the a-Si film 104 diffuses into the a-Si film 104 while being silicified, and the crystallization of the a-Si film 104 proceeds using the silicide as nuclei. As a result, the a-Si film 104 is crystallized into a crystalline silicon film 104a. Note that while the crystallization process is herein performed in a heat treatment using a furnace, it may alternatively be performed by an RTA (Rapid Thermal Annealing) apparatus using a lamp, or other suitable device, as a heat source.

Then, as illustrated in FIG. 1B, the crystalline silicon film 104a obtained by the heat treatment is irradiated with laser light 106 to further crystallize the crystalline silicon film 104a, thereby obtaining a crystalline silicon film 104b with an improved crystallinity. The laser light used in this step may be XeCl excimer laser (wavelength: 308 nm, pulse width: 40 nsec) or KrF excimer laser (wavelength: 248 nm). The laser light is shaped so as to form an elongated beam spot on the surface of the substrate 101 so that the substrate is crystallized across the entire surface thereof by being scanned with the laser beam in the direction that is substantially perpendicular to the longitudinal direction of the beam spot. The substrate surface is preferably scanned so that adjacent beam traces have an overlap therebetween and any point on the surface of the crystalline silicon film 104a is scanned with laser light a plurality of times, thereby improving the uniformity. The crystalline silicon film 104a obtained by solid-phase crystallization as described above is turned into the crystalline silicon film 104b of a higher quality as the crystal defects are reduced through the melting/solidification process by the laser irradiation.

Then, a device isolation process is performed by removing unnecessary portions of the crystalline silicon film 104b. Through these steps, an island-shaped crystalline silicon film (semiconductor layer) 107 is formed, as illustrated in FIG. 1C, which is to be the active region (the source/drain region and the channel region) of the TFT. Then, a gate insulating film 108 is formed to cover the island-shaped crystalline silicon film 107. The gate insulating film 108 is preferably a silicon oxide film having a thickness of, for example, about 20 nm to about 150 nm. In the present preferred embodiment, a silicon oxide film having a thickness of about 100 nm was used.

Then, a conductive film was deposited on the gate insulating film 108 by a sputtering method or a CVD method, and patterned to form a gate electrode 109. The material of the conductive film may be any one of W, Ta, Ti and Mo, which are high-melting metals, or an alloy material thereof. The thickness of the conductive film is, for example, preferably about 300 nm to about 600 nm. In the present preferred embodiment, the conductive film was a Ta film having a thickness of, for example, about 450 nm to which a small amount of nitrogen is added.

Then, as illustrated in FIG. 1D, a high concentration of an n-type impurity (phosphorus) 110 is implanted into the semiconductor layer 107 by an ion doping method using the gate electrode 109 as a mask. Through this step, a high concentration of phosphorus 110 is implanted into a region 112 of the semiconductor layer 107 of the TFT that is not covered with the gate electrode 109. In this step, a region 111 that is masked with the gate electrode 109 and is not doped with phosphorus 110 will later be the channel region of the TFT.

As illustrated in FIG. 1E, a resist mask 113 is formed on the gate insulating film 108 so as to cover the gate electrode 109. Then, the gate insulating film 108 is etched by using the mask 113, thereby forming a selectively-etched gate insulating film 114. The mask 113 and the gate insulating film 114 cover the semiconductor layer 107 of the TFT, with a portion (peripheral portion) of the semiconductor layer 107 being exposed.

Then, the entire surface of the substrate 101 is ion-doped with a rare gas element (Ar in the present embodiment) 115 from above the substrate 101. Through this step, the rare gas element 115 is implanted into an exposed region of the active region of the TFT, thereby forming a gettering region 117. The other regions that are covered with the mask 113 and the gate insulating film 114 are not doped with the rare gas element, and will later be source and drain regions 116 of the TFT. The rare gas element may be one or more rare gas element selected from Ar, Kr and Xe. Moreover, in this step, the concentration of the rare gas element in the gettering region 117 is controlled to be, for example, about $1\times10^{19}$ atoms/cm$^3$ to about $3\times10^{21}$ atoms/cm$^3$. Moreover, in this step, the gettering region 117, over which the gate insulating film is absent, is heavily doped, whereby the crystalline structure thereof is completely destroyed and the gate electrode 117 is amorphized. This state is shown in FIG. 1F.

Then, after the resist 113 used as a mask in the previous step is removed, a heat treatment is performed in an inert atmosphere (e.g., a nitrogen atmosphere). In this heat treatment step, crystal defects created in the gettering region 117, which is formed outside the source/drain region 116, through the amorphization in the doping process and argon 115 implanted at a high concentration into the gettering region 117 move nickel present in the channel region 111 and the source/drain region 116 from the channel region to the source/drain region and to the gettering region 117 as indicated by arrow 118 in FIG. 1G. Thus, the catalyst element remaining in the channel region or the junction between the channel region and the source or drain region of the semiconductor layer of the TFT can be gettered, thereby suppressing a leak current due to the segregation of the catalyst element.

Moreover, since the gettering region is provided in a portion of the active region of the TFT outside the source region or the drain region, it is possible to avoid the problem that the resistance of the source region or the drain region of the TFT is increased by the amorphization of the gettering region. Note that since the catalyst element moves into the gettering region in the heat treatment step, the concentration of the catalyst element in the gettering region is, for example, approximately $1\times10^{19}$/cm$^3$ or more.

While a common heating furnace can be used for the heat treatment, an RTA (Rapid Thermal Annealing) apparatus is preferably used. A preferred RTA apparatus is a type of an RTA apparatus that is capable of rapidly increasing and decreasing the temperature by blowing a high-temperature inert gas onto the surface of the substrate. Preferably, the heat treatment is performed for about 30 seconds to about 10 minutes while holding the temperature at about 550° C. to about 750° C. The temperature-increasing rate and the temperature-decreasing rate are preferably about 100° C./min or more. Note that this heat treatment step also activates the n-type impurity (phosphorus) 110 doped into the source/drain region 116, whereby the sheet resistance value of the source/drain region 116 is reduced to about 1 kΩ/square or less. However, the gettering region 117 is left with its amorphous component. After this step, the ratio Pa/Pc between the TO-phonon peak Pa of amorphous Si and the TO-phonon peak Pc of crystalline Si in the Raman spectrum as measured by laser Raman spectroscopy is larger in the gettering region 117 than in the channel region 111 or the source/drain region 116. In a case where a light-transmissive glass substrate is used, as in the present preferred embodiment, this measurement can be performed from the bottom surface of the substrate. Moreover, this condition is maintained even after the completion of the TFT because no high-temperature step is performed after this heat treatment step.

Then, as illustrated in FIG. 1H, a silicon oxide film or a silicon nitride film is formed as an interlayer insulating film 119 with contact holes therein, and an electrode/line 120 of the TFT is formed by using a metal material.

Finally, an annealing process is performed for about 1 hour at about 350° C. in a nitrogen atmosphere or a hydrogen-mixed atmosphere at approximately 1 atm, thereby obtaining a TFT 121 as illustrated in FIG. 1H. As necessary, a protection film made of silicon nitride, or the like, may be further provided on the TFT 121 for the purpose of protecting the TFT 121.

Second Preferred Embodiment

The second preferred embodiment of the present invention will now be described with reference to FIG. 2A to FIG. 2H. The present preferred embodiment is directed to a method for producing an n-channel TFT on a glass substrate that is different from the method of the first preferred embodiment. The TFT of the present preferred embodiment can be used not only in a driver circuit or a pixel section of an active matrix liquid crystal display device or an organic EL display device, but also as an element in a thin film integrated circuit. FIG. 2A to FIG. 2H are cross-sectional views sequentially illustrating steps for producing the n-channel TFT.

First, as illustrated in FIG. 2A, a base film such as a silicon oxide film, a silicon nitride film or a silicon oxide nitride film is formed on a glass substrate 201 by a plasma CVD method, for example. The base film is provided for preventing the diffusion of an impurity from the substrate 201. In the present preferred embodiment, a silicon oxide nitride film having a thickness of, for example, about 50 nm was deposited, as a lower first base film 202, using material gases of SiH$_4$, NH$_3$ and N$_2$O, and a second base film 203 having a thickness of, for example, about 100 nm was deposited on the first base film 202 using material gases of SiH$_4$ and N$_2$O. Then, an intrinsic (I type) amorphous silicon film (a-Si film) 204 having a thickness of, for example, about 20 nm to about 80 nm (e.g., about 40 nm) is deposited by a plasma CVD method, or other suitable process.

Then, a small amount of nickel 205 is added to the surface of the a-Si film 204. The addition of a small amount of nickel 205 was performed by holding a nickel solution on the a-Si film 204, uniformly spreading the solution across the substrate 201 by a spinner, and then drying the substrate 201. In the present preferred embodiment, nickel acetate was used as the solute, water was used as the solvent, and the nickel concentration in the solution was controlled to be about 8 ppm. This state is shown in FIG. 2A. The dose of the catalyst element is very small, and the catalyst element concentration on the surface of the a-Si film 204 is controlled by a total reflection X-ray fluorescence (TRXRF) method. In the present preferred embodiment, the concentration was, for example, about $5\times10^{12}$ atoms/cm$^2$. Note that prior to this step, the surface of the a-Si film 204 may be slightly oxidized with ozone water, or suitable material, so as to improve the wettability of the surface of the a-Si film 204 in the spin application.

Then, a first heat treatment is performed in an inert atmosphere (e.g., a nitrogen atmosphere). The annealing process is performed at about 530° C. to about 600° C. for about 30 minutes to about 8 hours. For example, in the present preferred embodiment, the heat treatment was performed at about 550° C. for about 4 hours. In this heat treatment, nickel 205 added to the surface of the a-Si film 204 diffuses into the a-Si film 204 while being silicified, and the crystallization of the a-Si film 204 proceeds using the silicide as nuclei. As a result, the a-Si film 204 is crystallized into a crystalline silicon film 204a. Note that while the crystallization process is herein performed in a heat treatment using a furnace, it may alternatively be performed by an RTA (Rapid Thermal Annealing) apparatus using a lamp, or other suitable device, as a heat source. In the obtained crystalline silicon film 204a, the orientated crystal planes are primarily planes of <111> crystal zone, and approximately 50% or more of the regions that are oriented along the <111> crystal zone planes are regions that are oriented along the (110) plane or the (211) plane. Moreover, the crystal domains (regions each having a substantially uniform orientation) of the obtained crystalline silicon film 204a have domain diameters of, for example, about 2 μm to about 10 μm.

Figure 2B:
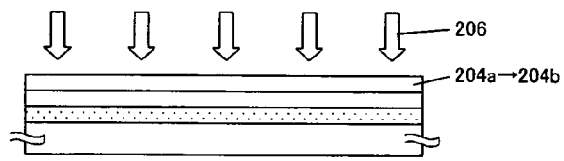

Then, as illustrated in FIG. 2B, the crystalline silicon film 204a obtained by the heat treatment is irradiated with laser light 207 to further crystallize the crystalline silicon film 204a, thereby obtaining a crystalline silicon film 204b with an improved crystallinity. The laser light used in this step may be XeCl excimer laser (wavelength: 308 nm, pulse width: 40 nsec) or KrF excimer laser (wavelength: 248 nm). The laser light is shaped so as to form an elongated beam spot on the surface of the substrate 201 so that the substrate is crystallized across the entire surface thereof by being scanned with the laser beam in the direction that is perpendicular to the longitudinal direction of the beam spot. The substrate surface is preferably scanned so that adjacent beam traces have an overlap therebetween and any point on the surface of the crystalline silicon film 204a is scanned with laser light a plurality of times, thereby improving the uniformity. In the present preferred embodiment, the laser light irradiation step was performed with an energy density of about 300 mJ/cm$^2$ to about 500 mJ/cm$^2$ (e.g., 420 mJ/cm$^2$). Moreover, in the present preferred embodiment, the laser light was shaped so as to form an elongated beam spot having a size of, for example, about 150 mm by about 1 mm on the surface of the substrate 201, and the substrate 201 was scanned in the direction that is substantially perpendicular to the longitudinal direction of the beam spot and in a line sequential manner with a step width of about 0.05 mm. Thus, any point on the crystalline silicon film 204a is irradiated with laser light a total of 20 times. The laser light energy should be set in an appropriate range because the crystallinity improving effect may be insufficient when the energy is too low and the crystalline state of the crystalline silicon film 204a obtained in the previous step may be reset when it is too high. The crystalline silicon film 204a obtained by solid-phase crystallization as described above is turned into the crystalline silicon film 204b of a higher quality as the crystal defects are reduced through the melting/solidification process by the laser irradiation. After the laser irradiation process, the crystal orientation and the crystal domains of the obtained crystalline silicon film 204b remain to be those of the crystalline silicon film 204a before the laser irradiation, with no substantial change being observed by EBSP. However, ridges have been formed on the surface of the crystalline silicon film 204b with an average surface roughness Ra of, for example, about 4 nm to about 9 nm.

Figure 2C:
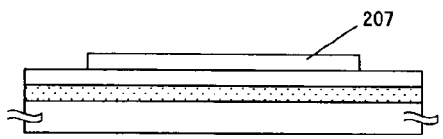

Then, a device isolation process is performed by removing unnecessary portions of the crystalline silicon film 204b. Through these steps, an island-shaped crystalline silicon film (semiconductor layer) 207 is formed, as illustrated in FIG. 2C, which is to be the active region (the source/drain region and the channel region) of the TFT.

Then, a silicon oxide film having a thickness of, for example, about 20 nm to about 150 nm (about 100 nm in the present preferred embodiment) is deposited, as a gate insulating film 208, so as to cover the semiconductor layer 207 to be the active region. The silicon oxide film was formed by decomposing and depositing TEOS (Tetra Ethoxy Ortho Silicate) by an RF plasma CVD method with oxygen at a substrate temperature of about 150° C. to about 600° C. (preferably about 300° C. to about 450° C.). Alternatively, the silicon oxide film may be formed by a low-pressure CVD method or an atmospheric pressure CVD method using TEOS with an ozone gas at a substrate temperature of about 350° C. to about 600° C. (preferably about 400° C. to about 550° C.). After the deposition process, an annealing process may be performed in an inert gas atmosphere at about 500° C. to about 600° C. for approximately 1 to 4 hours in order to improve the bulk properties of the gate insulating film itself and the characteristics of the interface between the crystalline silicon film and the gate insulating film.

Then, a high-melting metal is deposited by a sputtering method to a thickness of about 300 nm to about 600 nm. In the present preferred embodiment, tungsten (W) was deposited to a thickness of about 300 nm to about 600 nm (e.g., about 450 nm). Then, the tungsten film is patterned to form a gate electrode 209.

Figure 2D:
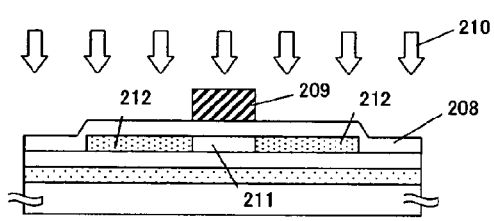

Then, as illustrated in FIG. 2D, a low concentration of an impurity (phosphorus) 210 is implanted into the active region by an ion doping method using the gate electrode 209 as a mask. Phosphine ($PH_3$) is used as the doping gas, the acceleration voltage is preferably set to, for example, about 60 kV to about 90 kV (e.g., about 70 kV), and the dose is preferably set to, for example, about $1 \times 10^{12}$ cm$^{-2}$ to about $1 \times 10^{14}$ cm$^{-2}$ (e.g., about $8 \times 10^{12}$ cm$^{-2}$). Through this step, a region 212 of the semiconductor layer 207 that is not covered with the gate electrode 209 is doped with a low concentration of phosphorus 210, and a region 211 that is masked with the gate electrode 209 and is not doped with phosphorus 210 will later be the channel region of the TFT.

Figure 2E:
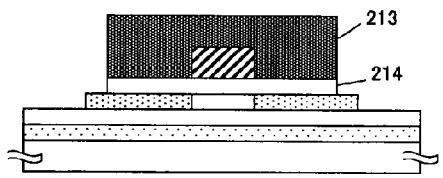

Then, as illustrated in FIG. 2E, a resist mask 213 is formed on the gate insulating film 208 so as to cover the gate electrode 209. Then, the gate insulating film 208 is etched by using the mask 213, thereby forming a selectively-etched gate insulating film 214. In the present preferred embodiment, the etching process was performed by an RIE (Reactive Ion Etching) method using $CHF_3$ as the etching gas. The etching selectivity with respect to the underlying silicon film is about 10:1, which is sufficient. The method for selectively etching the gate insulating film may alternatively be an ordinary plasma etching method, an ICP (Inductively Coupled Plasma) etching method, or other suitable process, and the etching gas may alternatively be any other suitable CFC gas such as $CF_4$ or $SF_6$. Note that while the gate insulating film 208 is etched in a dry process in the present preferred embodiment, it may alternatively be wet-etched by using hydrofluoric acid, or other suitable material. After this step, the etched gate insulating film 214 covers the semiconductor layer 207, with a portion (peripheral portion) thereof being exposed.

Figure 2F:
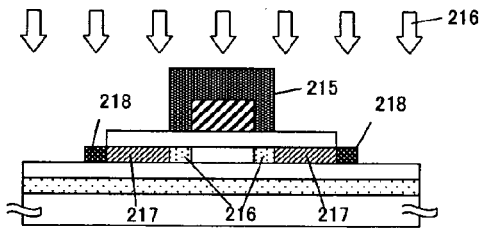

Then, after the resist mask 213 is removed, another photoresist doping mask 215 with a thick side wall is provided so as to cover the gate electrode 209, as illustrated in FIG. 2F. Then, a high concentration of an impurity (phosphorus) 216p is implanted into the semiconductor layer 207 by an ion doping method using the resist mask 215. Phosphine ($PH_3$) is used as the doping gas, the acceleration voltage is preferably set to, for example, about 60 kV to about 90 kV (e.g., about 70 kV), and the dose is preferably set to, for example, about $1\times10^{15}$ $cm^{-2}$ to about $8\times10^{15}$ $cm^{-2}$ (e.g., about $4\times10^{15}$ $cm^{-2}$). While regions of the semiconductor layer 207 that are not covered with the mask 215 are doped with phosphorus in this step, a region 217 over which the gate insulating film 214 is present and a region 218 that is not masked with the gate insulating film 214 are doped with phosphorus quite differently.

FIG. 19 shows the doping profile. The region 217 is doped with phosphorus through the overlying gate insulating film 214 having a thickness of about 100 nm. Therefore, the depth range of, for example, about 1000 Å to about 1400 Å (about 100 nm to about 140 nm) in FIG. 19 represents the concentration of phosphorus implanted into the silicon film in the region 217. In contrast, the region 218, over which the gate insulating film 214 is absent, is directly doped with phosphorus. Therefore, the depth range of, for example, about 0 to about 400 Å (about 0 to about 40 nm) in FIG. 19 represents the concentration of phosphorus implanted into the silicon film in the region 218. Thus, there is a concentration difference of one order of magnitude or more between the region 217 and the region 218, which are doped in the same doping step, with the actual amount of phosphorus in the region 218 being greater than that in the region 217 by a factor of approximately 10 or more. In addition, in the region 218, where the overlying gate insulating film is absent, phosphorus ions are implanted into the semiconductor layer with a higher acceleration voltage than in the region 217, where the overlying gate insulating film is present, and the ions collide with one another with higher collision energies, thereby amorphizing the semiconductor layer by destroying the crystalline structure thereof in the region 218. In contrast, in the region 217, the ion collision energy is reduced by the presence of the gate insulating film, whereby the semiconductor layer is not amorphized and the crystalline structure thereof is maintained.

The region 217 will later be the source/drain region of the TFT, and the region 218 will later be the gettering region thereof. Thus, the gettering region and the source/drain region can easily be formed together while being given different properties suitable for the respective regions. In the semiconductor layer 207, the region that is covered with the resist mask 215 and is not doped with a high concentration of phosphorus 216p is left as a region doped with a low concentration of phosphorus, which forms an LDD (Lightly Doped Drain) region 216. By forming the LDD region 216 as described above, the electric field localization at the junction between the channel region and the source/drain region is reduced, whereby it is possible to reduce the TFT off-state leak current and to suppress the deterioration due to hot carriers, thus improving the reliability of the TFT.

Figure 2G:
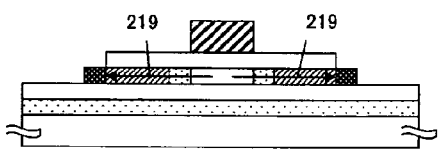

Then, after the photoresist mask 215 is removed, a second heat treatment is performed in an inert atmosphere (e.g., a nitrogen atmosphere). In the present preferred embodiment, the heat treatment was performed in a nitrogen atmosphere at about 500° C. to about 600° C. for approximately 30 minutes to 8 hours (e.g., at about 550° C. for approximately 4 hours). In this process, the amorphized gettering region 218 heavily doped with phosphorus provides a stronger gettering action than the source/drain region 217, thereby performing a gettering process. In the region 218, defects, segregation sites, etc., capable of trapping nickel have been formed, and the region 218 has been amorphized, whereby the free energy of nickel is lowered therein. Moreover, the solid solubility of the silicon film for nickel has been increased significantly by the heavy phosphorus doping. Utilizing these gettering powers, nickel remaining in the channel region 211 and the source/drain region 217 is moved into the gettering region 218 as indicated by arrow 219, as illustrated in FIG. 2G. Note that since the catalyst element moves into the gettering region 218 in the heat treatment step, the concentration of the catalyst element in the gettering region is about $1\times10^{19}/cm^3$ or more.

Note that this second heat treatment step also activates phosphorus doped into the source/drain region 217 and the LDD region 216. As a result, the sheet resistance of the source/drain region 217 was about 0.8 kΩ/square to about 1.5 kΩ/square and the sheet resistance of the LDD region 216 was about 30 kΩ/square to about 60 kΩ/square. Since the gettering region 218 has been amorphized with the crystalline structure thereof being completely destroyed, the gettering region 218 is not restored into a crystalline region and is not activated. In the present preferred embodiment, the resistance value of the gettering region 218 was about 1 MΩ/square or more. Under such a condition, the source/drain region does not at all function as a source/drain region in the prior art. In this preferred embodiment of the present invention, however, the gettering region is formed in the semiconductor layer separately from the source/drain region, whereby the gettering region does not interfere with the operation of the TFT. Moreover, the ratio Pa/Pc between the TO-phonon peak Pa of amorphous Si and the TO-phonon peak Pc of crystalline Si in the Raman spectrum as measured by laser Raman spectroscopy was larger in the gettering region 218 than in the channel region 211 or the source/drain region 217. Moreover, this condition is maintained even after the completion of the TFT because no high-temperature step is performed after this heat treatment step.

Figure 2H:
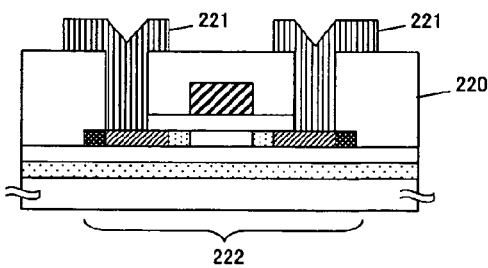

Then, as illustrated in FIG. 2H, a silicon oxide film or a silicon nitride film having a thickness of about 600 nm is formed as an interlayer insulating film 220. In a case where a silicon oxide film is used, the silicon oxide film is preferably formed by a plasma CVD method using TEOS with oxygen, or a low-pressure CVD method or an atmospheric pressure CVD method using TEOS with ozone, thereby obtaining an interlayer insulating film having a desirable step-covering property. Moreover, when a silicon nitride film is deposited by a plasma CVD method using $SiH_4$ and $NH_3$ as material gases, it is possible to obtain an effect of reducing dangling bonds that deteriorate the TFT characteristics by supplying hydrogen atoms to the interface between the active region and the gate insulating film.

Then, contact holes are made in the interlayer insulating film 220, and an electrode/line 221 of the TFT is formed by using a metal film, e.g., a two-layer film of titanium nitride and aluminum. The titanium nitride film is a barrier film for preventing the diffusion of aluminum into the semiconductor layer. In a case where the TFT (222 in FIG. 2H) is used as a pixel TFT for switching a pixel electrode, a pixel electrode formed from a transparent conductive film such as ITO is connected to one of the two electrodes other than the gate electrode (i.e., the drain electrode), and a source bus line is connected to the other electrode (i.e., the source electrode). In the present preferred embodiment, the source electrode and the source bus line are formed integrally with each other. A video signal is supplied via the source bus line, and a necessary charge is written to the pixel electrode based on the gate signal from the gate bus line 209. Moreover, the TFT can easily be applied to a thin film integrated circuit, in which case an additional contact hole is made over the gate electrode 209 for providing a necessary line.

Finally, an annealing process is performed in a nitrogen atmosphere or a hydrogen atmosphere at about 350° C. for approximately 1 hour, thereby completing the TFT 222, as illustrated in FIG. 2H. As necessary, a protection film made of silicon nitride, or other suitable material, may be further provided on the TFT 222 for the purpose of protecting the TFT 222.

A TFT produced according to the preferred embodiment as described above had a very high performance with a field-effect mobility of about 200 cm$^2$/Vs and a threshold voltage of about 1.5 V, and still had no abnormal increase in the TFT off-state leak current, which is frequently seen in the prior art, with the leak current stably exhibiting a very low value on the order of about 0.1 pA per unit W or less. This value is substantially the same as that of a conventional TFT produced without using a catalyst element. Thus, the production yield is improved significantly by various preferred embodiments of the present invention. Moreover, substantially no characteristics deterioration was observed in tests for the resistance to repeated operations, the resistance to bias voltages and the resistance to thermal stresses, indicating a much higher reliability over the prior art.

TFTs having a dual-gate structure were produced according to the present preferred embodiment and used as pixel TFTs on the active matrix substrate of a liquid crystal display panel. The obtained liquid crystal panel, as compared with a reference panel produced by a conventional method, had a high display quality with a notably lower display non-uniformity, very few pixel defects due to a TFT leak current, and a high contrast ratio.

Third Preferred Embodiment

The third preferred embodiment of the present invention will now be described. The present preferred embodiment is directed to a process of producing, on a glass substrate, a circuit having a CMOS structure including a complementary set of an n-channel TFT and a p-channel TFT, which is used in a peripheral driving circuit of an active matrix liquid crystal display device or a general thin film integrated circuit.

FIG. 3A to FIG. 3F and FIG. 4A to FIG. 4E are cross-sectional views sequentially illustrating steps for producing the TFTs of the present preferred embodiment.

Figure 3A:
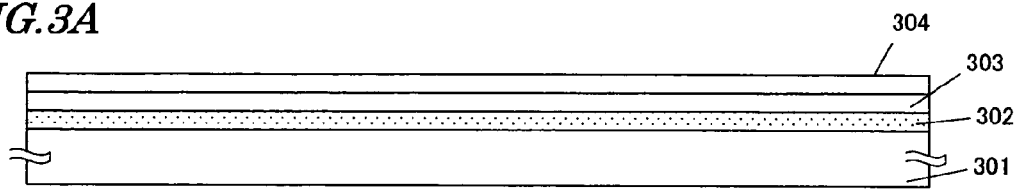
FIG. 3A to FIG. 3F are schematic cross-sectional views illustrating steps for manufacturing a semiconductor device according to a preferred embodiment of the present invention.

Referring to FIG. 3A, a low-alkali glass substrate or a quartz substrate may preferably be used as a substrate 301. A low-alkali glass substrate was used in the present preferred embodiment. In such a case, the substrate may be subjected to a pre-heat treatment at a temperature that is lower than the glass deformation point by about 10° C. to about 20° C. A base film such as a silicon oxide film, a silicon nitride film or a silicon oxide nitride film is formed on the TFT side of the substrate 301 for preventing the diffusion of an impurity from the substrate 301. In the present preferred embodiment, a silicon oxide nitride film was deposited, as a lower first base film 302, by a plasma CVD method using material gases of SiH$_4$, NH$_3$ and N$_2$O, and a silicon oxide film was deposited, as a second base film 303, on the first base film 302 similarly by a plasma CVD method using material gases of TEOS and oxygen. The thickness of the silicon oxide nitride film of the first base film 302 was preferably, for example, about 25 nm to about 200 nm (e.g., about 50 nm), and the thickness of the silicon oxide film of the second base film 303 was preferably about, for example, about 25 nm to about 300 nm (e.g., about 100 nm).

Then, an amorphous silicon film (a-Si film) 304 having a thickness of, for example, about 20 nm to about 150 nm (preferably about 30 nm to about 80 nm) is formed by a known method such as a plasma CVD method or a sputtering method. In the present preferred embodiment, an amorphous silicon film was formed to a thickness of, for example, about 50 nm by a plasma CVD method. Moreover, in the present preferred embodiment, the base films 302 and 303 and the amorphous silicon film 304 were formed successively without exposing the substrate to the atmospheric air by using a multi-chamber plasma CVD apparatus. In this way, it is possible to prevent the contamination of the interface between the base film and the a-Si film (which is to be the back channel in a TFT), thereby reducing the characteristics variations among TFTs produced and the fluctuations in the threshold voltage.

Figure 3B:
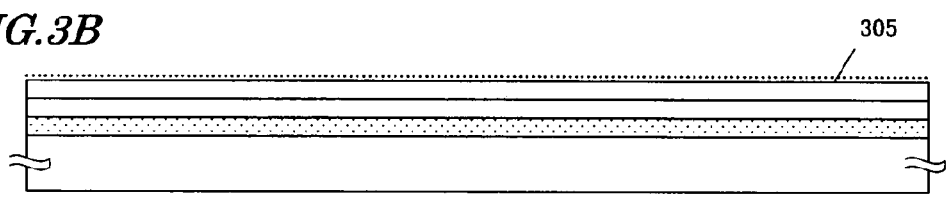

Then, a small amount of a catalyst element (nickel in the present preferred embodiment) 305 is added to the surface of the a-Si film 304. The addition of a small amount of nickel 305 was performed by holding a nickel solution on the a-Si film 304, uniformly spreading the solution across the substrate 301 by a spinner, and then drying the substrate 301. In the present preferred embodiment, nickel acetate was used as the solute, water was used as the solvent, and the nickel concentration in the solution was controlled to be about 10 ppm. This state is shown in FIG. 3B. The concentration of added nickel on the surface of the a-Si film 304 in the state as illustrated in FIG. 3B was about 7×10$^{12}$ atoms/cm$^2$, as measured by a total reflection X-ray fluorescence (TRXRF) method. Methods for doping an amorphous silicon film with a catalyst element include, in addition to the method of applying a solution including the catalyst element, vapor-phase application methods such as a plasma doping method, a vapor deposition method and a sputtering method. When a solution is used, it is easy to control the amount of the catalyst element to be added, and very small amounts of the catalyst element can easily be added.

Figure 3C:
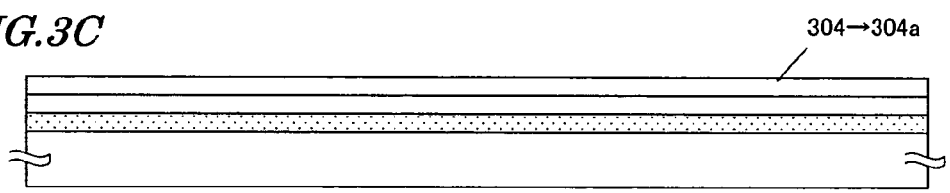

Then, a heat treatment is performed in an inert atmosphere (e.g., a nitrogen atmosphere). The heat treatment is performed at about 520° C. to about 600° C. for approximately 1 to 8 hours. In the present preferred embodiment, the heat treatment was performed at about 580° C. for approximately 1 hour. In this heat treatment, nickel 305 added to the surface of the a-Si film 304 diffuses into the a-Si film 304 while being silicified, and the crystallization of the a-Si film 304 proceeds using the silicide as nuclei. As a result, the a-Si film 304 is crystallized into a crystalline silicon film 304a, as illustrated in FIG. 3C. Note that while the crystallization process is herein performed in a heat treatment using a furnace, it may alternatively be performed by an RTA (Rapid Thermal Annealing) apparatus capable of rapidly increasing and decreasing the temperature.

Figure 3D:
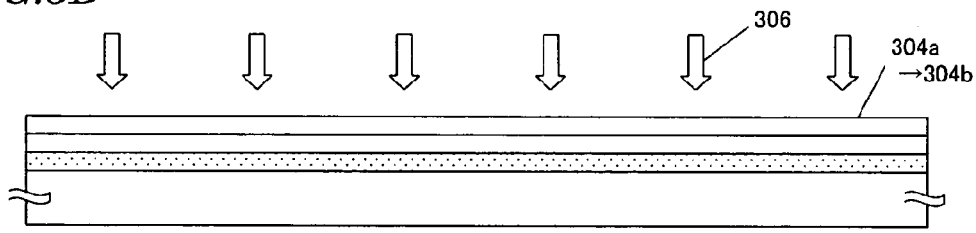

Then, as illustrated in FIG. 3D, the crystalline silicon film 304a is irradiated with laser light 306 to further crystallize the crystalline silicon film 304a, thereby improving the crystallinity thereof. In this step, XeCl excimer laser (wavelength: 308 nm, pulse width: 40 nsec) was used as the laser light. The laser light irradiation was performed with an energy density of about 350 mJ/cm$^2$ to about 500 mJ/cm$^2$ (e.g., about 420 mJ/cm$^2$). In the present preferred embodiment, the laser light was shaped so as to form an elongated beam spot having a size of, for example, about 150 mm by about 1 mm on the surface of the substrate 301, and the substrate 301 was scanned in the direction that is substantially perpendicular to the longitudinal direction of the beam spot and in a line sequential manner with a step width of about 0.05 mm. Thus, any point on the crystalline silicon film 304a is irradiated with laser light a total of 20 times. The crystalline silicon film 304a obtained by solid-phase crystallization as described above is turned into a crystalline silicon film 304b of a higher quality as the crystal defects are reduced through the melting/solidification process by the laser irradiation. The laser light used in this step may be KrF excimer laser, XeCl excimer laser, YAG laser or YVO$_4$ laser of either a pulsed oscillation type or a continuous oscillation type. The crystallization conditions may be determined appropriately for each specific application.

Figure 3E:
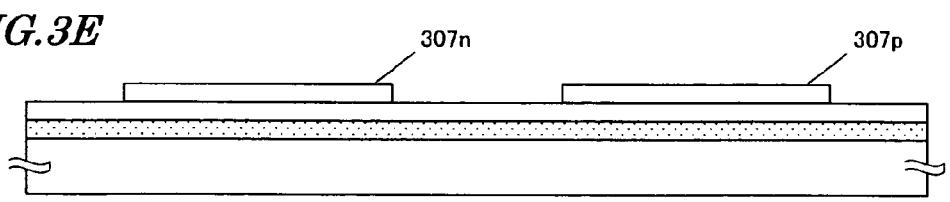

Then, a device isolation process is performed by removing unnecessary portions of the crystalline silicon film 304b. Through these steps, island-shaped crystalline silicon films (semiconductor layers) 307n and 307p are formed, as illustrated in FIG. 3E, which are to be the active regions (the source/drain regions and the channel regions) of the n-channel TFT and the p-channel TFT, respectively.

Boron (B) may be added, as an impurity element providing p-type conductivity, to the entire surface of the semiconductor layers of the n-channel TFT and the p-channel TFT at a concentration of, for example, about $1\times10^{16}$/cm$^3$ to about $5\times10^{17}$/cm$^3$ for the purpose of controlling the threshold voltage. Boron (B) may be added by an ion doping method, or may alternatively be added to the amorphous silicon film when the amorphous silicon film is deposited.

Then, a silicon oxide film having a thickness of, for example, about 20 nm to about 150 nm (about 100 nm in the present embodiment) is deposited, as a gate insulating film 308, so as to cover the semiconductor layers 307n and 307p. The silicon oxide film was formed by decomposing and depositing TEOS (Tetra Ethoxy Ortho Silicate) by an RF plasma CVD method with oxygen at a substrate temperature of about 150° C. to about 600° C. (preferably about 300° C. to about 450° C.). After the deposition process, an annealing process may be performed in an inert gas atmosphere at about 500° C. to about 600° C. for approximately 1 to 4 hours in order to improve the bulk properties of the gate insulating film itself and the characteristics of the interface between the crystalline silicon film and the gate insulating film. The gate insulating film 308 may alternatively be any other suitable silicon-containing insulating film and may be a single-layer film or a multi-layer film.

Figure 3F:
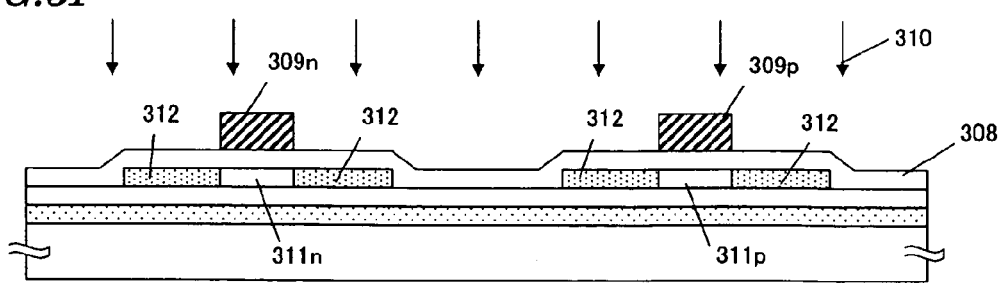

Then, as illustrated in FIG. 3F, a high-melting metal is deposited by a sputtering method and then patterned to form gate electrodes 309n and 309p. The high-melting metal may be an element selected from tantalum (Ta), tungsten (W), molybdenum (Mo) and titanium (Ti), an alloy containing one of these elements as its main component, or an alloy of these elements (typically, an Mo—W alloy or an Mo—Ta alloy). The material may alternatively be tungsten silicide, titanium silicide or molybdenum silicide. In the present preferred embodiment, tungsten (W) was deposited to a thickness of, for example, about 300 nm to about 600 nm (e.g., about 450 nm). The concentration of the impurity to be added for reducing the resistance is preferably low. When the oxygen concentration was set to, for example, about 30 ppm or less, a resistivity value of about 20 μΩcm or less was realized.

Then, a low concentration of an impurity (phosphorus) 310 is implanted into the active region by an ion doping method using the gate electrodes 309n and 309p as masks. Phosphine (PH$_3$) is used as the doping gas, the acceleration voltage is preferably set to, for example, about 60 kV to about 90 kV (e.g., about 70 kV), and the dose is preferably set to, for example, about $1\times10^{12}$ cm$^{-2}$ to about $1\times10^{14}$ cm$^{-2}$ (e.g., about $2\times10^{13}$ cm$^{-2}$). Through this step, regions of the island-shaped silicon films 307n and 307p that are not covered with the gate electrodes 309n and 309p become regions 312 doped with a low concentration of phosphorus 310, and regions that are masked with the gate electrodes 309n and 309p and are not doped with the impurity 310 will later be channel regions 311n and 311p of the n-channel TFT and the p-channel TFT, respectively. This state is shown in FIG. 3F.

Figure 4A:
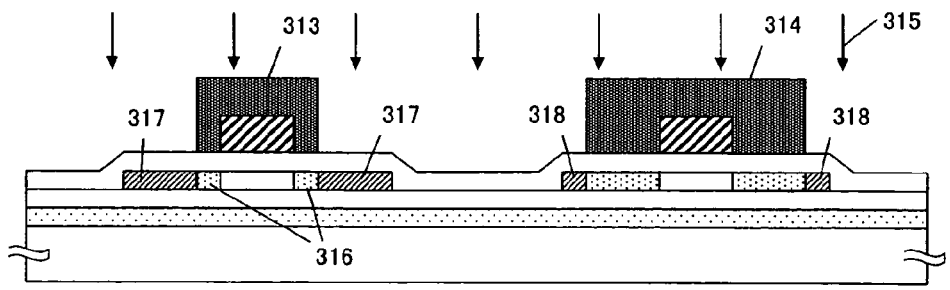
FIG. 4A to FIG. 4E are schematic cross-sectional views illustrating steps for manufacturing a semiconductor device according to a preferred embodiment of the present invention (continued from FIG. 3F).

Then, as illustrated in FIG. 4A, photoresist doping masks 313 and 314 are provided. In the n-channel TFT, the photoresist doping mask 313 with a thick side wall is provided so as to cover the gate electrode 309n, as illustrated in FIG. 4A. In the p-channel TFT, the photoresist doping mask 314 with an even thicker side wall is provided so as to cover the gate electrode 309p, with only a peripheral portion of the semiconductor layer 307p being exposed, as illustrated in FIG. 4A. Then, an impurity (phosphorus) 315 is implanted into the semiconductor layers by an ion doping method using the resist masks 313 and 314. Phosphine (PH$_3$) is preferably used as the doping gas, the acceleration voltage is preferably set to, for example, about 60 kV to about 90 kV (e.g., about 80 kV), and the dose is preferably set to, for example, about $1\times10^{15}$ to about $1\times10^{16}$ cm$^{-2}$ (e.g., about $5\times10^{15}$ cm$^{-2}$). Through this step, a high concentration of the impurity (phosphorus) 315 is implanted into the semiconductor layer 307n of the n-channel TFT in a region 317 that is not masked with the resist mask 313. A portion of the region 317 will later be the source/drain region of the n-channel TFT. In the semiconductor layer 307n, a region 318 that is covered with the resist mask 313 and is not doped with a high concentration of phosphorus 315 is left as a region doped with a low concentration of phosphorus, which forms an LDD (Lightly Doped Drain) region. In the semiconductor layer 307p of the p-channel TFT, a high concentration of the impurity (phosphorus) 315 is implanted into the region 318 that is not masked with the resist mask 314. At this point, the concentration of the n-type impurity element (phosphorus) 315 in the region 317 and the region 318 is, for example, preferably about $1\times10^{19}$/cm$^3$ to about $1\times10^{21}$/cm$^3$. Moreover, the concentration of the n-type impurity element (phosphorus) 310 in the LDD region 318 of the n-channel TFT is preferably in the range of, for example, about $1\times10^{17}$/cm$^3$ to about $1\times10^{19}$/cm$^3$, within which the region functions as an LDD region. By providing the LDD region, the electric field localization at the junction between the channel region and the source/drain region is reduced, whereby it is possible to reduce the TFT off-state leak current and to suppress the deterioration due to hot carriers.

Figure 4B:
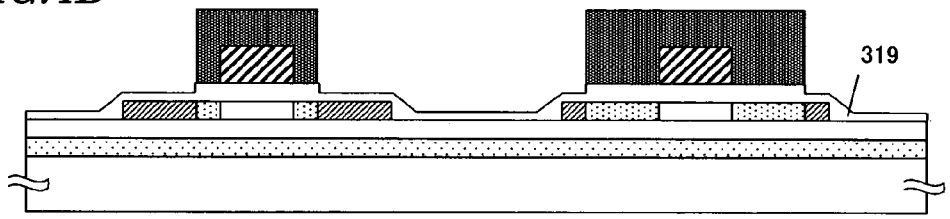

Then, as illustrated in FIG. 4B, the gate insulating film 308 is etched by using the resist masks 313 and 314 as they are, which have been used in the n-type impurity doping step as described above, thereby forming a selectively-thinned gate insulating film 319. Then, the resist masks 313 and 314 are removed. In the present preferred embodiment, the step of thinning the gate insulating film 308 and the step of removing the resist masks 313 and 314 are performed together as a single step by plasma etching. In other words, the gate insulating film 308 is thinned while ashing the resist masks 313 and 314, which have been hardened through the doping step. An oxygen gas and a CF$_4$ gas were used as the etching gases. While a plasma etching process only with an oxygen gas is sufficient for ashing and removing the resist masks, the addition of a CFC gas such as CF$_4$ provides an additional effect of etching the silicon oxide film, which is the gate insulating film. The etching rate for the gate insulating film can be controlled by adjusting the amount of a CF$_4$ gas to be introduced. Thus, in the present preferred embodiment, the resist masks 313 and 314 were fully ashed and removed, while etching portions of the gate insulating film that were not masked with the masks 313 and 314 by an etch amount of about 30 nm.

In such a case where the step of removing a resist mask and the step of thinning a gate insulating film are performed simultaneously, portions masked with the resist mask are also etched starting from when the resist mask is removed. In order to prevent this, the step may be switched to an ashing-only step using an oxygen gas by turning off the supply of the $CF_4$ gas at a certain point in the etching step. In this way, it is possible to prevent the portion of the gate insulating film under the resist mask from being thinned at all. After this step, the selectively-thinned gate insulating film 319 has a reduced thickness of about 70 nm over the region 317 and the region 318 of the semiconductor layer.

Figure 4C:
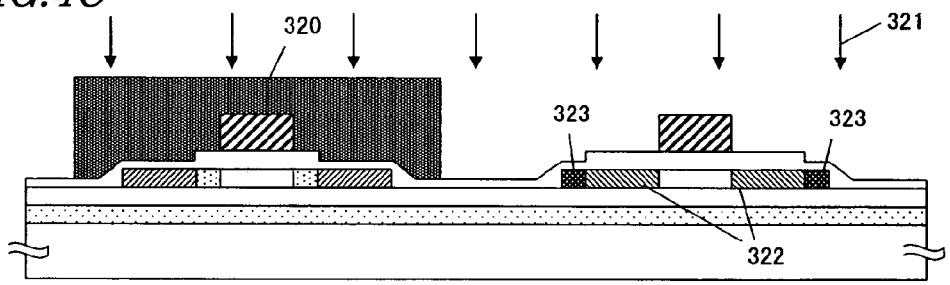
Figure 4D:
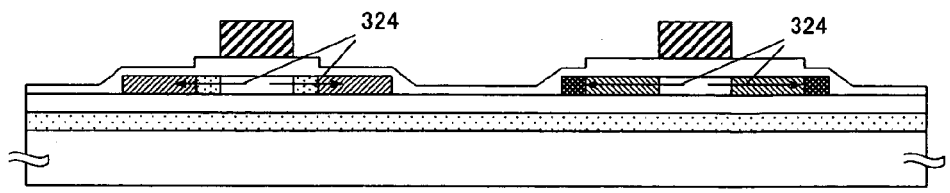

Then, as illustrated in FIG. 4C, another photoresist doping mask 320 is arranged so as to cover the semiconductor layer 307n of the n-channel TFT. Then, an impurity providing p-type conductivity (boron) 321 is implanted into the semiconductor layer 307p of the p-channel TFT by an ion doping method using the resist mask 320 and the gate electrode 309p of the p-channel TFT as masks. Diborane ($B_2H_6$) is preferably used as the doping gas, the acceleration voltage is preferably set to, for example, about 40 kV to about 80 kV (e.g., about 65 kV), and the dose is preferably set to, for example, about $1\times10^{15}$ $cm^{-2}$ to about $1\times10^{16}$ $cm^{-2}$ (e.g., about $5\times10^{15}$ $cm^{-2}$). In this step, a high concentration of boron 321 is implanted into a region of the semiconductor layer 307p of the p-channel TFT other than the channel region 311p under the gate electrode 309p. Since the semiconductor layer is doped with boron through the overlying gate insulating film 319, a region 322 where the overlying gate insulating film 319 is thick and a region 323 where the overlying gate insulating film 319 has been thinned are doped with different amounts of boron and will therefore have different crystalline conditions. In the region 323 where the gate insulating film 319 is thin, as compared with the region 322, the boron concentration is higher. In addition, in the region 323, where the overlying gate insulating film 319 is thin, boron ions are implanted into the semiconductor layer with a higher acceleration voltage than in the region 322, and the ions collide with one another with higher collision energies, whereby the crystalline structure is more destroyed in the region 323. In contrast, in the region 322, the ion collision energy is reduced by the presence of the gate insulating film, whereby a desirable crystalline structure of the semiconductor layer is maintained.

Through this step, the conductivity type of the region 322, which has previously been doped with a low concentration of the n-type impurity (phosphorus) 310, is inverted from n type to p type and the region 322 will later be the source/drain region of the TFT. Moreover, the region 323, which has previously been doped with a high concentration of phosphorus 315, is further doped with a high concentration of boron 321, and the crystalline structure thereof is destroyed, whereby the region 323 functions as a gettering region. Thus, the gettering region and the source/drain region can easily be formed together while being given different properties suitable for the respective regions. At this point, the concentration of the p-type impurity element (boron) 321 in the gettering region 323 is, for example, about $1.5\times10^{19}/cm^3$ to about $3\times10^{21}/cm^3$. In this step, the active region 307n of the n-channel TFT is entirely covered with the mask 320 and is not doped with boron 321.

Then, after the resist mask 320 is removed, a second heat treatment is performed in an inert atmosphere (e.g., a nitrogen atmosphere). In the present preferred embodiment, a heat treatment was performed using a common diffusion furnace at about 550° C. for approximately 4 hours. Other methods may be used for the heat treatment, and the conditions therefor may be determined appropriately for each specific application. In this heat treatment step, phosphorus doped into the source/drain region 317 in the semiconductor layer 307n of the n-channel TFT increases the solid solubility of the region for nickel. Then, nickel present in the channel region 311n and an LDD region 316 is moved from the channel region to the LDD region and to the source/drain region 317 as indicated by arrow 324 in FIG. 4D. Moreover, phosphorus and boron doped at high concentrations into the gettering region 323 formed outside the source/drain region in the semiconductor layer 307p of the p-channel TFT, and crystal defects, etc., created during the boron doping process, move nickel present in the channel region 311p and the source/drain region 322 from the channel region to the source/drain region and to the gettering region 323 as indicated by arrow 324. Since nickel moves into the gettering region 323 in the heat treatment step, the nickel concentration in the gettering region 323 is, for example, about $1\times10^{19}/cm^3$ or more.

This heat treatment step also activates the n-type impurity (phosphorus) doped into the source/drain region 317 and the LDD region 316 of the n-channel TFT and the p-type impurity (boron) doped into the source/drain region 322 of the p-channel TFT. As a result, the sheet resistance value of the source/drain region 317 of the n-channel TFT was about 0.5 kΩ/square to about 1 kΩ/square, and the sheet resistance value of the LDD region 316 was about 30 kΩ/square to about 60 kΩ/square. Moreover, the sheet resistance value of the source/drain region 322 of the p-channel TFT was about 1 kΩ/square to about 1.5 kΩ/square. In the gettering region 323, carriers (electrons and holes) introduced by the n-type impurity element (phosphorus) and the p-type impurity element (boron) cancel each other, and the gettering region 323 is subject to an implantation damage because the overlying gate insulating film has been thinned. Therefore, the sheet resistance value of the gettering region 323 is on the order of about 10 kΩ/square, whereby the region 323 cannot function as a source/drain region. However, the gettering region 323 is formed in the semiconductor layer of the p-channel TFT separately from the source region and the drain region in such an arrangement that it does not interfere with the movement of carriers in the TFT. Therefore, the sheet resistance value of the gettering region 323 does not hinder the operation of the transistor. After this step, the ratio Pa/Pc between the TO-phonon peak Pa of amorphous Si and the TO-phonon peak Pc of crystalline Si in the Raman spectrum as measured by laser Raman spectroscopy was larger in the gettering region 323 than in the channel region 311p or the source/drain region 322.

Then, as illustrated in FIG. 3D, an interlayer insulating film is formed. A silicon nitride film, a silicon oxide film or a silicon nitride oxide film is preferably formed to a thickness of, for example, about 400 nm to about 1500 nm (typically, about 600 nm to about 1000 nm). In the present preferred embodiment, a silicon nitride film 325 having a thickness of about 200 nm and a silicon oxide film 326 having a thickness of about 700 nm were deposited on one another, thereby providing a two-layer film. The deposition process is performed by a plasma CVD method to continuously form the silicon nitride film using $SiH_4$ and $NH_3$ as material gases, and the silicon oxide film using TEOS and $O_2$ as material gases. The interlayer insulating film may be any other suitable silicon-containing insulating film and may be a single-layer film or a multi-layer film, in which case the upper layer may be an organic insulating film such as an acrylic film.

Then, another heat treatment is performed at about 300° C. to about 500° C. for about 30 minutes to 4 hours as a step of hydrogenating the semiconductor layer. This step is performed for terminating and inactivating dangling bonds that deteriorate the TFT characteristics by supplying hydrogen atoms to the interface between the active region and the gate insulating film. In the present preferred embodiment, a heat treatment was performed in a nitrogen atmosphere containing about 3% of hydrogen at about 410° C. for approximately 1 hour. When a sufficient amount of hydrogen is contained in the interlayer insulating film (particularly the silicon nitride film 325), the effect can be obtained also by performing the heat treatment in a nitrogen atmosphere. Other hydrogenation processes that can be used include a plasma hydrogenation process (using hydrogen excited by a plasma).

Figure 4E:
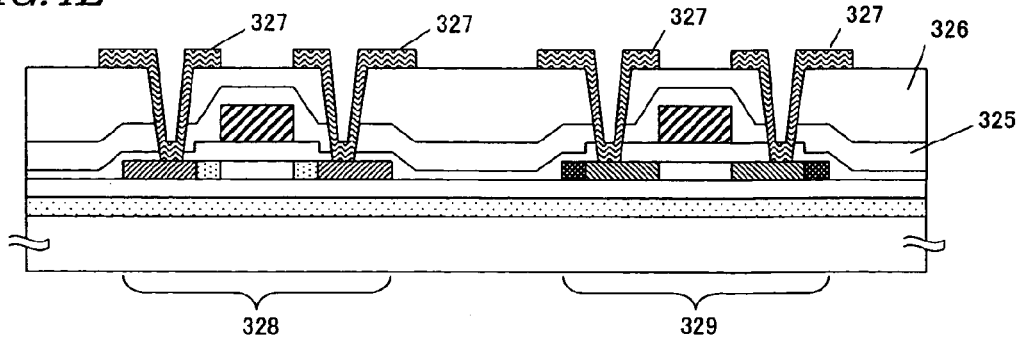

Then, contact holes are made in the interlayer insulating film, and an electrode/line 327 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel TFT 328 and a p-channel TFT 329 as illustrated in FIG. 4E. As necessary, additional contact holes may be made over the gate electrodes 309n and 309p for providing necessary connection between electrodes with the line 327. Moreover, a protection film made of silicon nitride, or other suitable material, may be further provided on each TFT for the purpose of protecting the TFT.

An n-channel TFT and a p-channel TFT produced according to the preferred embodiment as described above exhibited very desirable characteristics with high field-effect mobilities of about 250 cm$^2$/Vs to about 300 cm$^2$/Vs and about 120 cm$^2$/Vs to about 150 cm$^2$/Vs, respectively, and with threshold voltages of about 1 V and about −1.5 V, respectively. Moreover, as a CMOS circuit having a complementary set of an n-channel TFT and a p-channel TFT produced according to the present preferred embodiment was used in various circuits such as an inverter chain and a ring oscillator, the circuits exhibited a much higher reliability and more stable circuit characteristics over the prior art.

Fourth Preferred Embodiment

The fourth preferred embodiment of the present invention will now be described. The present preferred embodiment is also directed to a process of producing, on a glass substrate, a circuit having a CMOS structure including a complementary set of an n-channel TFT and a p-channel TFT.

FIG. 5A to FIG. 5F and FIG. 6A to FIG. 6E are cross-sectional views sequentially illustrating steps for producing the TFTs of the present preferred embodiment.

Figure 5A:
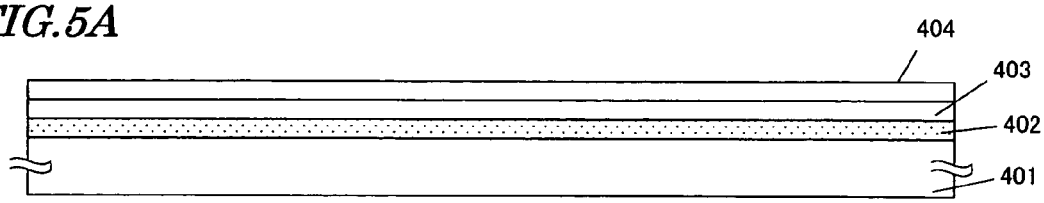
FIG. 5A to FIG. 5F are schematic cross-sectional views illustrating steps for manufacturing a semiconductor device according to a preferred embodiment of the present invention.
Figure 5B:
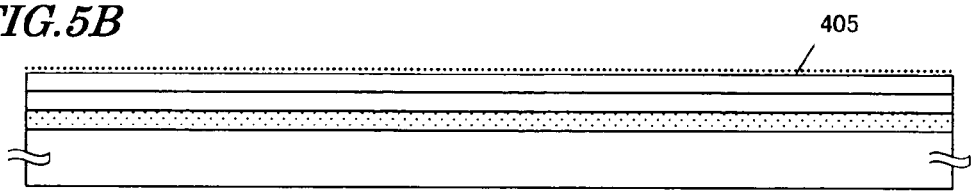

Referring to FIG. 5A, a silicon oxide nitride film as a lower first base film 402 and a silicon oxide film as a second base film 403 are formed in this order on the TFT side of a glass substrate 401, and an a-Si film 404 having a thickness of, for example, about 50 nm, for example, is formed thereon, in a manner similar to those of the first to third preferred embodiments. Then, as illustrated in FIG. 5B, a small amount of nickel 405 is added to the surface of the a-Si film 404 in a manner similar to those of the first to third preferred embodiments.

Figure 5C:
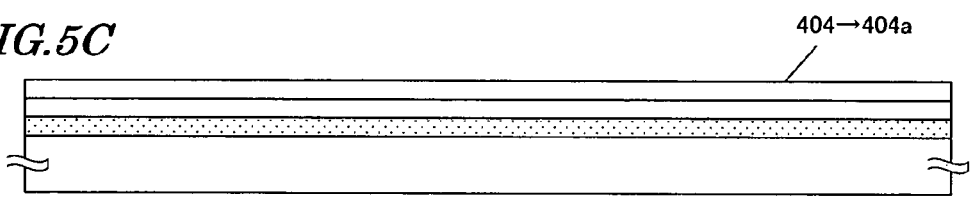
Figure 5D:
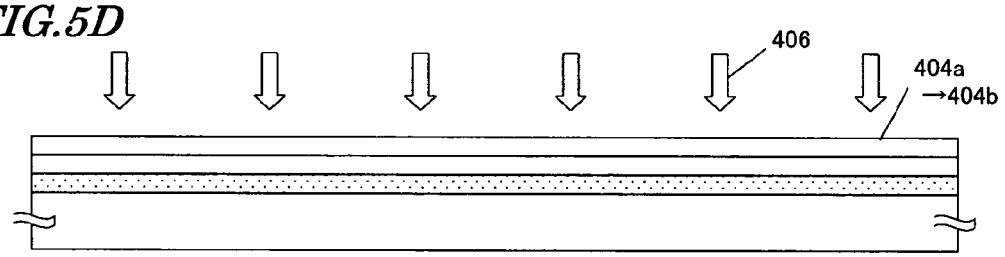

Then, a first heat treatment is performed so as to crystallize the a-Si film 404 in solid phase using nickel 405 added to the a-Si film 404 as a catalyst, thereby obtaining a crystalline silicon film 404a. This state is shown in FIG. 5C. Then, as illustrated in FIG. 5D, the crystalline silicon film 404a is irradiated with laser light 406, in a manner similar to those of the first to third preferred embodiments, so as to improve the crystallinity thereof, thereby obtaining a crystalline silicon film 404b of a higher quality.

Figure 5E:
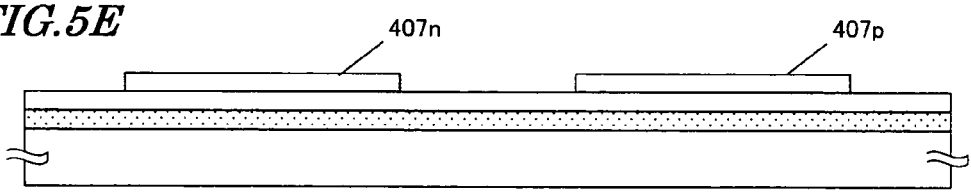

Then, a device isolation process is performed by removing unnecessary portions of the crystalline silicon film 404b. Through this step, island-shaped crystalline silicon films 407n and 407p are formed, as illustrated in FIG. 5E, which are to be the semiconductor layers of the n-channel TFT and the p-channel TFT, respectively.

Figure 5F:
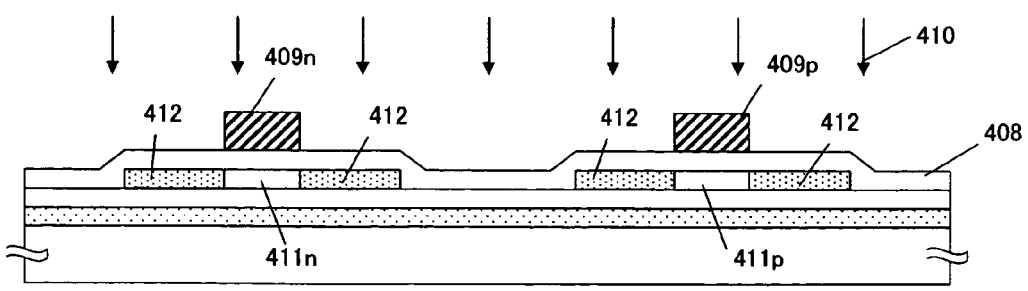

Then, a silicon oxide film having a thickness of, for example, about 100 nm, for example, is deposited as the gate insulating film 408 so as to cover the crystalline silicon films 407n and 407p, which are to be the active regions, in a manner similar to those of the first to third preferred embodiments. Then, as illustrated in FIG. 5F, a high-melting metal (tungsten in the present preferred embodiment) is deposited by a sputtering method and then patterned to form gate electrodes 409n and 409p.

Then, a low concentration of an impurity (phosphorus) 410 is implanted into the semiconductor layers in a manner similar to that of the third preferred embodiment. Through this step, regions of the semiconductor layers 407n and 407p that are not covered with the gate electrodes 409n and 409p become regions 412 doped with a low concentration of phosphorus 410, and regions that are masked with the gate electrodes 409n and 409p and are not doped with the impurity 410 will later be channel regions 411n and 411p of the n-channel TFT and the p-channel TFT. This state is shown in FIG. 5F.

Figure 6A:
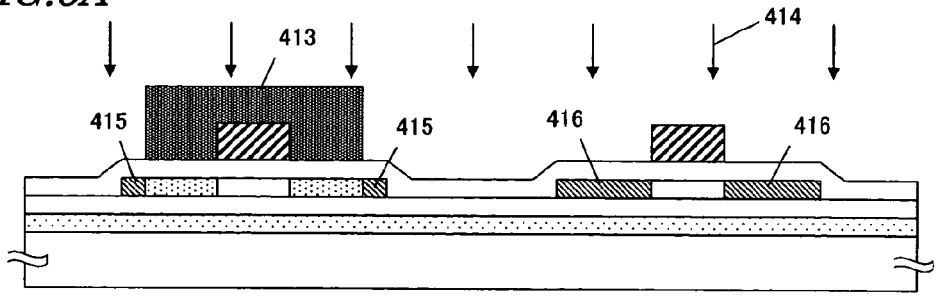
FIG. 6A to FIG. 6E are schematic cross-sectional views illustrating steps for manufacturing a semiconductor device according to a preferred embodiment of the present invention (continued from FIG. 5F).

Then, as illustrated in FIG. 6A, a photoresist doping mask 413 is arranged in the n-channel TFT so as to cover the gate electrode 409n, with a peripheral portion of the semiconductor layer 407n being exposed. At this time, no mask is provided over the p-channel TFT, whereby the TFT is entirely exposed. Then, an impurity providing p-type conductivity (boron) 414 is implanted into the active regions by an ion doping method using the resist mask 413 and the gate electrode 409p of the p-channel TFT as masks. Diborane ($B_2H_6$) is preferably used as the doping gas, the acceleration voltage is preferably set to, for example, about 40 kV to about 80 kV (e.g., about 70 kV), and the dose is preferably set to, for example, about $1\times10^{15}$ to about $1\times10^{16}$ cm$^{-2}$ (e.g., about $7\times10^{15}$ cm$^{-2}$). Through this step, a region 415 of the semiconductor layer 407n of the n-channel TFT that is not masked with the mask 413 is doped with a high concentration of boron. A region 416 of the semiconductor layer 407p of the p-channel TFT other than the channel region 411p under the gate electrode 409p is doped with a high concentration of boron 414. The conductivity type of the region 416, which has previously been doped with a low concentration of an n-type impurity (phosphorus), is inverted from n type to p type by the high concentration of a p-type impurity (boron). At this point, the concentration of the p-type impurity element (boron) 414 in the region 415 and the region 416 is preferably about $1.5\times10^{19}$/cm$^3$ to about $3\times10^{21}$/cm$^3$.

Figure 6B:
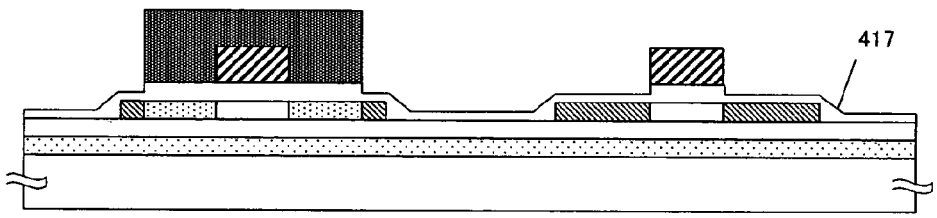

Then, as illustrated in FIG. 6B, the gate insulating film 408 is etched by using the resist mask 413 and the gate electrode 409p of the p-channel TFT, which have been used in the n-type impurity doping step, so as to form a selectively-thinned gate insulating film 417. In the present preferred embodiment, the gate insulating film 408 was etched by about 50 nm by an RIE (Reactive Ion Etching) method using CHF$_3$ as the etching gas. The method for selectively etching the gate insulating film may alternatively be an ordinary plasma etching method, and the etching gas may alternatively be any other suitable CFC gas such as CF$_4$ or SF$_6$. Note that while the gate insulating film 408 is etched in a dry process in the present preferred embodiment, it may alternatively be wet-etched by using hydrofluoric acid, or other suitable material. Through this step, the gate insulating film 408 is thinned in regions where it is not covered with the mask 413 or the gate electrode 409p of the p-channel TFT. In the present preferred embodiment, the etching process was controlled so that the etch amount was, for example, about 50 nm. Therefore, the thickness of the selectively-thinned gate insulating film 417 is, for example, about 50 nm over the region 415 of the semiconductor layer 407n of the n-channel TFT and the region 416 of the semiconductor layer 407p of the p-channel TFT.

Figure 6C:
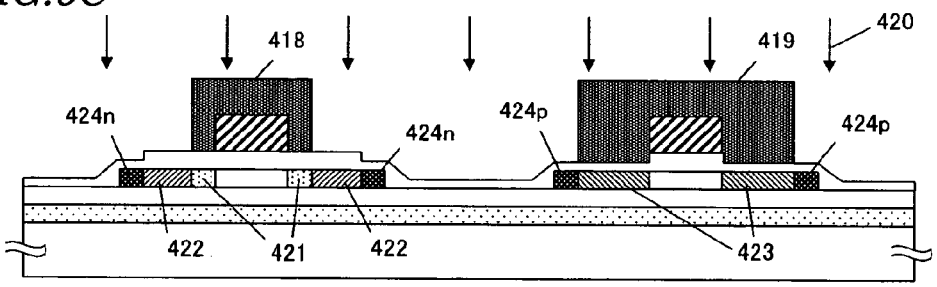
Figure 6D:
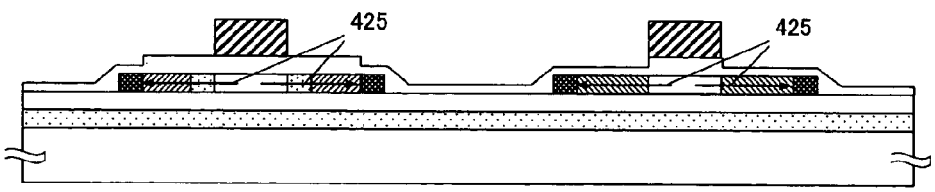

Then, after the resist mask 413 is removed, photoresist doping masks 418 and 419 are provided, as illustrated in FIG. 6C. The photoresist doping mask 418 with a thick side wall is provided over the semiconductor layer 407n of the n-channel TFT so as to cover the gate electrode 409n, as illustrated in FIG. 6C. In the p-channel TFT, the photoresist doping mask 419 with an even thicker side wall is provided so as to cover the gate electrode 409p, with only a peripheral portion of the active region 407p being exposed, as illustrated in FIG. 6C. Then, a high concentration of an impurity (phosphorus) 420 is implanted into the semiconductor layers by an ion doping method using the resist masks 418 and 419. Phosphine ($PH_3$) is preferably used as the doping gas, the acceleration voltage is preferably set to, for example, about 60 kV to about 90 kV (e.g., about 70 kV), and the dose is preferably set to, for example, about $2\times10^{15}$ cm$^{-2}$ to about $1\times10^{6}$ cm$^{-2}$ (e.g., about $5\times10^{15}$ cm$^{-2}$). While regions of the semiconductor layers 407n and 407p that are not covered with the masks 418 and 419 are doped with phosphorus through the overlying gate insulating film 417 in this step, a region over which the overlying gate insulating film 417 has been thinned and the other region are doped with phosphorus quite differently because of the difference in the thickness of the overlying gate insulating film 417.

FIG. 19 shows the doping profile. A region 422 is doped with phosphorus through the overlying gate insulating film 417 having a thickness of, for example, about 100 nm. Therefore, the depth range of, for example, about 1000 Å to about 1500 Å (about 100 nm to about 150 nm) in FIG. 19 represents the concentration of phosphorus implanted into the silicon film in the region 422. In contrast, in regions 424n and 424p, the overlying gate insulating film has been thinned to, for example, about 50 nm in the present preferred embodiment. Therefore, the depth range of, for example, about 500 Å to about 1000 Å (about 50 nm to about 100 nm) in FIG. 19 represents the concentration of phosphorus implanted into the silicon film in the regions 424n and 424p. Thus, there is a significant concentration difference between the region 422 and the regions 424n and 424p, where the overlying gate insulating film has been thinned, although these regions are doped in the same doping step, with the actual amount of phosphorus in the regions 424n and 424p being greater than that in the region 422 by a factor of about 5 or more. In addition, in the regions 424n and 424p, where the overlying gate insulating film has been thinned, phosphorus ions are implanted into the semiconductor layer with a higher acceleration voltage than in the region 422, where the gate insulating film is thick, and the ions collide with one another with higher collision energies, thereby amorphizing the semiconductor layer by destroying the crystalline structure thereof in the regions 424n and 424p. In contrast, in the region 422, the ion collision energy is reduced by the presence of the gate insulating film, whereby the semiconductor layer is not amorphized and the crystalline structure thereof is maintained.

In the n-channel TFT, the region 422 will later be the source/drain region of the TFT, and the region 424n will later be the gettering region. In the semiconductor layer 407n, the region that is covered with the resist mask 418 and is not doped with a high concentration of phosphorus 420 is left as a region doped with a low concentration of phosphorus, which forms an LDD (Lightly Doped Drain) region 421. In the p-channel TFT, the region 424p doped with a high concentration of the impurity (phosphorus) 420 will later be the gettering region, and a region 423 that is covered with the resist mask 419 and is not doped with a high concentration of phosphorus is left as a p-type impurity region and will later be the source/drain region of the p-channel TFT. At this point, the gettering regions 424n and 424p have been doped with boron 414 (in the previous step) and with a high concentration of phosphorus 420 (in the current step). Thus, the gettering region and the source/drain region can easily be formed together while being given different properties suitable for the respective regions. At this point, the concentration of the n-type impurity element (phosphorus) 420 in the gettering regions 424n and 424p is, for example, preferably about $1\times10^{19}$/cm$^3$ to about $1\times10^{21}$/cm$^3$. Moreover, the concentration of the n-type impurity element (phosphorus) 410 in the LDD region 421 of the n-channel TFT is, for example, preferably in the range of about $1\times10^{17}$/cm$^3$ to about $1\times10^{19}$/cm$^3$, within which the region functions as an LDD region.

Then, after the resist masks 418 and 419 are removed, the second heat treatment is performed in an inert atmosphere (e.g., a nitrogen atmosphere). In the present preferred embodiment, a heat treatment was performed at about 550° C. for approximately 4 hours. In this heat treatment step, phosphorus and boron doped at high concentrations into the gettering regions 424n and 424p formed outside the source/drain regions in the semiconductor layers 407n and 407p, respectively, increase the solid solubility of the regions for nickel, and also form segregation sites for nickel. Moreover, the regions 424n and 424p are amorphized in the doping step because the overlying gate insulating film has been thinned, and the free energy for nickel is lowered therein, whereby crystal defects and dangling bonds also function as segregation sites for nickel. These factors synergistically increase the gettering effect. As a result, in the semiconductor layer 407n of the n-channel TFT, nickel present in the channel region 411n, the LDD region 421 and the source/drain region 422 is moved from the channel region to the LDD region, the source/drain region and to the gettering region 424n as indicated by arrow 425 in FIG. 6D. Although the source/drain region 422 doped only with phosphorus has a gettering effect, the gettering region 424n, which is doped with more phosphorus and amorphized and is also doped with boron, has a much higher gettering capability, whereby nickel is collected into the gettering region 424n. Moreover, in the semiconductor layer 407p of the p-channel TFT, the gettering region 424p formed outside the source/drain region has a very high gettering capability as does the gettering region 424n of the n-channel TFT, and thus moves nickel present in the channel region 411p and the source/drain region 423 from the channel region to the source/drain region and to the gettering region 424p as indicated by arrow 425. In the second heat treatment for gettering, the catalyst element moves into the gettering regions 424n and 424p, whereby the concentration of the catalyst element therein is, for example, preferably about $1\times10^{19}$/cm$^3$ or more.

This heat treatment step also activates the n-type impurity (phosphorus) doped into the source/drain region 422 and the LDD region 421 of the n-channel TFT and the p-type impurity (boron) doped into the source/drain region 423 of the p-channel TFT. As a result, the sheet resistance value of the source/drain region 422 of the n-channel TFT was about 0.5 kΩ/square to about 1 kΩ/square, and the sheet resistance value of the LDD region 421 was about 30 kΩ/square to about 60 kΩ/square. Moreover, the sheet resistance value of the source/drain region 423 of the p-channel TFT was about 1 kΩ/square to about 1.5 kΩ/square. However, the gettering regions 424n and 424p have been amorphized substantially completely, whereby the crystallinity thereof cannot be recovered by the heat treatment described above, and the regions are thus left with amorphous components. Although these regions have a very high resistance, they are formed separately from the source or drain regions so as not to interfere with the movement of carriers during the operation of the TFTs. After this step, the ratio Pa/Pc between the TO-phonon peak Pa of amorphous Si and the TO-phonon peak Pc of crystalline Si in the Raman spectrum as measured by laser Raman spectroscopy is larger in the gettering region than in the channel region or the source/drain region. This condition is maintained even after the completion of the TFT because no high-temperature step is performed after this heat treatment step.

Figure 6E:
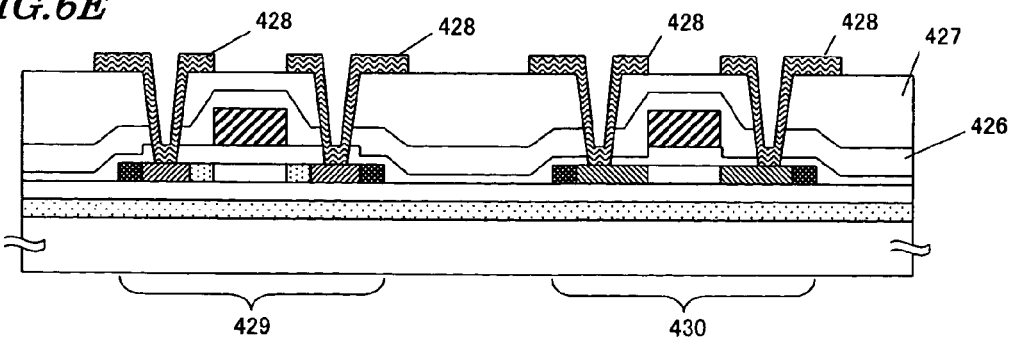

Then, as illustrated in FIG. 6E, an interlayer insulating film is formed. In the present preferred embodiment, a silicon nitride film 426 having a thickness of, for example, about 200 nm and a silicon oxide film 427 having a thickness of, for example, about 700 nm were deposited on one another, thereby providing a two-layer film. Then, another heat treatment is performed at about 300° C. to about 500° C. for about 1 hour. This step is performed for terminating and inactivating dangling bonds that deteriorate the TFT characteristics by supplying hydrogen atoms to the interface between the semiconductor layer and the gate insulating film from the interlayer insulating film (particularly the silicon nitride film 426).

Then, contact holes are made in the interlayer insulating film, and an electrode/line 428 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel TFT 429 and a p-channel TFT 430 as illustrated in FIG. 6E. As necessary, additional contact holes may be made over the gate electrodes 409n and 409p for providing necessary connection between electrodes with the line 428. Moreover, a protection film made of silicon nitride, or other suitable material, may be further provided on each TFT for the purpose of protecting the TFT.

Each TFT produced according to the present preferred embodiment exhibits a desirable field-effect mobility and a desirable threshold voltage as in the third preferred embodiment. In addition, since the n-channel TFT and the p-channel TFT of the present preferred embodiment each have a dedicated gettering region having a strong gettering capability in the semiconductor layer, it is possible to perform a strong gettering process, thereby further reducing the nickel concentration in the channel region and in the junction between the channel region and the source/drain region. The n-channel TFT and the p-channel TFT produced according to the present preferred embodiment exhibited no abnormal increase in the TFT off-state leak current, which is frequently seen in the prior art, and substantially no characteristics deterioration was observed in tests for the resistance to repeated operations, the resistance to bias voltages and the resistance to thermal stresses, indicating a much higher reliability as a semiconductor device over the prior art.

Moreover, in the present preferred embodiment, the gettering region can be formed in the source/drain region formation step for each of the n-channel TFT and the p-channel TFT. Therefore, it is possible to eliminate additional steps for the gettering process (a photolithography step, a doping step and an annealing step). As a result, it is possible to simplify the manufacturing process while reducing the manufacturing cost of the semiconductor device and improving the production yield. Moreover, as a CMOS circuit having a complementary set of an n-channel TFT and a p-channel TFT produced according to the present preferred embodiment was used in various circuits such as an inverter chain and a ring oscillator, the circuits exhibited an even higher reliability and even more stable circuit characteristics than those of the third preferred embodiment.

Fifth Preferred Embodiment

The fifth preferred embodiment of the present invention will now be described. The present preferred embodiment is also directed to a process of producing, on a glass substrate, a circuit having a CMOS structure including a complementary set of an n-channel TFT and a p-channel TFT.

FIG. 7A to FIG. 7F and FIG. 8A to FIG. 8E are cross-sectional views sequentially illustrating steps for producing the TFTs of the present preferred embodiment.

Figure 7A:
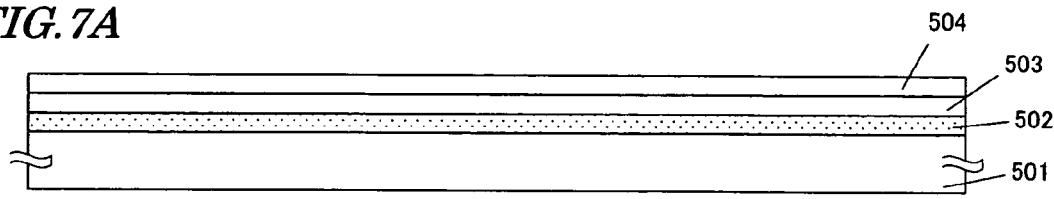
FIG. 7A to FIG. 7F are schematic cross-sectional views illustrating steps for manufacturing a semiconductor device according to a preferred embodiment of the present invention.
Figure 7B:
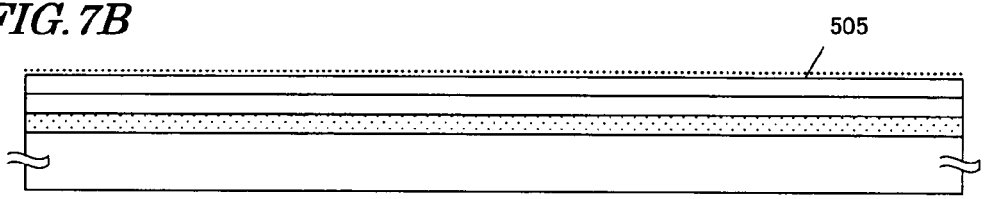

Referring to FIG. 7A, a silicon oxide nitride film as a lower first base film 502 and a silicon oxide film as a second base film 503 are formed in this order on the TFT side of a glass substrate 501, and an a-Si film 504 having a thickness of, for example, about 50 nm, for example, is formed thereon, in a manner similar to those of the first to third preferred embodiments. Then, as illustrated in FIG. 7B, a small amount of nickel 505 is added to the surface of the a-Si film 504 in a manner similar to those of the first to third preferred embodiments.

Figure 7C:
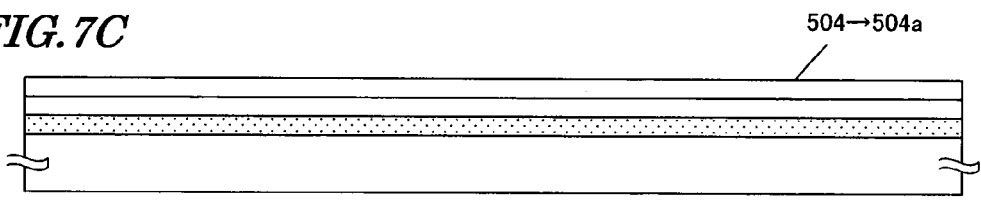
Figure 7D:
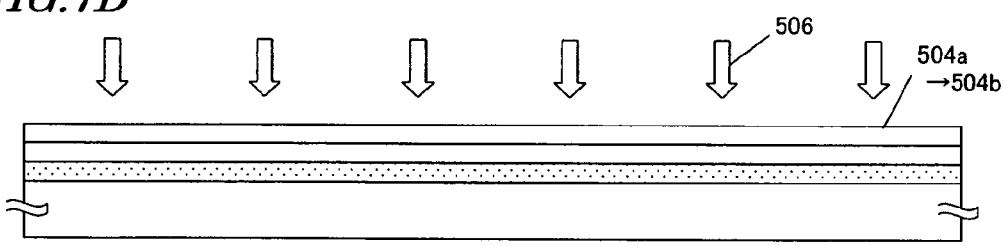

Then, a first heat treatment is performed so as to crystallize the a-Si film 504 in solid phase using nickel 505 added to the a-Si film 504 as a catalyst, thereby obtaining a crystalline silicon film 504a. This state is shown in FIG. 7C. Then, as illustrated in FIG. 7D, the crystalline silicon film 504a is irradiated with laser light 506, in a manner similar to those of the first to third preferred embodiments, so as to improve the crystallinity thereof, thereby obtaining a crystalline silicon film 504b of a higher quality.

Figure 7E:
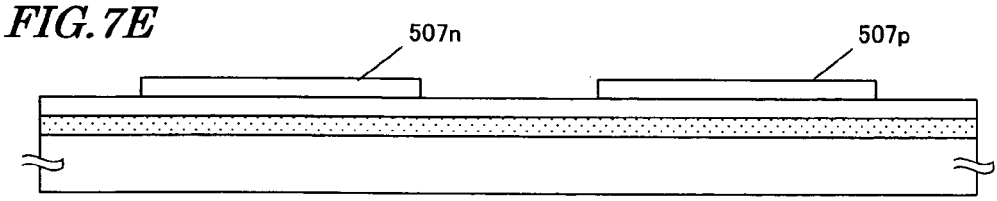

Then, a device isolation process is performed by removing unnecessary portions of the crystalline silicon film 504b. Through this step, island-shaped crystalline silicon films 507n and 507p are formed, as illustrated in FIG. 7E, which are to be the semiconductor layers of the n-channel TFT and the p-channel TFT, respectively.

Figure 7F:
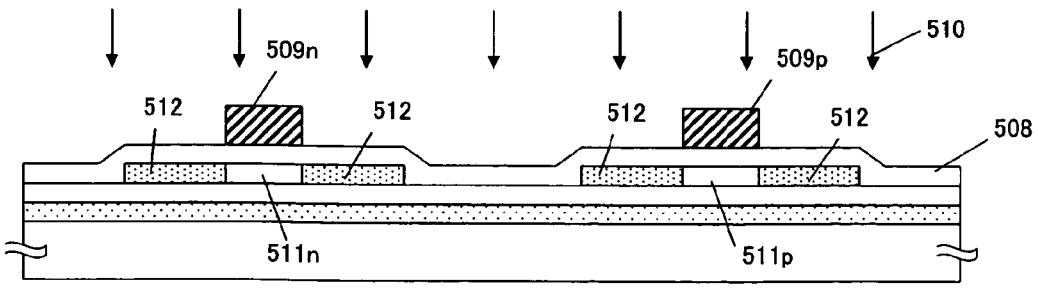

Then, a silicon oxide film having a thickness of, for example, about 100 nm, for example, is deposited as the gate insulating film 508 so as to cover the crystalline silicon films 507n and 507p, which are to be the active regions, in a manner similar to those of the first to third preferred embodiments. Then, as illustrated in FIG. 7F, a high-melting metal (tungsten in the present preferred embodiment) is deposited by a sputtering method and then patterned to form gate electrodes 509n and 509p.

Then, a low concentration of an impurity (phosphorus) 510 is implanted into the semiconductor layers in a manner similar to that of the third preferred embodiment. Through this step, regions of the semiconductor layers 507n and 507p that are not covered with the gate electrodes 509n and 509p become regions 512 doped with a low concentration of phosphorus 510, and regions that are masked with the gate electrodes 509n and 509p and are not doped with the impurity 510 will later be channel regions 511n and 511p of the n-channel TFT and the p-channel TFT. This state is shown in FIG. 7F.

Figure 8A:
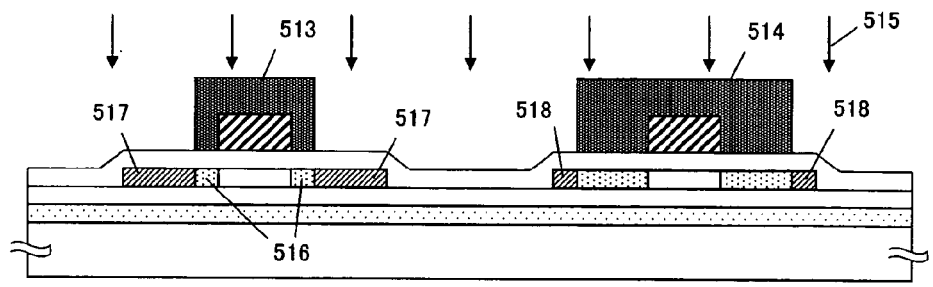
FIG. 8A to FIG. 8E are schematic cross-sectional views illustrating steps for manufacturing a semiconductor device according to a preferred embodiment of the present invention (continued from FIG. 7F).

Then, photoresist doping masks 513 and 514 are provided, as illustrated in FIG. 8A. The photoresist doping mask 513 with a thick side wall is provided over the semiconductor layer 507n of the n-channel TFT so as to cover the gate electrode 509n, as illustrated in FIG. 8A. In the p-channel TFT, the photoresist doping mask 514 with an even thicker side wall is provided so as to cover the gate electrode 509p, with only a peripheral portion of the active region 507p being exposed, as illustrated in FIG. 8A. Then, a high concentration of an impurity (phosphorus) 515 is implanted into the semiconductor layers by an ion doping method using the resist masks 513 and 514. Phosphine ($PH_3$) is preferably used as the doping gas, the acceleration voltage is preferably set to, for example, about 60 kV to about 90 kV (e.g., about 80 kV), and the dose is preferably set to, for example, about $2\times10^{15}$ to about $1\times10^{16}$ cm$^{-2}$ (e.g., about $5\times10^{15}$ cm$^{-2}$). Through this step, in the semiconductor layer 507n of the n-channel TFT, a region 517 that is not masked with the mask 513 is doped with a high concentration of phosphorus. In the semiconductor layer 507n, the region that is covered with the resist mask 513 and is not doped with a high concentration of phosphorus 515 is left as a region doped with a low concentration of phosphorus, which forms an LDD (Lightly Doped Drain) region 516. Moreover, in the p-channel TFT, a region 518 that is not masked with the mask 514 is doped with a high concentration of phosphorus. The concentration of the n-type impurity element (phosphorus) 515 in the regions 517 and 518 is, for example, preferably about $1\times10^{19}$/cm$^3$ to about $1\times10^{21}$/cm$^3$. Moreover, the concentration of the n-type impurity element (phosphorus) 510 in the LDD region 516 of the n-channel TFT is, for example, preferably in the range of about $1\times10^{7}$/cm$^3$ to about $1\times10^{19}$/cm$^3$, within which the region functions as an LDD region.

Figure 8B:
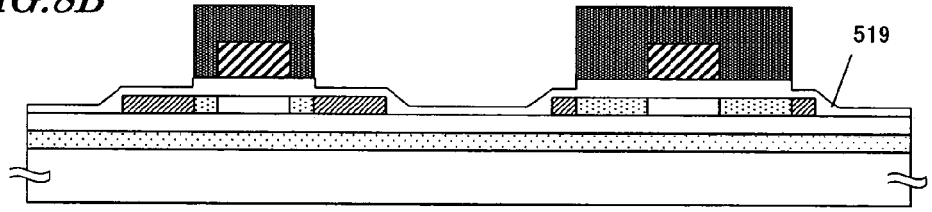

Then, as illustrated in FIG. 8B, the gate insulating film 508 is etched by using the resist masks 513 and 514, which have been used in the p-type impurity doping step, so as to form a selectively-thinned gate insulating film 519. In the present preferred embodiment, the etching process was performed by an RIE (Reactive Ion Etching) method using $CHF_3$ as the etching gas. Through this step, the gate insulating film 508 is thinned in regions where it is not covered with the masks 513 and 514. In the present preferred embodiment, the etching process was controlled so that the etch amount was about 50 nm. Therefore, the thickness of the selectively-thinned gate insulating film 519 is about 50 nm over the region 517 of the semiconductor layer 507n of the n-channel TFT and the region 518 of the semiconductor layer 507p of the p-channel TFT.

Figure 8C:
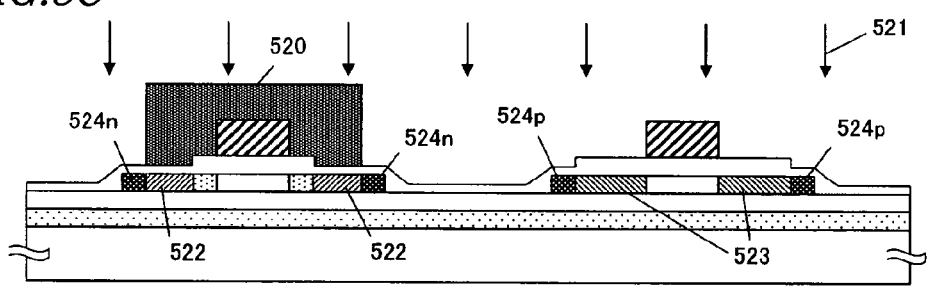
Figure 8D:
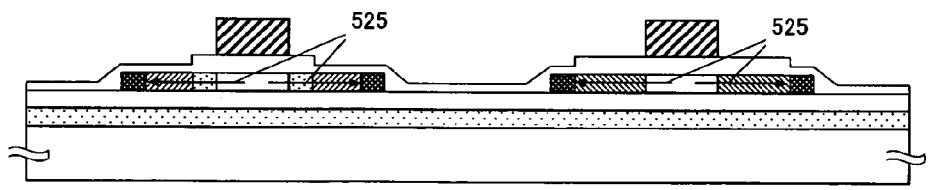

Then, after the resist masks 513 and 514 are removed, another photoresist doping mask 520 is formed over the semiconductor layer 507n of the n-channel TFT so as to cover the gate electrode 509n, with a peripheral portion of the semiconductor layer 507n being exposed, as illustrated in FIG. 8C. At this time, no mask is provided over the p-channel TFT, whereby the TFT is entirely exposed. Then, an impurity providing p-type conductivity (boron) 521 is implanted into the semiconductor layers by an ion doping method using the resist mask 520 and the gate electrode 509p of the p-channel TFT as masks. Diborane ($B_2H_6$) is preferably used as the doping gas, the acceleration voltage is preferably set to, for example, about 40 kV to about 80 kV (e.g., about 70 kV), and the dose is preferably set to, for example, about $1\times10^{15}$ cm$^{-2}$ to about $1\times10^{16}$ cm$^{-2}$ (e.g., about $7\times10^{15}$ cm$^{-2}$). While regions of the semiconductor layers 507n and 507p that are not covered with the mask 520 and the gate electrode 509p of the p-channel TFT are doped with boron through the overlying gate insulating film 519 in this step, regions 524n and 524p over which the overlying gate insulating film 519 has been thinned and the other region 523 are doped with different amounts of boron, and the resulting regions have different crystalline conditions. In the regions 524n and 524p, where the gate insulating film 319 is thin, as compared with the region 523, the boron concentration is higher. In addition, in the regions 524n and 524p, where the overlying gate insulating film 319 is thin, boron ions are implanted into the semiconductor layer with a higher acceleration voltage than in the region 523, and the ions collide with one another with higher collision energies, whereby the crystalline structure is more destroyed in the regions 524n and 524p. In contrast, in the region 523, the ion collision energy is reduced by the presence of the gate insulating film, whereby a desirable crystalline structure of the semiconductor layer is maintained.

Through this step, the conductivity type of the region 523 of the semiconductor layer 507p of the p-channel TFT, which has previously been doped with a low concentration of the n-type impurity (phosphorus) 510, is inverted from n type to p type and the region 523 will later be the source/drain region of the TFT. Moreover, the region 524p, which has previously been doped with a high concentration of phosphorus 515, is further doped with a high concentration of boron 521, and the crystalline structure thereof is destroyed, whereby the region 524p functions as a gettering region. Similarly, the region 524n of the semiconductor layer 507n of the n-channel TFT is doped with phosphorus and boron at high concentrations, as is the region 524p, and the crystalline structure thereof is destroyed, whereby the region 524n functions as a gettering region. A region 522 that is covered with the resist mask 520 and is not doped with boron is left as an n-type impurity region and will later be the source/drain region of the n-channel TFT. Thus, the gettering region and the source/drain region can easily be formed together while being given different properties suitable for the respective regions. At this point, the concentration of the p-type impurity element (boron) 521 in the gettering regions 524n and 524p is, for example, preferably about $1.5\times10^{19}$/cm$^3$ to about $3\times10^{21}$/cm$^3$.

Then, after the resist mask 520 is removed, the second heat treatment is performed in an inert atmosphere (e.g., a nitrogen atmosphere). In the present preferred embodiment, an RTA (Rapid Thermal Annealing) process was used. The RTA apparatus used was an apparatus capable of performing an annealing process in a nitrogen atmosphere while rapidly increasing and decreasing the temperature by blowing a high-temperature nitrogen gas onto the surface of the substrate. Specifically, the substrate is held at about 550° C. to about 750° C. for about 30 seconds to 10 minutes, more preferably at about 600° C. to about 700° C. for about 1 to 7 minutes. In the present preferred embodiment, an RTA process was performed at about 670° C. for approximately 5 minutes. The temperature-increasing rate and the temperature-decreasing rate are preferably about 100° C./min or more (about 250° C./min in the present preferred embodiment). In this heat treatment step, phosphorus and boron doped at high concentrations into the gettering regions 524n and 524p formed outside the source/drain regions in the semiconductor layers 507n and 507p, respectively, increase the solid solubility of the regions for nickel, and also form segregation sites for nickel. Moreover, the regions 524n and 524p are amorphized in the doping step because the overlying gate insulating film has been thinned, whereby crystal defects and dangling bonds therein also function as segregation sites for nickel. These factors synergistically increase the gettering effect. As a result, in the semiconductor layer 507n of the n-channel TFT, nickel present in the channel region 511n, the LDD region 516 and the source/drain region 522 is moved from the channel region to the LDD region, the source/drain region and to the gettering region 524n as indicated by arrow 525 in FIG.

8D. Although the source/drain region 522 doped only with phosphorus has a gettering effect, the gettering region 524n, which is doped with boron in addition to phosphorus and is more amorphized, has a much higher gettering capability, whereby nickel is collected into the gettering region 524n. Moreover, in the semiconductor layer 507p of the p-channel TFT, the gettering region 524p formed outside the source/drain region has a very high gettering capability as does the gettering region 524n of the n-channel TFT, and thus moves nickel present in the channel region 511p and a source/drain region 523 from the channel region to the source/drain region and to the gettering region 524p as indicated by arrow 525. In the second heat treatment for gettering, the catalyst element moves into the gettering regions 524n and 524p, whereby the concentration of the catalyst element therein is preferably about $1 \times 10^{19}/cm^3$ or more.

This heat treatment step also activates the n-type impurity (phosphorus) doped into the source/drain region 522 and the LDD region 516 of the n-channel TFT and the p-type impurity (boron) doped into the source/drain region 523 of the p-channel TFT. As a result, the sheet resistance value of the source/drain region 522 of the n-channel TFT was about 0.5 kΩ/square to about 1.5 kΩ/square, and the sheet resistance value of the LDD region 516 was about 40 kΩ/square to about 80 kΩ/square. Moreover, the sheet resistance value of the source/drain region 523 of the p-channel TFT was about 1 kΩ/square to about 2 kΩ/square. In the gettering regions 524n and 524p, carriers (electrons and holes) introduced by the n-type impurity element (phosphorus) and the p-type impurity element (boron) cancel each other, and the gettering regions 524n and 524p are subject to an implantation damage because the overlying gate insulating film has been thinned. Therefore, the sheet resistance values of the gettering regions 524n and 524p are on the order of about 10 kΩ/square, whereby the regions 524n and 524p cannot function as source/drain regions. However, the gettering regions 524n and 524p are formed separately from the source region and the drain region in such an arrangement such that they do not interfere with the movement of carriers in the TFTs. Therefore, the sheet resistance values of the gettering regions 524n and 524p do not hinder the operation of the transistors. After this step, the ratio Pa/Pc between the TO-phonon peak Pa of amorphous Si and the TO-phonon peak Pc of crystalline Si in the Raman spectrum as measured by laser Raman spectroscopy was larger in the gettering regions 524n and 524p than in the channel regions or the source/drain regions.

Figure 8E:
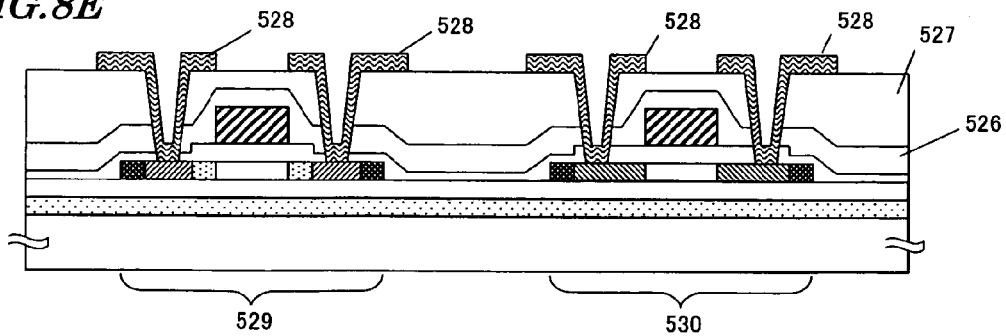

Then, as illustrated in FIG. 8E, an interlayer insulating film is formed. In the present preferred embodiment, a silicon nitride film 526 having a thickness of, for example, about 200 nm and a silicon oxide film 527 having a thickness of, for example, about 700 nm were deposited on one another, thereby providing a two-layer film. Then, another heat treatment is performed at about 300° C. to about 500° C. for about 1 hour. This step is performed for terminating and inactivating dangling bonds that deteriorate the TFT characteristics by supplying hydrogen atoms to the interface between the semiconductor layer and the gate insulating film from the interlayer insulating film (particularly the silicon nitride film 526).

Then, contact holes are made in the interlayer insulating film, and an electrode/line 528 of the TFT is formed by using a metal film, e.g., a two-layer film of titanium nitride and aluminum. Finally, an annealing process is performed at about 350° C. for approximately 1 hour, thereby obtaining an n-channel TFT 529 and a p-channel TFT 530 as illustrated in FIG. 8E. As necessary, additional contact holes may be made over the gate electrodes 509n and 509p for providing necessary connection between electrodes with the line 528. Moreover, a protection film made of silicon nitride, or other suitable material, may be further provided on each TFT for the purpose of protecting the TFT.

Each TFT produced according to the present preferred embodiment exhibited a desirable field-effect mobility and a desirable threshold voltage as in the third and fourth preferred embodiments. In addition, as in the fourth preferred embodiment, since the n-channel TFT and the p-channel TFT of the present preferred embodiment each have a dedicated gettering region having a strong gettering capability in the semiconductor layer, it is possible to perform a strong gettering process, thereby further reducing the nickel concentration in the channel region and in the junction between the channel region and the source/drain region. The n-channel TFT and the p-channel TFT produced according to the present preferred embodiment exhibited no abnormal increase in the TFT off-state leak current, which is frequently seen in the prior art, and substantially no characteristics deterioration was observed in tests for the resistance to repeated operations, the resistance to bias voltages and the resistance to thermal stresses, indicating a much higher reliability as a semiconductor device over the prior art.

Moreover, in the present preferred embodiment, as in the fourth preferred embodiment, the gettering region can be formed in the source/drain region formation step for each of the n-channel TFT and the p-channel TFT. Therefore, it is possible to eliminate additional steps for the gettering process (a photolithography step, a doping step and an annealing step). As a result, it is possible to simplify the manufacturing process while reducing the manufacturing cost of the semiconductor device and improving the production yield.

Sixth Preferred Embodiment

The sixth preferred embodiment of the present invention will now be described. The present preferred embodiment is also directed to a process of producing, on a glass substrate, a circuit having a CMOS structure including a complementary set of an n-channel TFT and a p-channel TFT.

FIG. 9A to FIG. 9F and FIG. 10A to FIG. 10E are cross-sectional views sequentially illustrating steps for producing the TFTs of the present preferred embodiment.

Figure 9A:
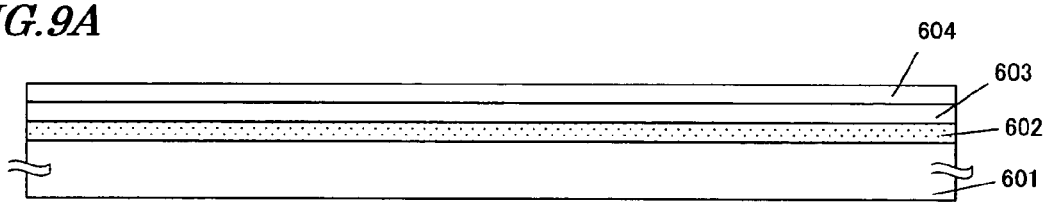
FIG. 9A to FIG. 9F are schematic cross-sectional views illustrating steps for manufacturing a semiconductor device according to a preferred embodiment of the present invention.
Figure 9B:
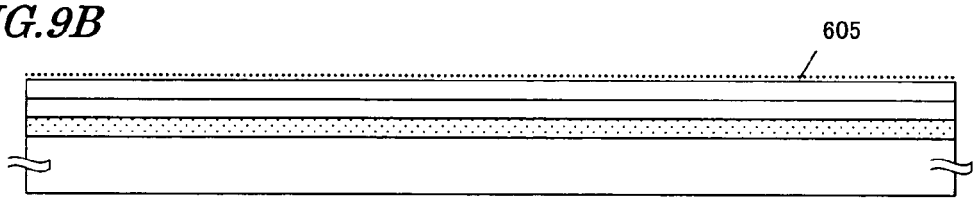

Referring to FIG. 9A, a silicon oxide nitride film as a lower first base film 602 and a silicon oxide film as a second base film 603 are formed in this order on the TFT side of a glass substrate 601, and an a-Si film 604 having a thickness of, for example, about 50 nm, for example, is formed thereon, in a manner similar to those of the first to third preferred embodiments. Then, as illustrated in FIG. 9B, a small amount of nickel 605 is added to the surface of the a-Si film 604 in a manner similar to those of the first to third preferred embodiments.

Figure 9C:
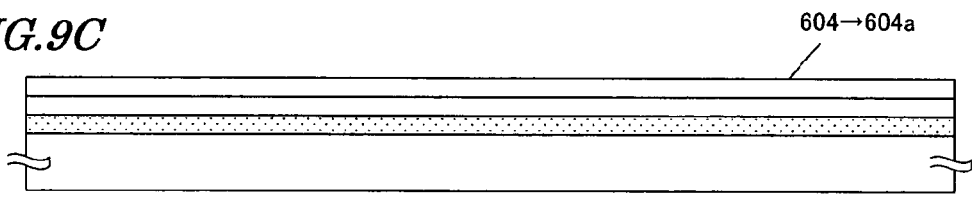
Figure 9D:
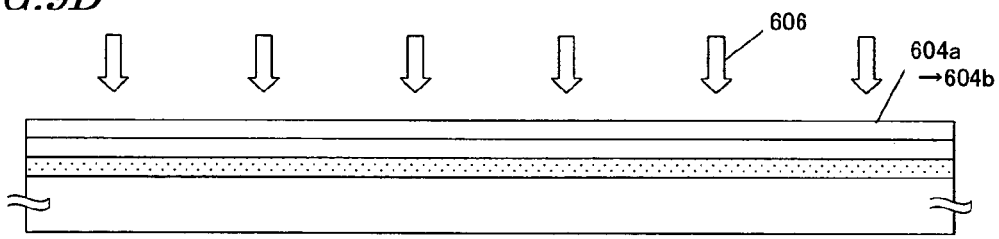

Then, a first heat treatment is performed so as to crystallize the a-Si film 604 in solid phase using nickel 605 added to the a-Si film 604 as a catalyst, thereby obtaining a crystalline silicon film 604a. This state is shown in FIG. 9C. Then, as illustrated in FIG. 9D, the crystalline silicon film 604a is irradiated with laser light 606, in a manner similar to those of the first to third preferred embodiments, so as to improve the crystallinity thereof, thereby obtaining a crystalline silicon film 604b of a higher quality.

Figure 9E:
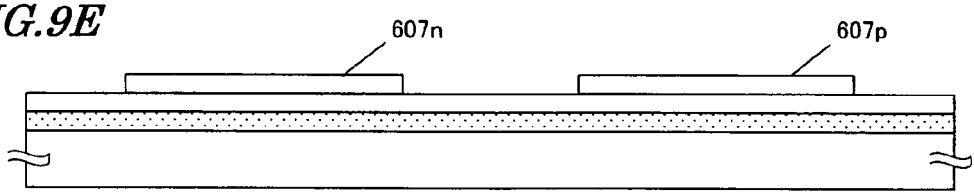

Then, a device isolation process is performed by removing unnecessary portions of the crystalline silicon film 604b. Through this step, island-shaped crystalline silicon films 607n and 607p are formed, as illustrated in FIG. 9E, which are to be the semiconductor layers of the n-channel TFT and the p-channel TFT, respectively.

Figure 9F:
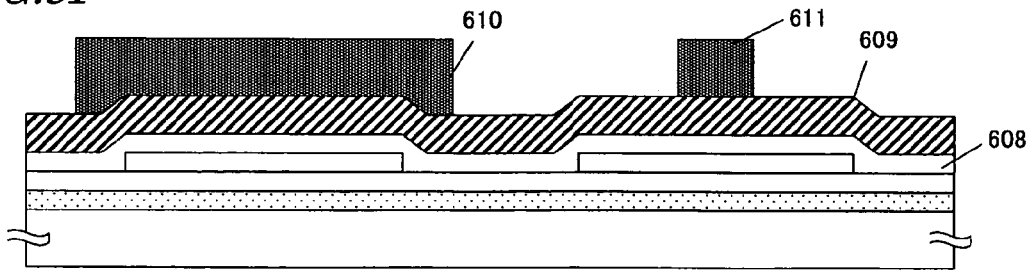

Then, as illustrated in FIG. 9F, a gate insulating film 608 having a thickness of, for example, 100 nm, for example, is formed, and a conductive film 609 is formed thereon by a sputtering method, a CVD method, or other suitable method. The material of the conductive film may be any one of W, Ta, Ti and Mo, which are high-melting metals, or an alloy material thereof.

Then, resist masks 610 and 611 are formed on the conductive film 609. This state is shown in FIG. 9F. Then, the conductive film 609 is etched to form a second gate electrode conductive layer 612 and a first gate electrode 613. The second gate electrode conductive layer 612 is formed so as to entirely cover the semiconductor layer 607n of the n-channel TFT. The first gate electrode 613 is the gate electrode of the p-channel TFT.

Figure 10A:
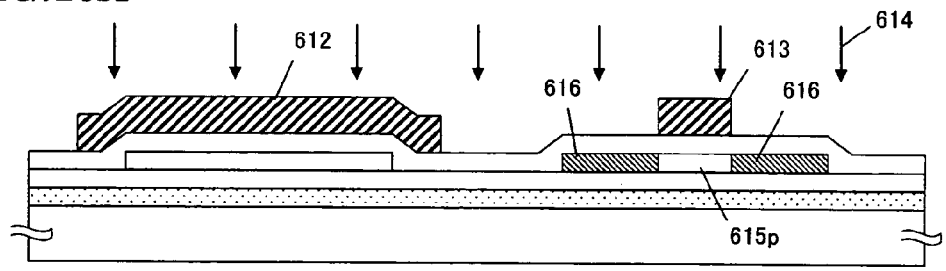
FIG. 10A to FIG. 10E are schematic cross-sectional views illustrating steps for manufacturing a semiconductor device according to a preferred embodiment of the present invention (continued from FIG. 9F).

Then, after the resist masks 610 and 611 are removed, an impurity providing p-type conductivity (boron) 614 is implanted into the semiconductor layer 607p of the p-channel TFT by an ion doping method using the second gate electrode conductive layer 612 and the first gate electrode 613 as masks, as illustrated in FIG. 10A. Diborane ($B_2H_6$) is preferably used as the doping gas, the acceleration voltage is preferably set to, for example, about 40 kV to about 80 kV (e.g., about 70 kV), and the dose is preferably set to, for example, about $1\times10^{15}$ to about $1\times10^{16}$ cm$^{-2}$ (e.g., about $5\times10^{15}$ cm$^{-2}$). Through this step, a region of the semiconductor layer 607p of the p-channel TFT other than a channel region 615p under the first gate electrode 613 is doped with a high concentration of boron 614, thus forming a region 616 doped with a p-type impurity. On the other hand, the semiconductor layer 607n of the n-channel TFT is not doped with boron 614 because it is entirely covered with the second gate electrode conductive layer 612. Note that while the doping step is performed after the resist masks 610 and 611 are removed in the present preferred embodiment, it may alternatively be performed in the presence of the resist masks 610 and 611, thereafter removing the resist masks 610 and 611.

Figure 10B:
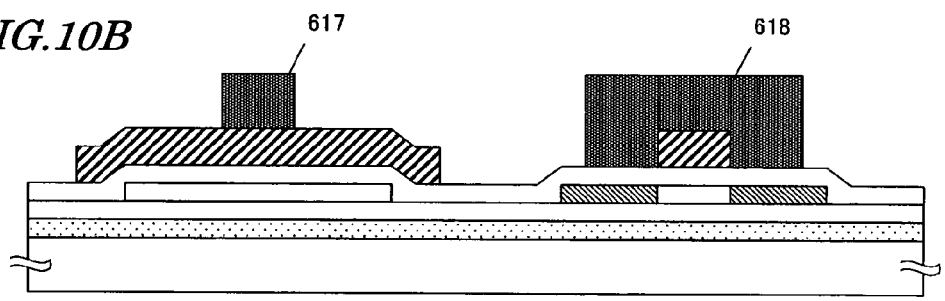

Then, as illustrated in FIG. 10B, a photoresist doping mask 617 is provided on the second gate electrode conductive layer 612 so that the width of the mask 617 is smaller than that of the second gate electrode conductive layer 612, and a photoresist doping mask 618 with a thick side wall is provided over the semiconductor layer 607p of the p-channel TFT so as to cover the first gate electrode 613, with only a peripheral portion of the semiconductor layer 607p being exposed.

Then, using the resist masks 617 and 618, the second gate electrode conductive layer 612 is etched to form a second gate electrode 619 while etching unmasked portions of the gate insulating film 608 to form a selectively-thinned gate insulating film 620. The second gate electrode 619 is the gate electrode of the n-channel TFT. In this step, portions of the gate insulating film 608 that are not masked with the resist mask 618 or the second gate electrode conductive layer 612 are subject to the etching atmosphere from the beginning of the etching process. Thus, the portions of the gate insulating film 608 are thinned while forming the second gate electrode 619. In the present preferred embodiment, the etching process was controlled so that the gate insulating film 608 is etched by an etch amount of, for example, about 30 nm. As a result, the thickness of the thinned portions of the selectively-thinned gate insulating film 620 is, for example, preferably about 70 nm.

Figure 10C:
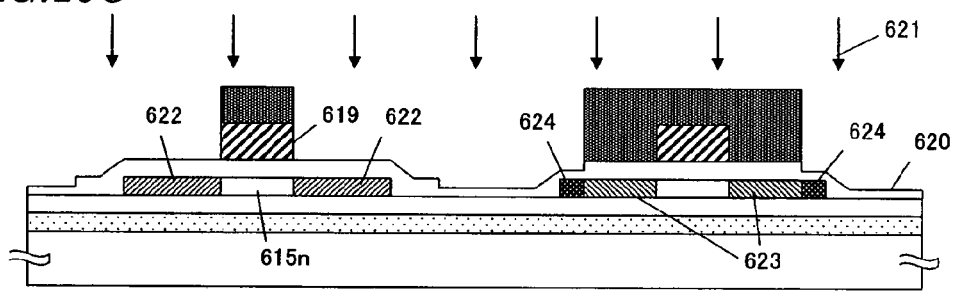
Figure 10D:
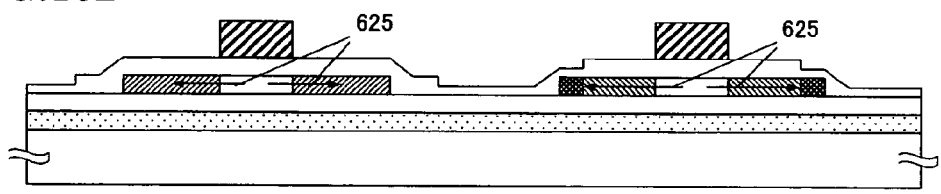

Then, as illustrated in FIG. 10C, an n-type impurity element (phosphorus in the present preferred embodiment) 621 is implanted. Phosphine ($PH_3$) is preferably used as the doping gas, the acceleration voltage is preferably set to, for example, about 60 kV to about 90 kV (e.g., about 80 kV), and the dose is preferably set to, for example, about $1\times10^{15}$ to about $1\times10^{16}$ cm$^{-2}$ (e.g., about $5\times10^{15}$ cm$^{-2}$). Through this step, a region 622 of the semiconductor layer 607n of the n-channel TFT, which is not masked with the second gate electrode 619, is doped with the impurity (phosphorus) 621, and the region 622 will later be the source/drain region of the n-channel TFT. A region 615n under the second gate electrode 619, which is not doped with phosphorus, will later be the channel region of the n-channel TFT. In the semiconductor layer 607p of the p-channel TFT, a higher concentration of phosphorus 621 is implanted into a region 624 that is not masked with the resist mask 618 and over which the gate insulating film 620 has been thinned. The concentration of the n-type impurity element (phosphorus) 621 in the region 624 is, for example, about $1\times10^{19}$/cm$^3$ to about $1\times10^{21}$/cm$^3$, and the region 624 functions as a gettering region in the p-channel TFT. Moreover, a region 623 that is covered with the resist mask 618 and is not doped with phosphorus is left as a p-type impurity region and will later be the source/drain region of the p-channel TFT.

While the gettering region 624 of the p-channel TFT and the source/drain region 622 of the n-channel TFT are formed in the same doping step, these regions are doped with phosphorus differently because the thickness of the overlying gate insulating film 620 over the gettering region 624 is different from that over the source/drain region 622. The region 622 is doped with phosphorus through the overlying gate insulating film 620 having a thickness of about 100 nm, whereas the region 624 is doped with phosphorus through the overlying gate insulating film 620 having a thickness of, for example, about 70 nm in the present preferred embodiment, whereby the region 624 is doped with a higher concentration of phosphorus. FIG. 19 shows the doping profile for an acceleration voltage of about 70 kV. The doping profile for an acceleration voltage of about 80 kV, as in the present preferred embodiment, can be approximately calculated by multiplying the horizontal axis of FIG. 19 by about 8/7. Therefore, it can be seen that the phosphorus concentration in the gettering region 624 of the p-channel TFT is about 3 times as high as that in the source/drain region 622 of the n-channel TFT. In addition, in the region 624, where the thickness of the overlying gate insulating film is reduced, phosphorus ions are implanted into the semiconductor layer with a higher acceleration voltage than in the region 622, where the gate insulating film is thick, and the ions collide with one another with higher collision energies, thereby amorphizing the semiconductor layer by destroying the crystalline structure thereof in the region 624. In contrast, in the region 622, the ion collision energy is reduced by the presence of the gate insulating film, whereby the semiconductor layer is not amorphized and the crystalline structure thereof is maintained.

Then, after the resist masks 617 and 618 are removed, a second heat treatment is performed in an inert atmosphere (e.g., a nitrogen atmosphere). In the present preferred embodiment, a heat treatment was performed using a common diffusion furnace at about 550° C. for approximately 4 hours. Other methods may be used for the heat treatment, and the conditions therefor may be determined appropriately for each specific application. In this heat treatment step, phosphorus doped into the source/drain region 622 in the semiconductor layer 607n of the n-channel TFT increases the solid solubility of the region for nickel. Then, nickel present in the channel region 615n is moved from the channel region to the source/drain region 622 as indicated by arrow 625 in FIG. 10D. Moreover, phosphorus and boron doped at high concentrations into the gettering region 624 formed outside the source/drain region in the semiconductor layer 607p of the p-channel TFT, and crystal defects, etc., which are amorphous components, created during the phosphorus doping process, move nickel present in the channel region 615p and the source/drain region 623 from the channel region to the source/drain region and to the gettering region 624 as indicated by arrow 625. Since nickel moves into the gettering region 624 in the heat treatment step, the nickel concentration in the gettering region 624 is preferably about $1 \times 10^{19}/cm^3$ or more. Note that in the present preferred embodiment, the source/drain region 622 is used as the gettering region in the n-channel TFT. Therefore, the gettering effect of the n-channel TFT is smaller than that of the p-channel TFT having the dedicated gettering region 624. However, a certain degree of gettering effect can be obtained because the gettering region can be formed with a large area and the distance required for gettering is reduced.

This heat treatment step also activates the n-type impurity (phosphorus) doped into the source/drain region 622 of the n-channel TFT and the p-type impurity (boron) doped into the source/drain region 623 of the p-channel TFT. As a result, the sheet resistance value of the source/drain region 622 of the n-channel TFT was about 0.5 k$\Omega$/square to about 1 k$\Omega$/square, and the sheet resistance value of the source/drain region 623 of the p-channel TFT was about 1 k$\Omega$/square to about 1.5 k$\Omega$/square. In the gettering region 624, carriers (electrons and holes) introduced by the n-type impurity element (phosphorus) and the p-type impurity element (boron) cancel each other, and the gettering region 624 is subject to an implantation damage because the overlying gate insulating film has been thinned. Therefore, the sheet resistance value of the gettering region 624 is on the order of about 10 k$\Omega$/square, whereby the region 624 cannot function as a source/drain region. However, the gettering region 624 is formed in the semiconductor layer of the p-channel TFT separately from the source region and the drain region in such an arrangement that it does not interfere with the movement of carriers in the TFT. Therefore, the sheet resistance value of the gettering region 624 does not hinder the operation of the transistor. After this step, the ratio Pa/Pc between the TO-phonon peak Pa of amorphous Si and the TO-phonon peak Pc of crystalline Si in the Raman spectrum as measured by laser Raman spectroscopy was larger in the gettering region 624 than in the channel region 615p or the source/drain region 623.

Figure 10E:
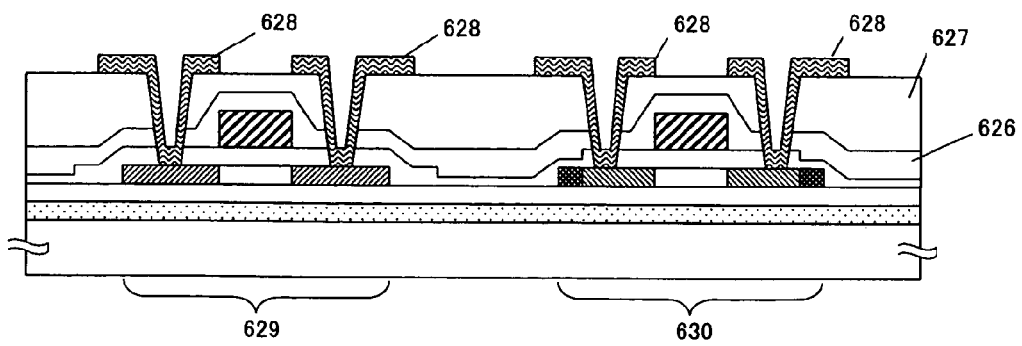

Then, as illustrated in FIG. 10E, an interlayer insulating film is formed. In the present preferred embodiment, a silicon nitride film 626 having a thickness of, for example, about 200 nm and a silicon oxide film 627 having a thickness of, for example, about 700 nm were deposited on one another, thereby providing a two-layer film.

Then, another heat treatment is performed at about 300° C. to about 500° C. for about 1 hour. This step is performed for terminating and inactivating dangling bonds that deteriorate the TFT characteristics by supplying hydrogen atoms from the interlayer insulating film (particularly the silicon nitride film 626) to the interface between the active region and the gate insulating film.

Then, contact holes are made in the interlayer insulating film, and an electrode/line 628 of the TFT is formed by using a metal film, thereby completing an n-channel TFT 629 and a p-channel TFT 630 as illustrated in FIG. 10E. As necessary, additional contact holes may be made over the gate electrodes 619 and 613 for providing necessary connection between electrodes with the line 628.

Each TFT produced according to the present preferred embodiment exhibits a desirable field-effect mobility as in the other preferred embodiments above. Moreover, in the present preferred embodiment, as compared with the third to fifth preferred embodiments, the gate electrode can be used as a doping mask in the step of forming the source/drain region and the gettering region for each of the n-channel TFT and the p-channel TFT. Therefore, it is possible to further eliminate the photolithography step, whereby it is possible to simplify the manufacturing process while reducing the manufacturing cost of the semiconductor device and improving the production yield.

Seventh Preferred Embodiment

The seventh preferred embodiment of the present invention will now be described. The present preferred embodiment is also directed to a process of producing, on a glass substrate, a circuit having a CMOS structure including a complementary set of an n-channel TFT and a p-channel TFT.

FIG. 11A to FIG. 11F and FIG. 12A to FIG. 12E are cross-sectional views sequentially illustrating steps for producing the TFTs of the present preferred embodiment.

Figure 11A:
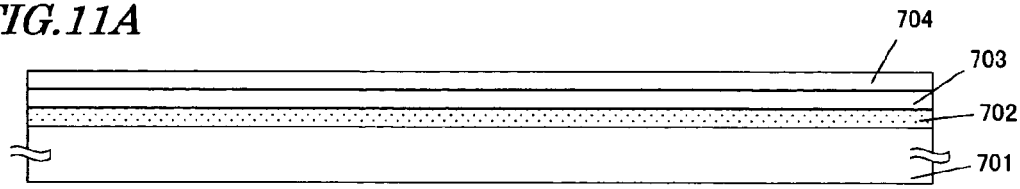
FIG. 11A to FIG. 11F are schematic cross-sectional views illustrating steps for manufacturing a semiconductor device according to a preferred embodiment of the present invention.
Figure 11B:
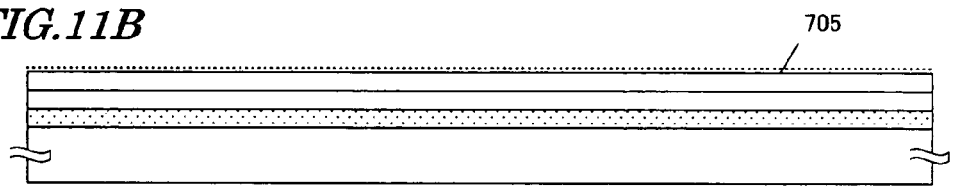

Referring to FIG. 11A, a silicon oxide nitride film as a lower first base film 702 and a silicon oxide film as a second base film 703 are formed in this order on the TFT side of a glass substrate 701, and an a-Si film 704 having a thickness of, for example, about 50 nm, for example, is formed thereon, in a manner similar to those of the first to third preferred embodiments. Then, as illustrated in FIG. 11B, a small amount of nickel 705 is added to the surface of the a-Si film 704 in a manner similar to those of the first to third preferred embodiments.

Figure 11C:
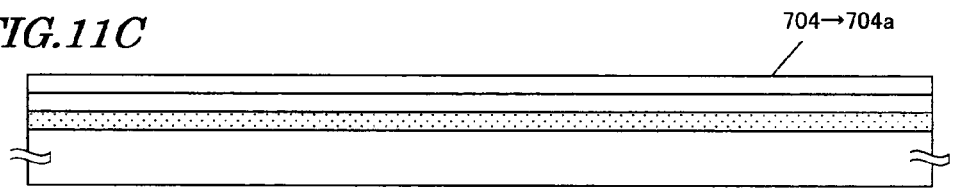
Figure 11D:
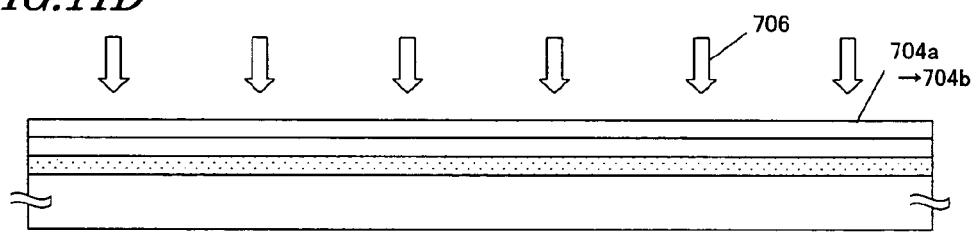
Figure 11E:
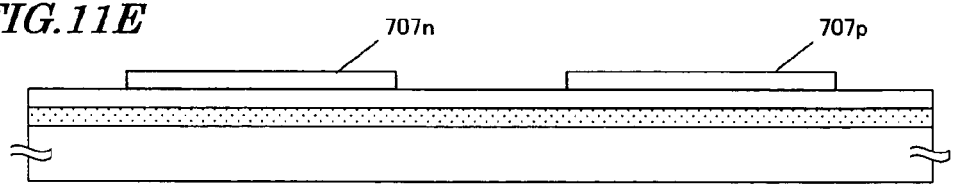

Then, a first heat treatment is performed so as to crystallize the a-Si film 704 in solid phase using nickel 705 added to the a-Si film 704 as a catalyst, thereby obtaining a crystalline silicon film 704a. This state is shown in FIG. 11C. Then, as illustrated in FIG. 11D, the crystalline silicon film 704a is irradiated with laser light 706, in a manner similar to those of the first to third embodiments, so as to improve the crystallinity thereof, thereby obtaining a crystalline silicon film 704b of a higher quality.

Then, a device isolation process is performed by removing unnecessary portions of the crystalline silicon film 704b. Through this step, island-shaped crystalline silicon films 707n and 707p are formed, as illustrated in FIG. 1E, which are to be the semiconductor layers of the n-channel TFT and the p-channel TFT, respectively.

Figure 11F:
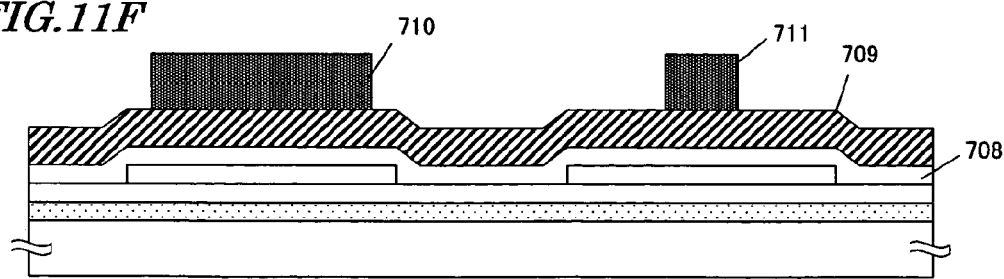

Then, a gate insulating film 708 having a thickness of, for example, about 100 nm, for example, is formed, and a conductive film 709 is formed thereon by a sputtering method, a CVD method, or other suitable process. The material of the conductive film may be any one of W, Ta, Ti and Mo, which are high-melting metals, or an alloy material thereof. In the present preferred embodiment, W was used. Then, resist masks 710 and 711 are formed on the conductive film 709. The masks 710 and 711 are masks used for forming gate electrodes. In the present preferred embodiment, a second gate electrode conductive layer is used as a mask for forming a region (the gettering region) in which an impurity element providing p-type conductivity is added to the semiconductor layer in the n-channel TFT. Therefore, the width of the mask 710 of the n-channel TFT is larger than that of the mask 711 of the p-channel TFT. This state is shown in FIG. 11F.

Figure 12A:
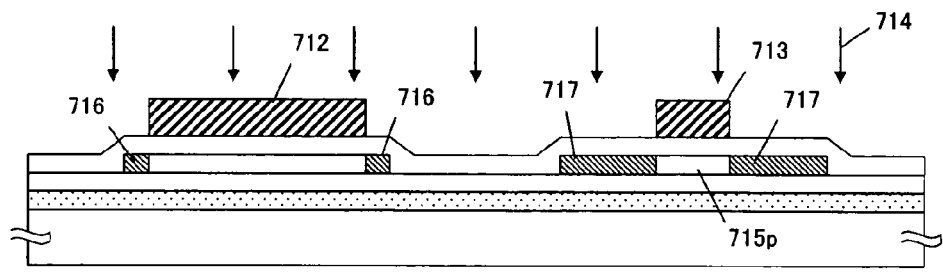
FIG. 12A to FIG. 12E are schematic cross-sectional views illustrating steps for manufacturing a semiconductor device according to a preferred embodiment of the present invention (continued from FIG. 11F).

Then, the conductive film 709 is etched to form a second gate electrode conductive layer 712 and a first gate electrode 713. In the n-channel TFT, the second gate electrode conductive layer 712 covers the semiconductor layer 707n, with only a peripheral portion of the semiconductor layer 707n being exposed. The first gate electrode 713 is the gate electrode of the p-channel TFT. Then, after the resist masks 710 and 711 are removed, an impurity providing p-type conductivity (boron) 714 is implanted into the semiconductor layers by an ion doping method using the second gate electrode conductive layer 712 and the first gate electrode 713 as masks, as illustrated in FIG. 12A. Diborane ($B_2H_6$) is preferably used as the doping gas, the acceleration voltage is preferably set to, for example, about 40 kV to about 80 kV (e.g., about 70 kV), and the dose is preferably set to, for example, about $1\times10^{15}$ cm$^{-2}$ to about $1\times10^{16}$ cm$^{-2}$ (e.g., about $7\times10^{15}$ cm$^{-2}$). Through this step, a region 716 of the semiconductor layer 707$n$ of the n-channel TFT, which is not masked with the second gate electrode conductive layer 712, is doped with boron. In the semiconductor layer 707$p$ of the p-channel TFT, a region 717 other than a channel region 715$p$ under the gate electrode 713 is doped with boron 714. At this point, the concentration of the p-type impurity element (boron) 714 in the region 716 and the region 717 is, for example, preferably about $1.5\times10^{19}$/cm$^3$ to about $3\times10^{21}$/cm$^3$.

Figure 12B:
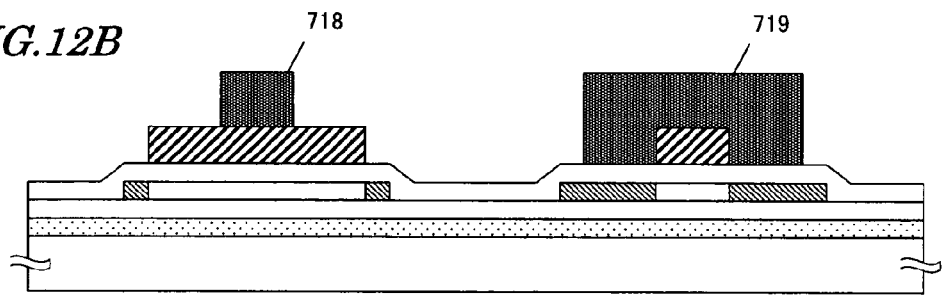

Then, a resist mask 718 is formed for etching the second gate electrode conductive layer 712 of the n-channel TFT into a predetermined pattern, and a resist mask 719 is formed for forming a gettering region in the semiconductor layer of the p-channel TFT. The mask 718 is formed so that the width of the mask 718 is smaller than that of the second gate electrode conductive layer 712. This state is shown in FIG. 12B.

Then, a second gate electrode 720 having a predetermined shape is formed in the n-channel TFT by an etching process. In the present preferred embodiment, the etching process was performed by an ICP (Inductively Coupled Plasma) etching method using etching gases of $CF_4$, $Cl_2$ and $O_2$ at a flow rate ratio of 25/25/10 (sccm) and by creating a plasma by supplying an RF (about 13.56 MHz) power of about 500 W through a coil electrode at a pressure of about 1 Pa. Also to the substrate (sample stage), an RF (about 13.56 MHz) power of about 150 W was supplied, thereby substantially applying a negative self-bias voltage. In this etching step, portions of the gate insulating film 708 that are not masked with the second gate electrode conductive layer 712 or the resist mask 719 are subject to the etching atmosphere from the beginning of the etching process. Thus, the portions of the gate insulating film 708 are thinned. The amount by which the gate insulating film 708 is thinned can be controlled by adjusting the flow rate ratio among the etching gases. In the present preferred embodiment, the etching process was controlled so that the gate insulating film 708 is etched by an etch amount of, for example, about 50 nm. Thus, in this step, the gate insulating film 708 is thinned while forming the second gate electrode 720, thereby obtaining a selectively-thinned gate insulating film 721. In the present preferred embodiment, the thickness of the thinned portions of the gate insulating film 721 is, for example, preferably about 50 nm. The second gate electrode 720 is the gate electrode of the n-channel TFT.

Figure 12C:
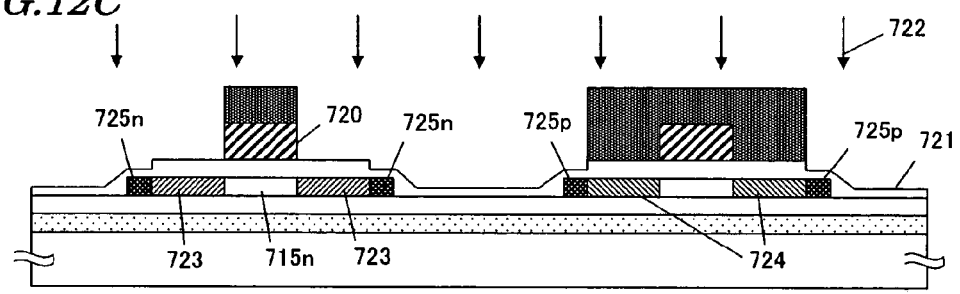
Figure 12D:
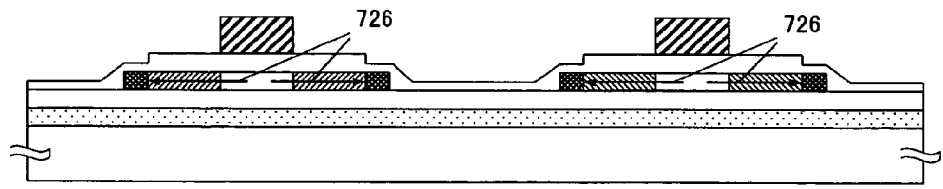

Then, a high concentration of an impurity (phosphorus) 722 is implanted into the semiconductor layers by an ion doping method, as illustrated in FIG. 12C. In the semiconductor layer 707$n$ of the n-channel TFT, phosphorus is implanted into a region other than under the gate electrode 720, whereas in the p-channel TFT, phosphorus is implanted into a region of the semiconductor layer 707$p$ that is not masked with the photoresist mask 719, which is formed with a thick side wall so as to cover the gate electrode 713, with only a peripheral portion of the semiconductor layer 707$p$ being exposed. Phosphine ($PH_3$) is preferably used as the doping gas, the acceleration voltage is preferably set to, for example, about 60 kV to about 90 kV (e.g., about 70 kV), and the dose is preferably set to, for example, about $2\times10^{15}$ cm$^{-2}$ to about $1\times10^{16}$ cm$^{-2}$ (e.g., about $5\times10^{15}$ cm$^{-2}$). The semiconductor layer is doped with phosphorus 722 through the overlying gate insulating film 721. Therefore, a region over which the gate insulating film has been thinned and the other region are doped with phosphorus quite differently due to the difference in the thickness of the overlying gate insulating film 721.

FIG. 19 shows the doping profile. The region 723 is doped with phosphorus through the overlying gate insulating film 721 having a thickness of, for example, about 100 nm. Therefore, the depth range of, for example, about 1000 Å to about 1500 Å (about 100 nm to about 150 nm) in FIG. 19 represents the concentration of phosphorus implanted into the silicon film in the region 723. In contrast, in regions 725$n$ and 725$p$, the overlying gate insulating film has been thinned to, for example, about 50 nm in the present preferred embodiment. Therefore, the depth range of, for example, about 500 Å to about 1000 Å (about 50 nm to about 100 nm) in FIG. 19 represents the concentration of phosphorus implanted into the silicon film in the regions 725$n$ and 725$p$. Thus, there is a significant concentration difference between the region 723 and the regions 725$n$ and 725$p$, where the overlying gate insulating film has been thinned, though these regions are doped in the same doping step, with the actual amount of phosphorus in the regions 725$n$ and 725$p$ being greater than that in the region 723 by a factor of about 5 or more. In addition, in the regions 725$n$ and 725$p$, where the overlying gate insulating film has been thinned, phosphorus ions are implanted into the semiconductor layer with a higher acceleration voltage than in the region 723, where the gate insulating film is thick, and the ions collide with one another with higher collision energies, thereby amorphizing the semiconductor layer by destroying the crystalline structure thereof in the regions 725$n$ and 725$p$. In contrast, in the region 723, the ion collision energy is reduced by the presence of the gate insulating film, whereby the semiconductor layer is not amorphized and the crystalline structure thereof is maintained.

In the n-channel TFT, a region 715$n$ that is located under the gate electrode 720 and is not doped with phosphorus will later be the channel region, and the region 723 and the region 725$n$ will later be the source/drain region and the gettering region, respectively, of the n-channel TFT. In the p-channel TFT, the region 725$p$ doped with a high concentration of the impurity (phosphorus) 722 will later be the gettering region, and a region 724 that is covered with the resist mask 719 and is not doped with a high concentration of phosphorus is left as a p-type impurity region and will later be the source/drain region of the p-channel TFT. At this point, the gettering regions 725$n$ and 725$p$ have been doped with boron 714 (in the previous step) and with a high concentration of phosphorus 722 (in the current step). Thus, the gettering region and the source/drain region can easily be formed together while being given different properties suitable for the respective regions. At this point, the concentration of the n-type impurity element (phosphorus) 722 in the gettering regions 725$n$ and 725$p$ is preferably about $1\times10^{19}$/cm$^3$ to about $1\times10^{21}$/cm$^3$.

Then, after the resist masks 718 and 719 are removed, the second heat treatment is performed in an inert atmosphere (e.g., a nitrogen atmosphere). In the present preferred embodiment, an RTA (Rapid Thermal Annealing) process was used. Specifically, the RTA process was performed in a nitrogen atmosphere at about 670° C. for approximately 5 minutes by using an RTA apparatus capable of rapidly increasing and decreasing the temperature by blowing a high-temperature nitrogen gas onto the surface of the substrate. In this heat treatment step, phosphorus and boron doped at high concentrations into the gettering regions 725$n$ and 725$p$ formed outside the source/drain regions in the semiconductor layers 707n and 707p, respectively, increase the solid solubility of the regions for nickel, and also form segregation sites for nickel. Moreover, the regions 725n and 725p are amorphized in the doping step because the overlying gate insulating film has been thinned, and the free energy for nickel is lowered therein, whereby crystal defects and dangling bonds also function as segregation sites for nickel. These factors synergistically increase the gettering effect. As a result, in the semiconductor layer 707n of the n-channel TFT, nickel present in the channel region 715n and the source/drain region 723 is moved from the channel region to the source/drain region and to the gettering region 725n as indicated by arrow 726 in FIG. 12D. Although the source/drain region 723 doped only with phosphorus has a gettering effect, the gettering region 725n, which is doped with more phosphorus and amorphized and is also doped with boron, has a much higher gettering capability, whereby nickel is collected into the gettering region 725n. Moreover, in the semiconductor layer 707p of the p-channel TFT, the gettering region 725p formed outside the source/drain region has a very high gettering capability as does the gettering region 725n of the n-channel TFT, and thus moves nickel present in the channel region 715p and the source/drain region 724 from the channel region to the source/drain region and to the gettering region 725p as indicated by arrow 726. In the second heat treatment for gettering, the catalyst element moves into the gettering regions 725n and 725p, whereby the concentration of the catalyst element therein is, for example, preferably about $1 \times 10^{19}/cm^3$ or more.

This heat treatment step also activates the n-type impurity (phosphorus) doped into the source/drain region 723 of the n-channel TFT and the p-type impurity (boron) doped into the source/drain region 724 of the p-channel TFT. As a result, the sheet resistance value of the source/drain region 723 of the n-channel TFT was about 0.5 kΩ/square to about 1.5 kΩ/square, and the sheet resistance value of the source/drain region 724 of the p-channel TFT was about 1 kΩ/square to about 2 kΩ/square. However, the gettering regions 725n and 725p have been amorphized substantially completely, whereby the crystallinity thereof cannot be recovered by the heat treatment described above, and the regions are thus left with amorphous components. Although these regions have a very high resistance, they are formed separately from the source or drain regions so as not to interfere with the movement of carriers during the operation of the TFTs. After this step, the ratio Pa/Pc between the TO-phonon peak Pa of amorphous Si and the TO-phonon peak Pc of crystalline Si in the Raman spectrum as measured by laser Raman spectroscopy is larger in the gettering regions 725n and 725p than in the channel regions or the source/drain regions. Moreover, this condition is maintained even after the completion of the TFT because no high-temperature step is performed after this heat treatment step.

Figure 12E:
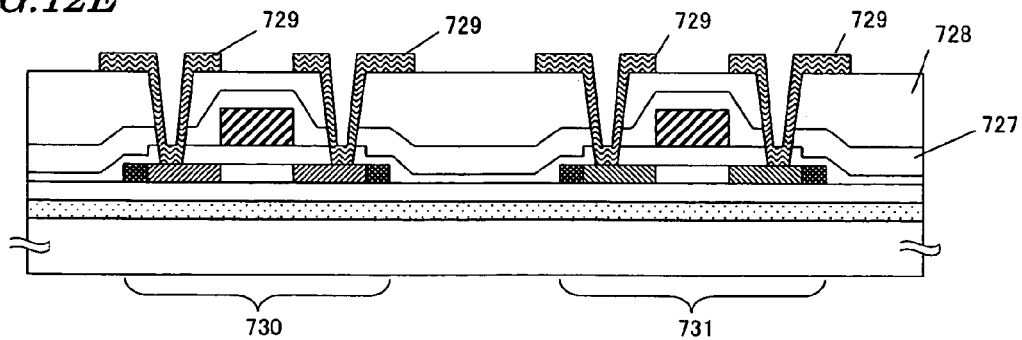

Then, as illustrated in FIG. 12E, an interlayer insulating film is formed. In the present preferred embodiment, a silicon nitride film 727 having a thickness of, for example, about 200 nm and a silicon oxide film 728 having a thickness of, for example, about 700 nm were deposited on one another, thereby providing a two-layer film.

Then, another heat treatment is performed at about 300° C. to about 500° C. for about 1 hour. This step is performed for terminating and inactivating dangling bonds that deteriorate the TFT characteristics by supplying hydrogen atoms from the interlayer insulating film (particularly the silicon nitride film 727) to the interface between the active region and the gate insulating film.

Then, contact holes are made in the interlayer insulating film, and an electrode/line 729 of the TFT is formed by using a metal film, thereby completing an n-channel TFT 730 and a p-channel TFT 731 as illustrated in FIG. 12E. As necessary, additional contact holes may be made over the gate electrodes 713 and 720 for providing necessary connection between electrodes with the line 729.

Each TFT produced according to the present preferred embodiment exhibits a desirable field-effect mobility and a desirable threshold voltage as in the other preferred embodiments. Moreover, these TFTs exhibited substantially no abnormal increase in the TFT off-state leak current, which is frequently seen in the prior art, and substantially no characteristics deterioration was observed in tests for the resistance to repeated operations, the resistance to bias voltages and the resistance to thermal stresses. Moreover, as a CMOS circuit using an n-channel TFT and a p-channel TFT produced according to the present preferred embodiment was used in various circuits such as an inverter chain and a ring oscillator, the circuits exhibited a much higher reliability and more stable circuit characteristics over the prior art.

Furthermore, in the present preferred embodiment, as compared with the fourth and fifth preferred embodiments, the gate electrode is used as a doping mask in the step of forming the source/drain region and the gettering region for each of the n-channel TFT and the p-channel TFT. Therefore, it is possible to further eliminate the photolithography step, whereby it is possible to simplify the manufacturing process while reducing the manufacturing cost of the semiconductor device and improving the production yield.

Eighth Preferred Embodiment

The eighth preferred embodiment of the present invention will now be described. The present preferred embodiment is also directed to a process of producing, on a glass substrate, a circuit having a CMOS structure including a complementary set of an n-channel TFT and a p-channel TFT.

FIG. 13A to FIG. 13F and FIG. 14A to FIG. 14E are cross-sectional views sequentially illustrating steps for producing the TFTs of the present preferred embodiment.

Figure 13A:
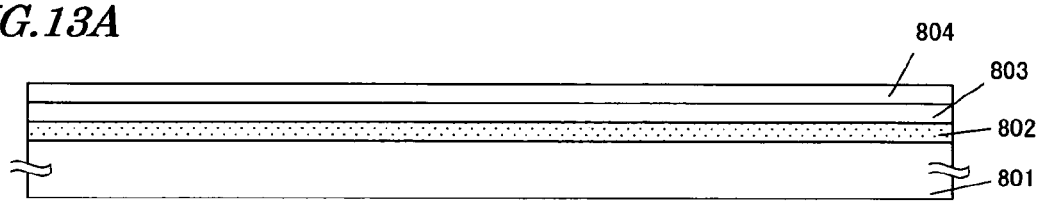
FIG. 13A to FIG. 13F are schematic cross-sectional views illustrating steps for manufacturing a semiconductor device according to a preferred embodiment of the present invention.
Figure 13B:
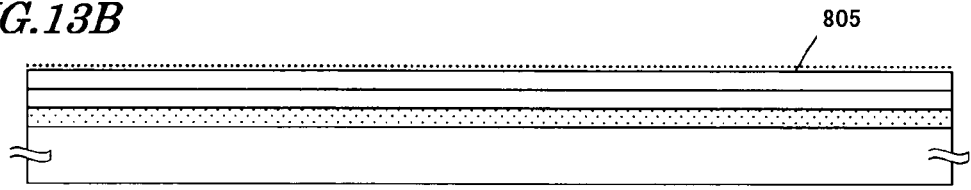

Referring to FIG. 13A, a silicon oxide nitride film as a lower first base film 802 and a silicon oxide film as a second base film 803 are formed in this order on the TFT side of a glass substrate 801, and an a-Si film 804 having a thickness of, for example, about 50 nm, for example, is formed thereon, in a manner similar to those of the first to third preferred embodiments. Then, as illustrated in FIG. 13B, a small amount of nickel 805 is added to the surface of the a-Si film 804 in a manner similar to those of the first to third preferred embodiments.

Figure 13C:
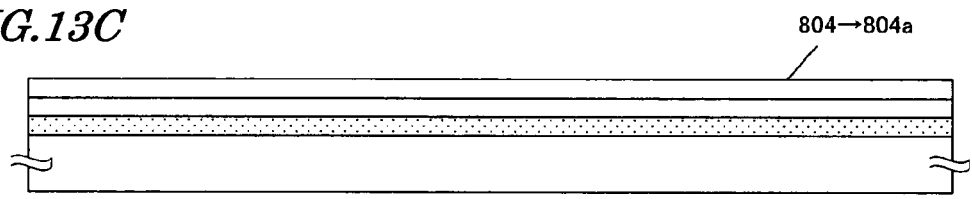
Figure 13D:
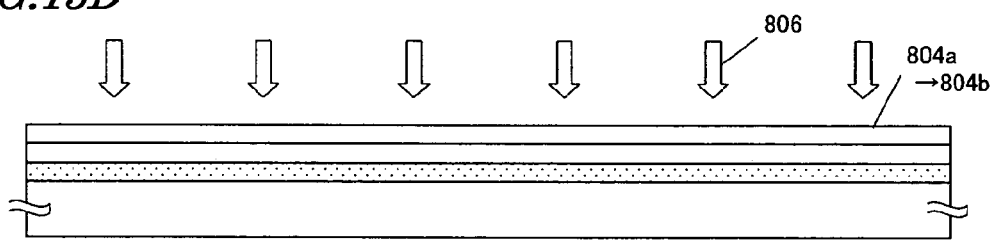

Then, a first heat treatment is performed so as to crystallize the a-Si film 804 in solid phase using nickel 805 added to the a-Si film 804 as a catalyst, thereby obtaining a crystalline silicon film 804a. This state is shown in FIG. 13C. Then, as illustrated in FIG. 13D, the crystalline silicon film 804a is irradiated with laser light 806, in a manner similar to those of the first to third preferred embodiments, so as to improve the crystallinity thereof, thereby obtaining a crystalline silicon film 804b of a higher quality.

Figure 13E:
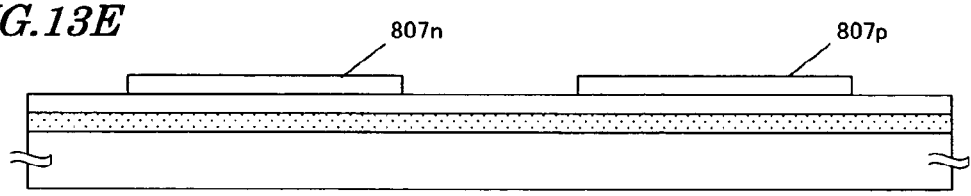

Then, a device isolation process is performed by removing unnecessary portions of the crystalline silicon film 804b. Through this step, island-shaped crystalline silicon films 807n and 807p are formed, as illustrated in FIG. 13E, which are to be the semiconductor layers of the n-channel TFT and the p-channel TFT, respectively.

Figure 13F:
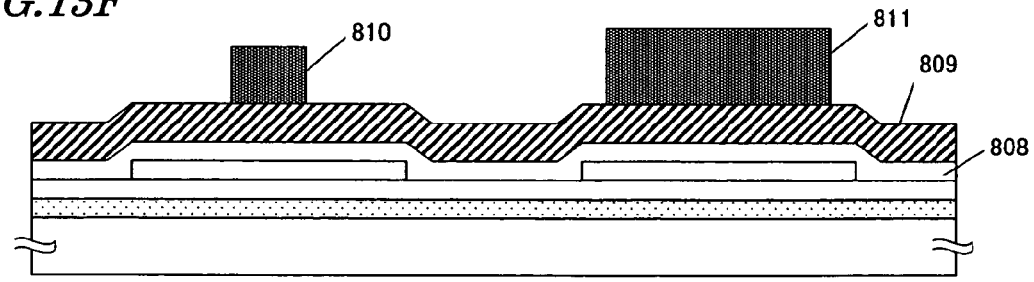

Then, a gate insulating film 808 having a thickness of, for example, about 100 nm, for example, is formed, and a conductive film 809 is formed thereon by a sputtering method, a CVD method, or other suitable process. The material of the conductive film may be any one of W, Ta, Ti and Mo, which are high-melting metals, or an alloy material thereof. In the present embodiment, a W film was formed to a thickness of, for example, about 450 nm. Then, resist masks 810 and 811 are formed on the conductive film 809. The masks 810 and 811 are masks used for forming gate electrodes. In the present preferred embodiment, the gate electrode of the p-channel TFT is used as a mask for forming a region (the gettering region) in which an impurity element providing n-type conductivity is added to the semiconductor layer 807p. Therefore, the width of the mask 811 of the p-channel TFT is larger than that of the mask 810 of the n-channel TFT. This state is shown in FIG. 13F.

Figure 14A:
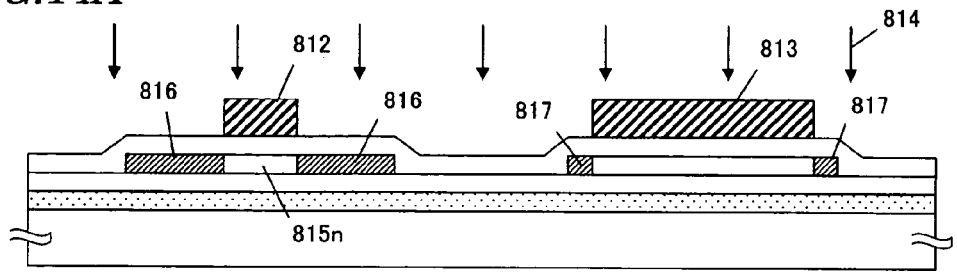
FIG. 14A to FIG. 14E are schematic cross-sectional views illustrating steps for manufacturing a semiconductor device according to a preferred embodiment of the present invention (continued from FIG. 13F).

Then, the conductive film 809 is etched to form a first gate electrode 812 and a second gate electrode conductive layer 813. The first gate electrode 812 is the gate electrode of the n-channel TFT. Then, after the resist masks 810 and 811 are removed, an n-type impurity element (phosphorus in the present preferred embodiment) 814 is added (first doping step) to form n-type impurity regions 816 and 817 containing the n-type impurity element at a concentration of, for example, about $1\times10^{19}/cm^3$ to about $1\times10^{21}/cm^3$, as illustrated in FIG. 14A. Note that a region 815n of the semiconductor layer 807n that is located under the first gate electrode 812 is not doped with phosphorus, and will later be the channel region of the n-channel TFT.

Figure 14B:
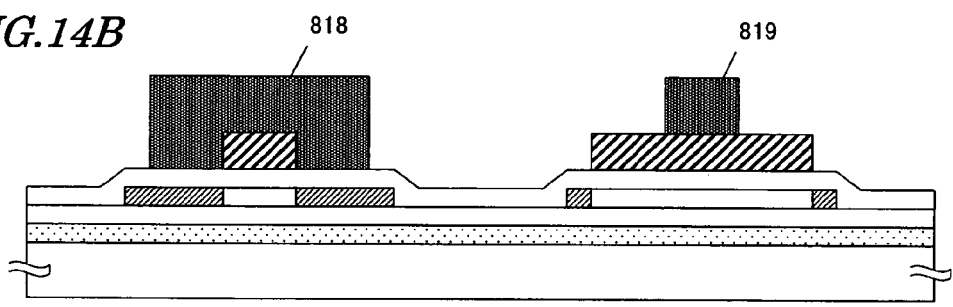

Then, a resist mask 819 is formed for etching the second gate electrode conductive layer 813 of the p-channel TFT into a predetermined pattern, and a resist mask 818 is formed for forming a gettering region in the semiconductor layer of the n-channel TFT. The mask 819 is formed so that the width of the mask 819 is smaller than that of the second gate electrode conductive layer 813. Moreover, in the n-channel TFT, the mask 818 is formed with a thick side wall so as to cover the gate electrode 812, with only a peripheral portion of the semiconductor layer 807p being exposed. This state is shown in FIG. 14B.

Then, a second gate electrode 820 having a predetermined shape is formed in the p-channel TFT by an etching process. As in the seventh preferred embodiment, the etching process was performed by an ICP etching method using etching gases of $CF_4$, $Cl_2$ and $O_2$. In this etching step, portions of the gate insulating film 808 that are not masked with the second gate electrode conductive layer 813 or the resist mask 818 are subject to the etching atmosphere from the beginning of the etching process. Thus, the portions of the gate insulating film 808 are thinned. The amount by which the gate insulating film 808 is thinned can be controlled by adjusting the flow rate ratio among the etching gases. In the present preferred embodiment, the etching process was controlled so that the gate insulating film 808 is etched by an etch amount of, for example, about 30 nm. Thus, in this step, the gate insulating film 808 is thinned while forming the second gate electrode 820, thereby obtaining a selectively-thinned gate insulating film 821. In the present preferred embodiment, the thickness of the thinned portions of the gate insulating film 821 is, for example, preferably about 70 nm. The second gate electrode 820 is the gate electrode of the p-channel TFT.

Figure 14C:
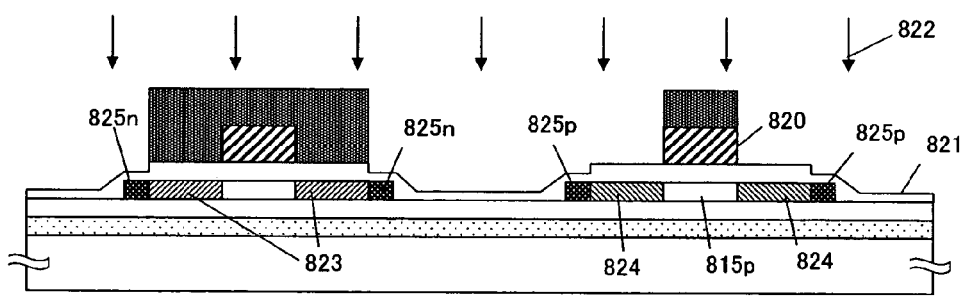
Figure 14D:
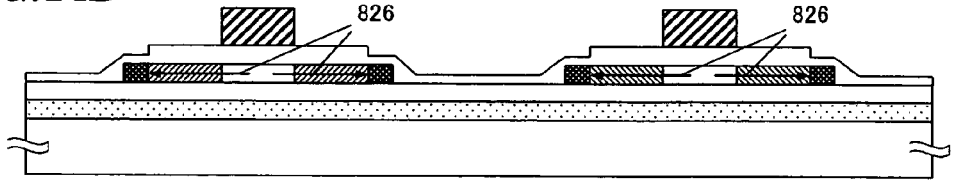

Then, as illustrated in FIG. 14C, an impurity providing p-type conductivity (boron) 822 is implanted into the semiconductor layers by an ion doping method using the resist mask 818 and the gate electrode 820 of the p-channel TFT as masks. Diborane ($B_2H_6$) was preferably used as the doping gas, the acceleration voltage was preferably set to, for example, about 70 kV, and the dose was preferably set to, for example, about $7\times10^{16}$ $cm^{-2}$. While regions of the semiconductor layers 807n and 807p that are not covered with the mask 818 and the gate electrode 820 of the p-channel TFT are doped with boron through the overlying gate insulating film 821 in this step, regions 825n and 825p over which the overlying gate insulating film 821 has been thinned and the other region 824 are doped with different amounts of boron, and the resulting regions have different crystalline conditions. In the regions 825n and 825p, where the gate insulating film 821 is thin, as compared with the region 824, the boron concentration is higher. In addition, in the regions 825n and 825p, where the overlying gate insulating film 821 is thin, boron ions are implanted into the semiconductor layer with a higher acceleration voltage than in the region 824, and the ions collide with one another with higher collision energies, whereby the crystalline structure is more destroyed in the regions 825n and 825p. In contrast, in the region 824, the ion collision energy is reduced by the presence of the gate insulating film, whereby a desirable crystalline structure of the semiconductor layer is maintained.

The region 824 of the semiconductor layer 807p of the p-channel TFT will later be the source/drain region of the p-channel TFT, and the region 825p, which has previously been doped with phosphorus 814, is further doped with a high concentration of boron 822, and the crystalline structure thereof is destroyed, whereby the region 825p functions as a gettering region. A region 815p that is located under the gate electrode 820 and is not doped with boron will later be the channel region of the p-channel TFT. Similarly, the region 825n of the semiconductor layer 807n of the n-channel TFT is doped with phosphorus and boron at high concentrations, as is the region 825p, and the crystalline structure thereof is destroyed, whereby the region 825n functions as a gettering region. A region 823 that is covered with the resist mask 818 and is not doped with boron is left as an n-type impurity region and will later be the source/drain region of the n-channel TFT. Thus, the gettering region and the source/drain region can easily be formed together while being given different properties suitable for the respective regions. At this point, the concentration of the p-type impurity element (boron) 822 in the gettering regions 825n and 825p is, for example, preferably about $1.5\times10^{19}/cm^3$ to about $3\times10^{21}/cm^3$.

Then, after the resist masks 818 and 819 are removed, the second heat treatment is performed in an inert atmosphere (e.g., a nitrogen atmosphere). In the present preferred embodiment, an RTA process was performed at about 670° C. for approximately 5 minutes. The RTA apparatus used was an apparatus capable of performing an annealing process in a nitrogen atmosphere while rapidly increasing and decreasing the temperature by blowing a high-temperature nitrogen gas onto the surface of the substrate. In this heat treatment step, phosphorus and boron doped at high concentrations into the gettering regions 825n and 825p formed outside the source/drain regions in the semiconductor layers 807n and 807p, respectively, increase the solid solubility of the regions for nickel, and also form segregation sites for nickel. Moreover, the regions 825n and 825p are amorphized in the doping step because the overlying gate insulating film has been thinned, whereby crystal defects and dangling bonds therein also function as segregation sites for nickel. These factors synergistically increase the gettering effect. As a result, in the semiconductor layer 807n of the n-channel TFT, nickel present in the channel region 815n and the source/drain region 823 is moved from the channel region to the source/drain region and to the gettering region 825n as indicated by arrow 826 in FIG. 14D. Although the source/drain region 823 doped only with phosphorus has a gettering effect, the gettering region 825n, which is doped with boron in addition to phosphorus and is more amorphized, has a much higher gettering capability, whereby nickel is collected into the gettering region 825n. Moreover, in the semiconductor layer 807p of the p-channel TFT, the gettering region 825p formed outside the source/drain region has a very high gettering capability as does the gettering region 825n of the n-channel TFT, and thus moves nickel present in the channel region 815p and a source/drain region 824 from the channel region to the source/drain region and to the gettering region 825p as indicated by arrow 826. In the second heat treatment for gettering, the catalyst element moves into the gettering regions 825n and 825p, whereby the concentration of the catalyst element therein is, for example, preferably about $1\times10^{19}/cm^3$ or more.

This heat treatment step also activates the n-type impurity (phosphorus) doped into the source/drain region 823 of the n-channel TFT and the p-type impurity (boron) doped into the source/drain region 824 of the p-channel TFT. As a result, the sheet resistance value of the source/drain region 823 of the n-channel TFT was about 0.5 kΩ/square to about 1.5 kΩ/square, and the sheet resistance value of the source/drain region 824 of the p-channel TFT was about 1 kΩ/square to about 2 kΩ/square. In the gettering regions 825n and 825p, carriers (electrons and holes) introduced by the n-type impurity element (phosphorus) and the p-type impurity element (boron) cancel each other, and the gettering regions 825n and 825p are subject to an implantation damage because the overlying gate insulating film has been thinned. Therefore, the sheet resistance values of the gettering regions 825n and 825p are on the order of about 10 kΩ/square, whereby the regions 825n and 825p cannot function as source/drain regions. However, the gettering regions 825n and 825p are formed separately from the source region and the drain region in such an arrangement that they do not interfere with the movement of carriers in the TFTs. Therefore, the sheet resistance values of the gettering regions 825n and 825p do not hinder the operation of the transistors. After this step, the ratio Pa/Pc between the TO-phonon peak Pa of amorphous Si and the TO-phonon peak Pc of crystalline Si in the Raman spectrum as measured by laser Raman spectroscopy was larger in the gettering regions 825n and 825p than in the channel regions or the source/drain regions.

Figure 14E:
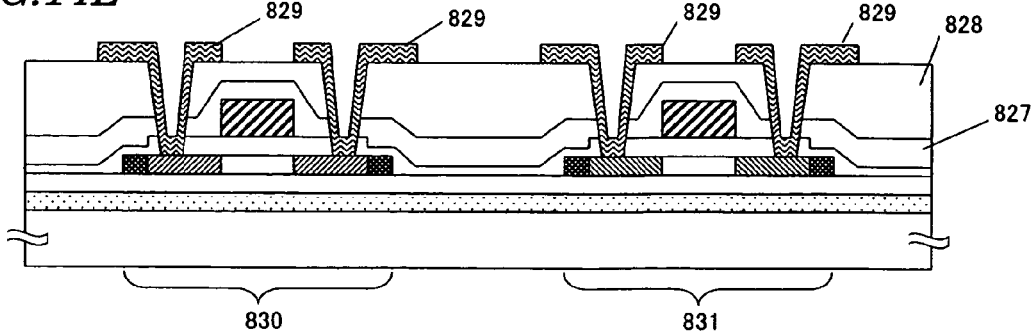

Then, as illustrated in FIG. 14E, an interlayer insulating film is formed. In the present preferred embodiment, a silicon nitride film 827 having a thickness of, for example, about 200 nm and a silicon oxide film 828 having a thickness of, for example, about 700 nm were deposited on one another, thereby providing a two-layer film.

Then, another heat treatment is performed at about 300° C. to about 500° C. for about 1 hour. This step is performed for terminating and inactivating dangling bonds that deteriorate the TFT characteristics by supplying hydrogen atoms from the interlayer insulating film (particularly the silicon nitride film 827) to the interface between the active region and the gate insulating film.

Then, contact holes are made in the interlayer insulating film, and an electrode/line 829 of the TFT is formed by using a metal film, thereby completing an n-channel TFT 830 and a p-channel TFT 831 as illustrated in FIG. 14E. As necessary, additional contact holes may be made over the gate electrodes 812 and 820 for providing necessary connection between electrodes with the line 829.

Each TFT produced according to the present preferred embodiment exhibits a desirable field-effect mobility as in the other preferred embodiments above. Moreover, these TFTs exhibited substantially no abnormal increase in the TFT off-state leak current, which is frequently seen in the prior art, and substantially no characteristics deterioration was observed in tests for the resistance to repeated operations, the resistance to bias voltages and the resistance to thermal stresses. Moreover, as a CMOS circuit using an n-channel TFT and a p-channel TFT produced according to the present preferred embodiment was used in various circuits such as an inverter chain and a ring oscillator, the circuits exhibited a much higher reliability and more stable circuit characteristics over the prior art.

Furthermore, also in the present preferred embodiment, as compared with the third preferred embodiment, the gate electrode is used as a doping mask in the step of forming the source/drain region and the gettering region for each of the n-channel TFT and the p-channel TFT. Therefore, it is possible to further eliminate the photolithography step, whereby it is possible to simplify the manufacturing process while reducing the manufacturing cost of the semiconductor device and improving the production yield.

Ninth Preferred Embodiment

The present preferred embodiment is directed to a crystallization method different from those of the first to eighth preferred embodiments. The present preferred embodiment will be described with reference to FIG. 15A to FIG. 15E. FIG. 15A to FIG. 15E are cross-sectional views sequentially illustrating the manufacturing steps of the present preferred embodiment.

First, as in the first to eighth preferred embodiments, a base film such as a silicon oxide film, a silicon nitride film or a silicon oxide nitride film is formed on a substrate (a glass substrate in the present preferred embodiment) 901 for preventing the diffusion of an impurity from the substrate 901. In the present preferred embodiment, a silicon nitride film was deposited as a lower first base film 902, and a silicon oxide film was deposited as a second base film 903 on the first base film 902. Then, an a-Si film 904 is formed to a thickness of, for example, about 30 nm to about 80 nm by a method similar to those of the first to eighth preferred embodiments. In this step, the base insulating films and the amorphous semiconductor film may be formed successively without exposing the substrate to the atmospheric air.

Figure 15A:
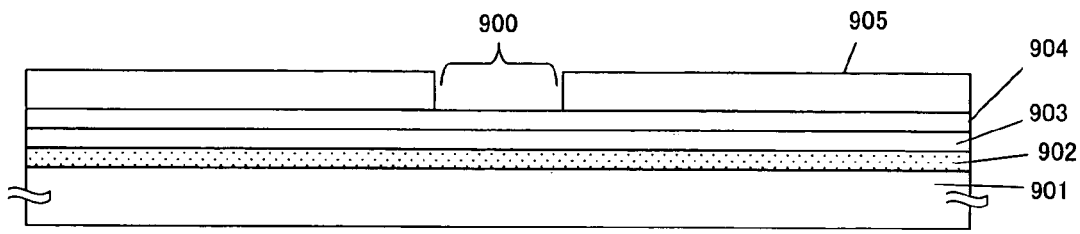
FIG. 15A to FIG. 15E are schematic cross-sectional views illustrating steps for manufacturing a semiconductor device according to a preferred embodiment of the present invention.

Then, a mask insulating film 905 made of silicon oxide is formed to a thickness of, for example, about 200 nm. The mask insulating film includes an opening 900 through which a catalyst element is added to the semiconductor film, as illustrated in FIG. 15A.

Figure 15B:
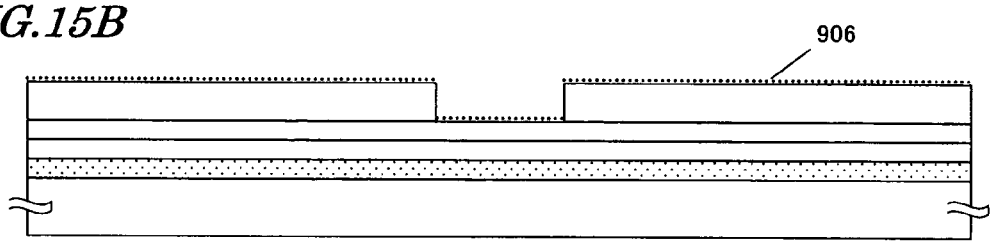

Then, as illustrated in FIG. 15B, an aqueous solution (aqueous nickel acetate solution) containing about 100 ppm by weight of a catalyst element (nickel in the present preferred embodiment) is applied by a spin coating method, thereby forming a catalyst element layer 906. In this step, the catalyst element 906 selectively contacts the a-Si film 904 in the opening 900 of the mask insulating film 905, thereby forming a catalyst-element-added region.

While nickel is added by a spin coating method in the present preferred embodiment, a thin film of a catalyst element (nickel film in the present preferred embodiment) may alternatively be formed on the a-Si film 104 by a vapor deposition method, a sputtering method, or other suitable method.

Figure 15C:
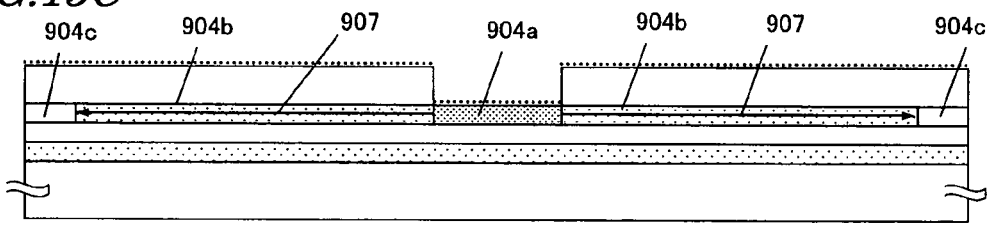

Then, a heat treatment is performed at about 500° C. to about 650° C. (preferably about 550° C. to about 600° C.) for approximately 6 to 20 hours (preferably, approximately 8 to 15 hours). In the present preferred embodiment, a heat treatment is performed at about 570° C. for approximately 14 hours. As a result, as illustrated in FIG. 15C, crystal nuclei are formed in the catalyst-element-added region 900, and the a-Si film in the region 900 is first crystallized into a crystalline silicon film 904a. Starting from the crystallized region, the crystallization further proceeds in a direction generally parallel to the substrate (as indicated by arrow 907), thereby forming a crystalline silicon film 904b where the crystal growth direction is uniform macroscopically. In this step, nickel 906 present above the mask 905 is blocked by the mask film 905 and does not reach the underlying a-Si film. Therefore, the crystallization of the a-Si film 904 is effected only by nickel that is introduced in the region 900. Moreover, the region to which the lateral growth frontline does not reach is left as an amorphous region 904c. Depending on the layout, however, two laterally-grown crystal regions coming from adjacent openings may collide with each other to form a boundary therebetween, in which case such an amorphous region may not be present.

Figure 15D:
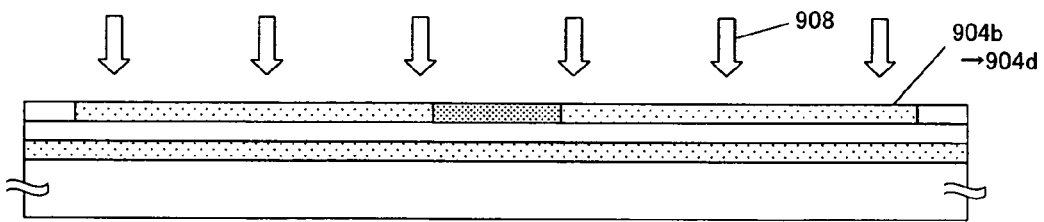
Figure 15E:
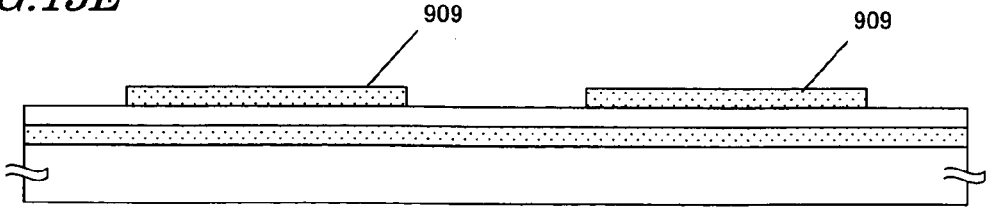

After the silicon oxide film 905, used as a mask, is removed, the obtained crystalline silicon film may be irradiated with laser light as illustrated in FIG. 15D so as to improve the crystallinity as in the first to eighth preferred embodiments. Thus, the crystalline silicon film in the laterally-grown crystal region 904b is further improved in quality and forms a crystalline silicon film 904d.

Then, the crystalline silicon film in the laterally-grown crystal region 904d is etched into a predetermined pattern, thereby forming a semiconductor layer 909 of the TFT.

The crystallization method of the present preferred embodiment may be applied to the crystallization step of the first to eighth preferred embodiments so as to realize a TFT having a higher current driving power and a higher performance.

Tenth Preferred Embodiment

The present preferred embodiment is directed to how to arrange, in the semiconductor layer of a TFT, gettering regions for moving a catalyst element for crystallizing a semiconductor film as illustrated in the first to eighth preferred embodiments. The present preferred embodiment will be described with reference to FIG. 16A to FIG. 16D and FIG. 17A and FIG. 17B.

By applying the present preferred embodiment to the TFT manufacturing process of any of the first to eighth preferred embodiments, it is possible to form gettering regions of various shapes in the semiconductor layers of the n-channel TFT and the p-channel TFT. Moreover, the catalyst element gettering efficiency in the n-channel TFT can be matched with that of the p-channel TFT by controlling the area of the gettering region in the semiconductor layer of the n-channel TFT to be generally equal to that in the active region of the p-channel TFT while controlling the distance from the gettering region to the channel region in the n-channel TFT to be generally equal to that in the p-channel TFT. Examples of the shape of the gettering region formed in the semiconductor layer will now be shown.

Note that controlling the area of the gettering region in the semiconductor layer of the n-channel TFT to be generally equal to that in the semiconductor layer of the p-channel TFT means to control the ratio S/W in the n-channel TFT to be generally equal to that in the p-channel TFT, where W is the width of the semiconductor layer (channel region) and S is the area of the gettering region.

Figure 16A:
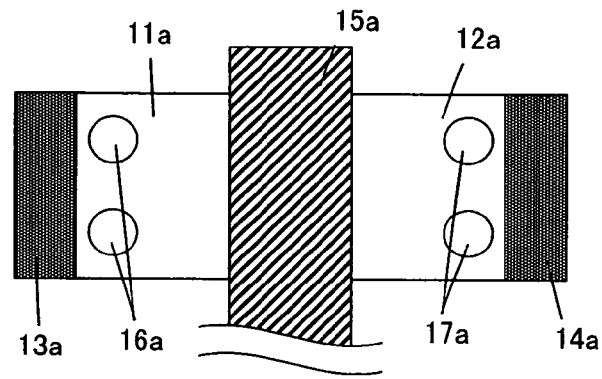
FIG. 16A to FIG. 16D are schematic diagrams each illustrating an alternative arrangement of gettering regions according to a preferred embodiment of the present invention.

FIG. 16A shows an example where each of gettering regions 13a and 14a is arranged remote from the channel region in the semiconductor layer below a gate electrode 15a (in a peripheral portion of the semiconductor layer), and has a substantially rectangular shape extending substantially parallel to the gate electrode 15a, with corner portions thereof being generally aligned with corner portions of the semiconductor layer.

Figure 16B:
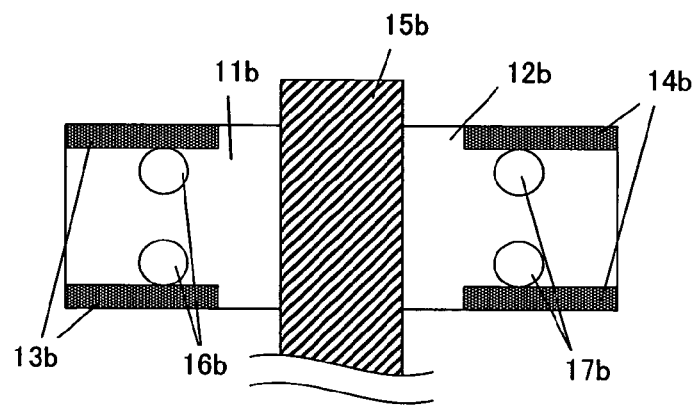

FIG. 16B shows an example where each of gettering regions 13b and 14b is arranged remote from the channel region in the semiconductor layer below a gate electrode 15b (in a peripheral portion of the semiconductor layer), and has a substantially rectangular shape extending substantially perpendicular to the gate electrode 15b, with a corner portion thereof being generally aligned with a corner portion of the semiconductor layer.

Figure 16C:
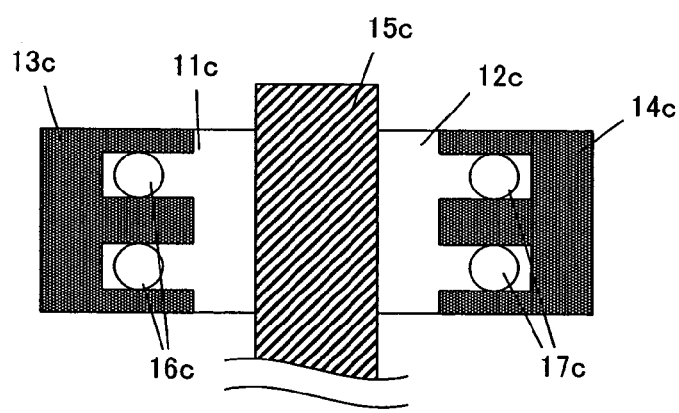

FIG. 16C shows an example where each of gettering regions 13c and 14c is arranged remote from the channel region in the semiconductor layer below a gate electrode 15c (in a peripheral portion of the semiconductor layer), and has a complicated shape including a substantially rectangular component extending parallel to the gate electrode 15c and other substantially rectangular components extending substantially perpendicular to the gate electrode 15c, with corner portions thereof being generally aligned with corner portions of the semiconductor layer. With this arrangement, as compared with those of FIG. 16A and FIG. 16B, the area of the gettering region can be increased, thereby increasing the catalyst element gettering efficiency.

In any of these arrangements, the gettering region is arranged so as not to block a current flow between contact portions formed in the source region and in the drain region (the term "contact portion" as used herein refers to a portion where a line for electrically connecting TFTs together is connected to the semiconductor layer). Specifically, the gettering regions 13a and 14a of FIG. 16A are arranged so as not to block a current flow between contact portions 16a formed in a source region 11a and contact portions 17a formed in a drain region 12a.

Moreover, the gettering regions 13b and 14b of FIG. 16B are arranged so as not to block a current flow between contact portions 16b connected to a source region 11b and contact portions 17b formed in a drain region 12b.

Moreover, the gettering regions 13c and 14c of FIG. 16C are arranged so as not to block a current flow between contact portions 16c formed in a source region 11c and contact portions 17c formed in a drain region 12c.

Figure 16D:
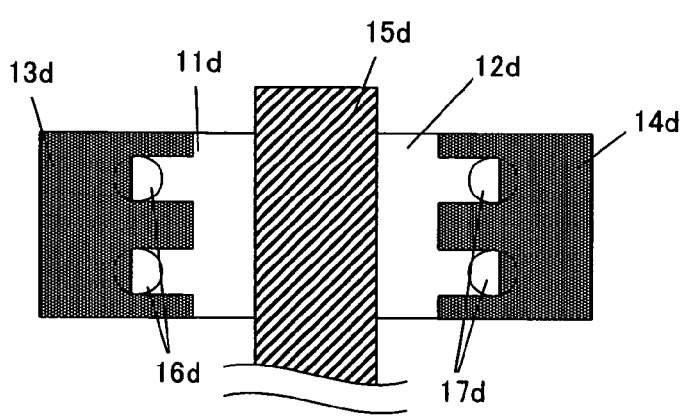

FIG. 16D shows an arrangement that is basically the same as that of FIG. 16C, except that gettering regions 13d and 14d overlap contact portions 16d and 17d, respectively, in order to further increase the area of the gettering regions 13d and 14d so as to further improve the gettering efficiency of the gettering regions 13d and 14d. Basically, some overlap between the gettering regions 13d and 14d and the contact portions 16d and 17d does not cause a problem. However, the area of overlap should not exceed one half of the area of the contact portion 16d or 17d. Therefore, the distance between the contact portions 16d and 17d and the gettering regions 13d and 14d needs to be determined appropriately in view of the alignment precision of an exposure apparatus used in a photolithography step for each region to be formed. Note that arrangement of the gettering regions is not limited to that of the present preferred embodiment, but may be any other arrangement as long as it does not affect (block) a current flow between the source region and the drain region.

Figure 17A:
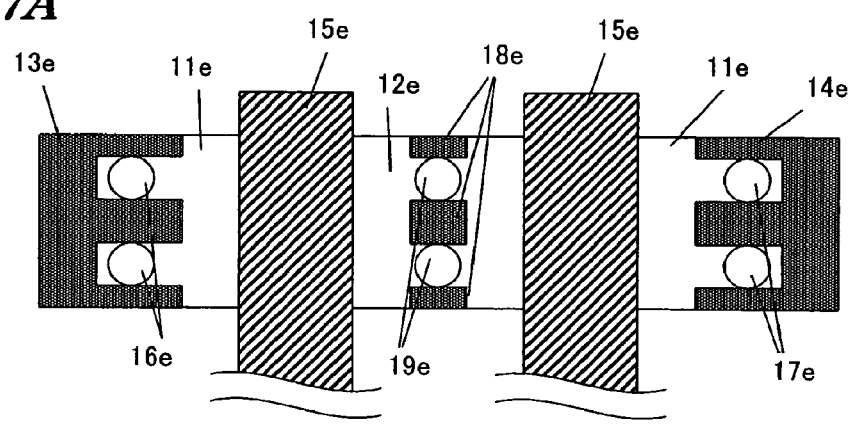
FIG. 17A and FIG. 17B are schematic diagrams each illustrating an alternative arrangement of gettering regions according to a preferred embodiment of the present invention.

FIG. 17A shows an example where a plurality of gate electrodes 15e run through the semiconductor layer, with a plurality of channel regions being provided under the gate electrodes 15e. A source region 11e (or a drain region 12e), a gettering region 18e and a contact portion 19e are disposed between the plurality of gate electrodes. Note that gettering regions 13e and 14e are disposed in peripheral portions of the semiconductor layer, as in the arrangements shown in FIG. 16A to FIG. 16D, and the source region 11e or the drain region 12e and contact portions 16e and 17e are disposed between the gettering regions 13e and 14e. Also in the arrangement of FIG. 17A, the gettering region 13e may alternatively overlap the contact portion 16e. However, the area of overlap should not exceed approximately one half of the area of the contact portion 16e or 17e.

Figure 17B:
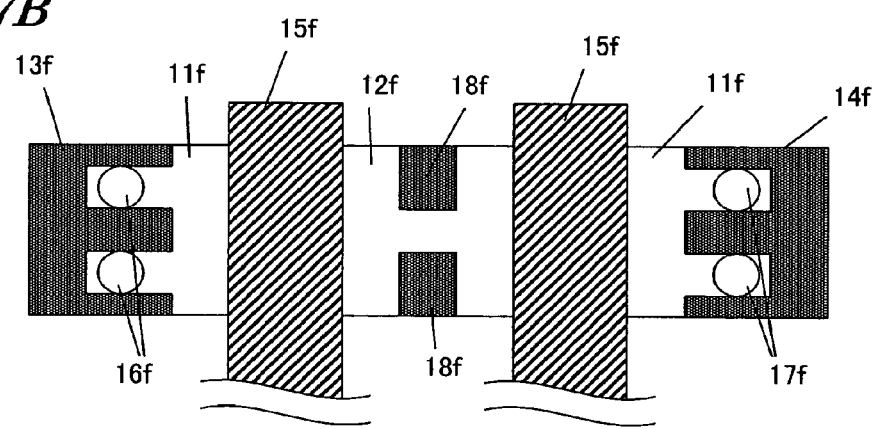

FIG. 17B also shows an example where a plurality of gate electrodes 15f run through the semiconductor layer, with a plurality of channel regions being provided under the gate electrodes 15f. In the arrangement of FIG. 17B, two TFTs are connected in series with each other while sharing a semiconductor layer, and no contact portion is provided at the junction therebetween. Thus, this is an arrangement that can be used when it is not necessary to take out an electrical signal from the junction. Such a TFT circuit is actually used for clocked inverters, latch circuits, etc. A source region 11f (or a drain region 12f) and a gettering region 18f are disposed between the plurality of gate electrodes. Note that gettering regions 13f and 14f are disposed in peripheral portions of the semiconductor layer, as in the arrangements shown in FIG. 16A to FIG. 16D, and the source region 11f or the drain region 12f and contact portions 16f and 17f are disposed between the gettering regions 13f and 14f. In the junction region, the gettering region 18f is arranged at least not to block a current flow from the contact portions 16f to the contact portions 17f.

Note that the shape of the semiconductor layer of a TFT varies depending on the amount of current required for the TFT. The present invention can be used either with a "waistless" arrangement where the width of the source/drain region is the same as that of the channel region, as in the arrangements shown in FIG. 16A to FIG. 16D and FIG. 17A and FIG. 17B, or with an "hourglass-shaped" arrangement where the width of the channel region is narrowed from that of the source/drain region.

Irrespective of the shape of the gettering region, the catalyst element concentration in the gettering region increases to be about $1 \times 10^{19}/cm^3$ or more as the catalyst element moves into the gettering region in the gettering heat treatment.

The present preferred embodiment may be used in combination with the first to eighth preferred embodiments described above.

Eleventh Preferred Embodiment

Figure 18A:
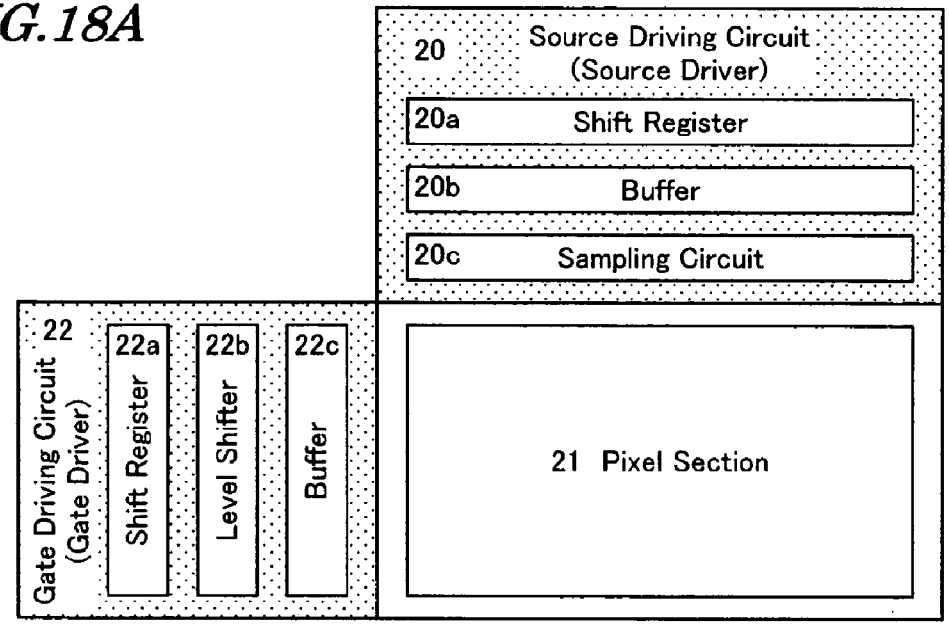
FIG. 18A and FIG. 18B are schematic diagrams each illustrating a configuration of a semiconductor device according to a preferred embodiment of the present invention.
Figure 18B:
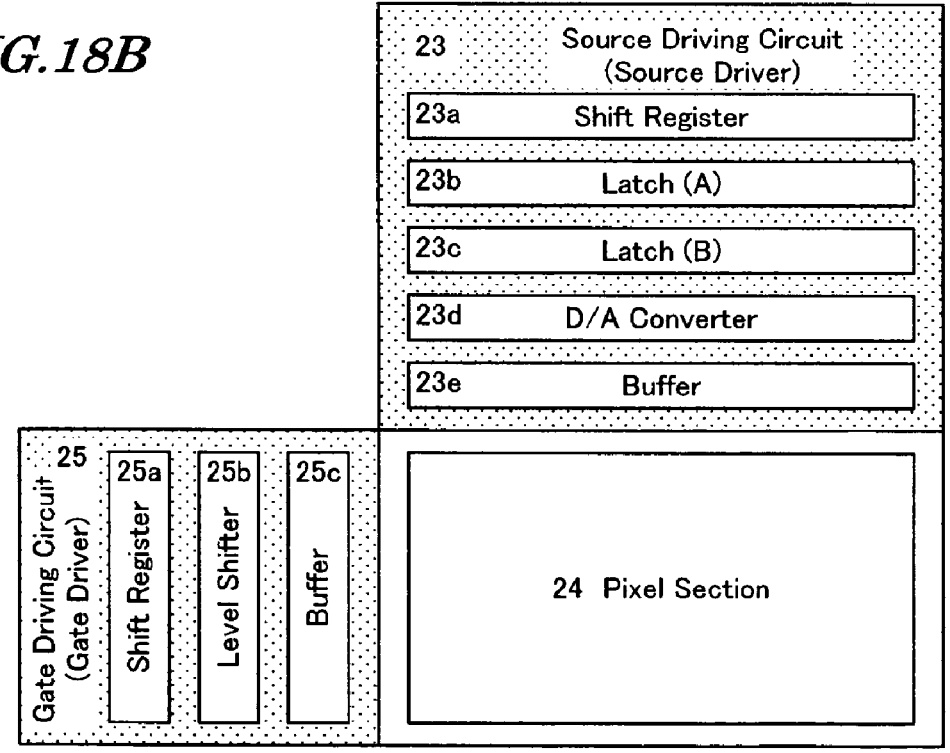

FIG. 18A and FIG. 18B are block diagrams each illustrating a semiconductor device produced according to a preferred embodiment of the present invention. Note that FIG. 18A shows a circuit configuration for analog driving. The semiconductor device of the present preferred embodiment includes a source driving circuit 20, a pixel section 21 and a gate driving circuit 22. Note that the term "driving circuit" as used herein is a generic term encompassing a source driving circuit and a gate driving circuit.

The source driving circuit 20 includes a shift register 20a, a buffer 20b and the sampling circuit (transfer gate) 20c. The gate driving circuit 22 includes a shift register 22a, a level shifter 22b and a buffer 22c. As necessary, a level shifter circuit may be provided between the sampling circuit and the shift register.

Moreover, in the present preferred embodiment, the pixel section 21 includes a plurality of pixels, each including a TFT element.

Note that a further gate driving circuit (not shown) may alternatively be provided on the other side of the pixel section 21 from the gate driving circuit 22.

FIG. 18B shows a circuit configuration for digital driving. The semiconductor device of the present preferred embodiment includes a source driving circuit 23, a pixel section 24 and a gate driving circuit 25. For digital driving, a latch (A) 23b and a latch (B) 23c can be provided instead of the sampling circuit, as illustrated in FIG. 18B. A source driving circuit 23 includes a shift register 23a, the latch (A) 23b, the latch (B) 23c, a D/A converter 23d and a buffer 23e. The gate driving circuit 25 includes a shift register 25a, a level shifter 25b and a buffer 25c. As necessary, a level shifter circuit may be provided between the latch (B) 23c and the D/A converter 23d.

The configurations described above can be realized by the manufacturing processes of the first to tenth preferred embodiments above. Although only the pixel section and the driving circuit are illustrated in the present preferred embodiment, a memory or a microprocessor can be formed according to the manufacturing process of various preferred embodiments of the present invention.

Twelfth Preferred Embodiment

A CMOS circuit and a pixel section produced according to various preferred embodiments of the present invention can be used in an active matrix liquid crystal display device or an organic EL display device. Thus, the present invention can be used with any electronic devices incorporating such a liquid crystal display device or organic EL display device in its display section.

Such electronic devices include a video camera, a digital camera, a projector (of a rear type or a front type), a head mounted display (a goggle type display), a personal computer, a portable information terminal (e.g., a mobile computer, a portable telephone, or an electronic book), etc.

With preferred embodiments of the present invention, it is possible to form a crystalline semiconductor film having a desirable crystallinity using a catalyst element. Moreover, the catalyst element can be gettered sufficiently, whereby it is possible to improve the characteristics of an n-channel TFT and a p-channel TFT, thus realizing a desirable CMOS driving circuit having a high reliability and stable circuit characteristics. Moreover, even with those TFTs whose off-state leak current has been a problem, including a pixel switching TFT and a TFT of a sampling circuit of an analog switch section, it is possible to sufficiently suppress the leak current, which is believed to be due to the segregation of the catalyst element. As a result, it is possible to realize a desirable display with no display non-uniformity. As a desirable display with no display non-uniformity is obtained, it is possible to save the use of the light source and thus the power consumption. Therefore, it is possible to realize an electronic device (such as a portable telephone, a portable electronic book and a display) with a reduced power consumption.

As described above, preferred embodiments of the present invention can be used in a wide variety of applications, and can be used in any kind of electronic devices. Moreover, an electronic device of the twelfth preferred embodiment can be realized by using a display device that is produced based on one or more of the first to eleventh preferred embodiments.

The present invention is not limited to those preferred embodiments specifically set forth above, but various modifications can be made based on the technical concept of the present invention.

For example, the semiconductor film of the present invention is not limited to a pure silicon film as used in the preferred embodiments above, but may alternatively be a mixed film of germanium and silicon (a silicon-germanium film) or a pure germanium film.

Moreover, while nickel is introduced by applying a nickel salt solution onto the surface of an amorphous silicon film in the preferred embodiments above, nickel may alternatively be introduced onto the surface of a base film before the deposition of the amorphous silicon film so that the crystal growth is performed while nickel diffuses from the layer under the amorphous silicon film. Moreover, the method of introducing nickel may be any other suitable method. For example, an SOG (spin-on-glass) material may be used as the solvent for the nickel salt so as to diffuse nickel from an $SiO_2$ film. Alternatively, nickel may be introduced in the form of a thin film by using a sputtering method, a vapor deposition method or a plating method, or nickel may be directly introduced by an ion doping method.

Moreover, while phosphorus is preferably used in the gettering process in the preferred embodiments above, arsenic or antimony may alternatively be used. Moreover, other than argon and krypton, xenon is also very effective as the rare gas element for the gettering process.

Furthermore, while the LDD region is provided between the source/drain region and the channel region in some of the preferred embodiments above, the LDD region may alternatively be provided directly under the gate electrode, instead of beside the gate electrode as in the embodiments above. With such a structure, although the effect of reducing the TFT off-state current is decreased, the hot carrier resistance increases, thereby obtaining a TFT with a higher reliability.

Moreover, the order in which n-type and p-type impurity elements are implanted into the semiconductor is not limited to that shown in the preferred embodiments above, but may be determined appropriately for each specific application. Moreover, when to perform the step of thinning the gate insulating film is not limited to that shown in the preferred embodiments above. The effect of the present invention can be obtained as long as it is performed before a doping step that is performed for the purpose of forming the gettering region. Moreover, the amount by which the gate insulating film is thinned may be determined appropriately for each specific application.

With the present invention, it is possible to sufficiently reduce the amount of a catalyst element remaining in the device region (particularly, the channel region, or the junction between the channel region and the source region or the junction between the channel region and the drain region) of a crystalline semiconductor film with a desirable crystallinity that is produced by using a catalyst element. With a TFT using such a semiconductor film, it is possible to suppress and minimize the occurrence of a leak current and to improve the reliability, and it is possible to realize a high-performance semiconductor element having stable characteristics with little characteristics variations. Furthermore, it is possible to reduce the additional steps for the gettering process, thereby simplifying the manufacturing process. As a result, it is possible to significantly improve the production yield and to reduce the manufacturing cost of the semiconductor device.

With the present invention, it is possible to realize a high-performance semiconductor element, and it is possible to obtain a highly-integrated, high-performance semiconductor device with a simple manufacturing process. Particularly, with a liquid crystal display device, the present invention provides a vast improvement in the switching characteristics of a pixel switching TFT, which is required for active matrix substrates, and a vast improvement in the performance and the degree of integration, which is required for TFTs of a peripheral driving circuit section. Therefore, in a driver-monolithic active matrix substrate having an active matrix section and a peripheral driving circuit section formed on the same substrate, it is possible to significantly reduce the size of the module, improve the performance thereof, and reduce the cost thereof.

While the present invention has been described with respect to preferred embodiments thereof, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

This application is based on Japanese Patent Application No. 2003-001434 filed on Jan. 7, 2003, the entire contents of which are herein incorporated by reference.

What is claimed is:

1. A semiconductor device comprising:
   at least one thin film transistor including:
      a semiconductor layer that has a crystalline region including a channel region, a source region, and a drain region;
      a gate insulating film disposed at least on the channel region, the source region, and the drain region of the semiconductor layer; and
      a gate electrode arranged so as to oppose the channel region via the gate insulating film; wherein
   at least a portion of the semiconductor layer includes a catalyst element capable of promoting crystallization, and the semiconductor layer further includes a gettering region that includes the catalyst element at a higher concentration than in each of the channel region, the source region, and the drain region;
   a thickness of the gate insulating film on the gettering region is smaller than that on the source region and the drain region; and
   the gettering region, the source region, and the drain region include a same impurity element providing conductivity, the concentration of the same impurity element in the gettering region is higher than each of the concentrations of the same impurity element in the source region and the drain region.

2. The semiconductor device according to claim 1, wherein the semiconductor layer further includes an amorphous region, and at least a portion of the gettering region is disposed in the amorphous region.

3. The semiconductor device according to claim 1, wherein at least a portion of the gettering region is disposed in the crystalline region.

4. The semiconductor device according to claim 3, wherein the at least a portion of the gettering region disposed in the crystalline region has a larger amorphous component content and a smaller crystalline component content than those of the channel region or the source region and the drain region.

5. The semiconductor device according to claim 1, further comprising a p-channel thin film transistor and an n-channel thin film transistor, wherein the at least one thin film transistor is the p-channel thin film transistor.

6. The semiconductor device according to claim 1, further comprising a p-channel transistor and an n-channel transistor, wherein the at least one thin film transistor is the n-channel thin film transistor.

7. The semiconductor device according to claim 1, wherein the at least one thin film transistor includes a p-channel thin film transistor and an n-channel thin film transistor.

8. The semiconductor device according to claim 1, wherein the gettering region is located outside a region through which electrons or holes move during an operation of the at least one thin film transistor.

9. The semiconductor device according to claim 1, wherein the gettering region is arranged so as not to be adjacent to the channel region.

10. The semiconductor device according to claim 1, further comprising a line connected to the at least one thin film transistor, wherein the gettering region is disposed in a peripheral portion of the semiconductor layer, an electrical connection of the line is made in at least a portion of the source region or the drain region, and the line is not connected to the gettering region.

11. The semiconductor device according to claim 1, further comprising a line connected to the at least one thin film transistor, wherein the gettering region is disposed in a peripheral portion of the semiconductor layer, and an electrical connection of the line is made in at least a portion of the source region or the drain region and in a portion of the gettering region.

12. The semiconductor device according to claim 1, wherein the at least one thin film transistor includes an n-channel thin film transistor, and the gettering region of the n-channel thin film transistor includes a group VB impurity element providing n-type conductivity at a higher concentration than in the source region or the drain region.

13. The semiconductor device according to claim 1, wherein the gettering region includes a gettering element capable of attracting the catalyst element.

14. The semiconductor device according to claim 13, wherein the gettering region includes a group VB impurity element providing n-type conductivity and a group IIIB impurity element providing p-type conductivity each as the gettering element.

15. The semiconductor device according to claim 14, wherein the gettering region includes the impurity element providing n-type conductivity at a concentration of about $1 \times 10^{19}/cm^3$ to about $1 \times 10^{21}/cm^3$ and the impurity element providing p-type conductivity at a concentration of about $1.5 \times 10^{19}/cm^3$ to about $3 \times 10^{21}/cm^3$.

16. The semiconductor device according to claim 13, wherein the gettering element includes at least one rare gas element selected from the group consisting of Ar, Kr and Xe.

17. The semiconductor device according to claim 16, wherein a concentration of the at least one rare gas element in the gettering region is about $1 \times 10^{19}/cm^3$ to about $3 \times 10^{21}$ atoms/$cm^3$.

18. The semiconductor device according to claim 1, wherein the catalyst element includes at least one element selected from the group consisting of Ni, Co, Sn, Pb, Pd, Fe and Cu.

19. The semiconductor device according to claim 1, wherein a concentration of the catalyst element in the gettering region is about $5 \times 10^{18}$ atoms/$cm^3$ or more.

20. The semiconductor device according to claim 1, wherein the gate electrode includes at least one metal element selected from the group consisting of W, Ta, Ti and Mo.

21. The semiconductor device according to claim 1, wherein the crystalline region further includes at least one of an LDD region at a junction between the channel region and the source region and a junction between the channel region and the drain region.

22. An electronic device, comprising the semiconductor device according to claim 1.

23. The electronic device according to claim 22, further comprising a display section including the semiconductor device.

24. A semiconductor device comprising:
at least one thin film transistor including:
- a semiconductor layer that has a crystalline region including a channel region, a source region, and a drain region;
- a gate insulating film disposed at least on the channel region, the source region, and the drain region of the semiconductor layer;
- a gate electrode arranged so as to oppose the channel region via the gate insulating film;
- a source electrode connected with the source region; and
- a drain electrode connected with the drain region;
wherein
at least a portion of the semiconductor layer includes a catalyst element arranged to promote crystallization, and the semiconductor layer further includes a gettering region that includes the catalyst element at a higher concentration than in each of the channel region, the source region, and the drain region;
the source region or the drain region is arranged between the channel region and the gettering region;
the gate insulating film is disposed on the source region and the drain region and is not disposed on the gettering region; and
the gettering region, the source region, and the drain region include a same impurity element providing conductivity, the concentration of the same impurity element in the gettering region is higher than each of the concentrations of the same impurity element in the source region and the drain region.

* * * * *